United States Patent
Koyama

(10) Patent No.: US 11,677,384 B2
(45) Date of Patent: Jun. 13, 2023

(54) SEMICONDUCTOR INTEGRATED CIRCUIT WITH SEMICONDUCTOR LAYER HAVING INDIUM, ZINC, AND OXYGEN

(71) Applicant: Semiconductor Energy Laboratory Co., Ltd., Atsugi (JP)

(72) Inventor: Jun Koyama, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/359,940

(22) Filed: Jun. 28, 2021

(65) Prior Publication Data

US 2021/0328580 A1 Oct. 21, 2021

Related U.S. Application Data

(63) Continuation of application No. 15/986,920, filed on May 23, 2018, now Pat. No. 11,177,792, which is a
(Continued)

(30) Foreign Application Priority Data

Aug. 6, 2010 (JP) .................................. 2010-178167
May 13, 2011 (JP) .................................. 2011-108342

(51) Int. Cl.
*G11C 8/04* (2006.01)
*H03K 3/012* (2006.01)
(Continued)

(52) U.S. Cl.
CPC ............. *H03K 3/012* (2013.01); *G11C 5/147* (2013.01); *G11C 8/04* (2013.01); *H01L 21/8258* (2013.01);
(Continued)

(58) Field of Classification Search
CPC .............. G11C 8/04; G11C 5/14; G11C 5/147
See application file for complete search history.

(56) References Cited

U.S. PATENT DOCUMENTS 4,284,905 A 8/1981 Rosenzweig
5,198,706 A 3/1993 Papaliolios
(Continued)

FOREIGN PATENT DOCUMENTS

CN 001180265 A 4/1998
CN 001193846 A 9/1998
(Continued)

OTHER PUBLICATIONS

International Search Report (Application No. PCT/JP2011/066780) dated Sep. 27, 2011.
(Continued)

*Primary Examiner* — Alfredo Bermudez Lozada
(74) *Attorney, Agent, or Firm* — Fish & Richardson P.C.

(57) ABSTRACT

Provided is a semiconductor device including a sequential circuit including a first transistor and a capacitor. The first transistor includes a semiconductor layer including indium, zinc, and oxygen to form a channel formation region. A node electrically connected to a source or a drain of the first transistor and a capacitor becomes a floating state when the first transistor turns off, so that a potential of the node can be maintained for a long period. A power-gating control circuit may be provided to control supply of power supply potential to the sequential circuit. The potential of the node still can be maintained while supply of the power supply potential is stopped.

7 Claims, 39 Drawing Sheets

Related U.S. Application Data continuation of application No. 14/670,536, filed on Mar. 27, 2015, now abandoned, which is a continuation of application No. 14/037,450, filed on Sep. 26, 2013, now Pat. No. 8,995,174, which is a continuation of application No. 13/196,250, filed on Aug. 2, 2011, now Pat. No. 8,547,771.

(51) Int. Cl.

| | | |
|---|---|---|
| *H03K 3/037* | (2006.01) | |
| *H01L 21/8258* | (2006.01) | |
| *H01L 27/088* | (2006.01) | |
| *H01L 29/786* | (2006.01) | |
| *H01L 27/12* | (2006.01) | |
| *H03K 19/00* | (2006.01) | |
| *G11C 5/14* | (2006.01) | |
| *H01L 27/06* | (2006.01) | |
| *H01L 29/04* | (2006.01) | |
| *H01L 21/8234* | (2006.01) | |

(52) U.S. Cl.
CPC ........ *H01L 27/0629* (2013.01); *H01L 27/088* (2013.01); *H01L 27/1225* (2013.01); *H01L 29/045* (2013.01); *H01L 29/7869* (2013.01); *H01L 29/78693* (2013.01); *H03K 3/0372* (2013.01); *H03K 3/0375* (2013.01); *H03K 19/0008* (2013.01); *H01L 21/823412* (2013.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,764,562 A | 6/1998 | Hamamoto |
| 5,896,042 A | 4/1999 | Nishimura et al. |
| 6,031,778 A | 2/2000 | Makino et al. |
| 6,124,728 A | 9/2000 | Nishimura et al. |
| 6,208,170 B1 | 3/2001 | Iwaki et al. |
| 6,246,280 B1 | 6/2001 | Morishita |
| 6,294,274 B1 | 9/2001 | Kawazoe et al. |
| 6,337,593 B1 | 1/2002 | Mizuno et al. |
| 6,385,117 B2 | 5/2002 | Morishita |
| 6,483,374 B1 | 11/2002 | Mizuno et al. |
| 6,515,511 B2 | 2/2003 | Sugibayashi et al. |
| 6,563,174 B2 | 5/2003 | Kawasaki et al. |
| 6,600,360 B2 | 7/2003 | Mizuno et al. |
| 6,707,334 B2 | 3/2004 | Mizuno et al. |
| 6,715,090 B1 | 3/2004 | Totsuka et al. |
| 6,727,522 B1 | 4/2004 | Kawasaki et al. |
| 6,738,281 B2 | 5/2004 | Yokozeki |
| 6,987,415 B2 | 1/2006 | Mizuno et al. |
| 7,046,075 B2 | 5/2006 | Mizuno et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,080,270 B2 | 7/2006 | Yokozeki et al. |
| 7,102,909 B2 | 9/2006 | Koide |
| 7,105,868 B2 | 9/2006 | Nause et al. |
| 7,138,825 B2 | 11/2006 | Kim et al. |
| 7,154,317 B2 | 12/2006 | Flynn et al. |
| 7,164,301 B2 | 1/2007 | Chun |
| 7,202,863 B2 | 4/2007 | Kimura et al. |
| 7,211,825 B2 | 5/2007 | Shih et al. |
| 7,266,707 B2 | 9/2007 | Ngo et al. |
| 7,282,782 B2 | 10/2007 | Hoffman et al. |
| 7,297,977 B2 | 11/2007 | Hoffman et al. |
| 7,321,252 B2 | 1/2008 | Mizuno et al. |
| 7,323,356 B2 | 1/2008 | Hosono et al. |
| 7,323,909 B2 | 1/2008 | Mamidipaka |
| 7,385,224 B2 | 6/2008 | Ishii et al. |
| 7,402,506 B2 | 7/2008 | Levy et al. |
| 7,411,209 B2 | 8/2008 | Endo et al. |
| 7,430,673 B2 | 9/2008 | Kardach et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,475,261 B2 | 1/2009 | Totsuka et al. |
| 7,501,293 B2 | 3/2009 | Ito et al. |
| 7,511,343 B2 | 3/2009 | Li et al. |
| 7,583,121 B2 | 9/2009 | Berzins et al. |
| 7,598,796 B2 | 10/2009 | Mizuno et al. |
| 7,602,654 B2 | 10/2009 | Yabuuchi et al. |
| 7,619,440 B2 | 11/2009 | Amedeo et al. |
| 7,633,315 B2 | 12/2009 | Yamaoka et al. |
| 7,649,393 B2 | 1/2010 | Maeda |
| 7,663,447 B2 | 2/2010 | Matsuzaki |
| 7,674,650 B2 | 3/2010 | Akimoto et al. |
| 7,732,819 B2 | 6/2010 | Akimoto et al. |
| 7,768,010 B2 | 8/2010 | Kim et al. |
| 7,786,985 B2 | 8/2010 | Kimura et al. |
| 7,820,524 B2 | 10/2010 | Miyairi et al. |
| 7,848,169 B2 | 12/2010 | Shikata |
| 7,876,625 B2 | 1/2011 | Yabuuchi et al. |
| 7,893,495 B2 | 2/2011 | Li et al. |
| 7,910,490 B2 | 3/2011 | Akimoto et al. |
| 7,911,855 B2 | 3/2011 | Tada |
| 7,932,521 B2 | 4/2011 | Akimoto et al. |
| 7,952,392 B2 | 5/2011 | Koyama et al. |
| 7,958,379 B2 | 6/2011 | Totsuka et al. |
| 7,977,169 B2 | 7/2011 | Hirao et al. |
| 7,978,559 B2 | 7/2011 | Kim et al. |
| 7,982,215 B2 | 7/2011 | Inoue et al. |
| 8,013,321 B2 | 9/2011 | Aranami et al. |
| 8,018,785 B2 | 9/2011 | Yabuuchi et al. |
| 8,030,195 B2 | 10/2011 | Inoue et al. |
| 8,044,906 B2 | 10/2011 | Kimura et al. |
| 8,054,279 B2 | 11/2011 | Umezaki et al. |
| 8,059,078 B2 | 11/2011 | Kimura et al. |
| 8,129,717 B2 | 3/2012 | Yamazaki et al. |
| 8,154,017 B2 | 4/2012 | Yabuta et al. |
| 8,169,588 B2 | 5/2012 | Oikawa et al. |
| 8,183,099 B2 | 5/2012 | Sakata |
| 8,188,467 B2 | 5/2012 | Itagaki et al. |
| 8,202,365 B2 | 6/2012 | Umeda et al. |
| 8,207,522 B2 | 6/2012 | Aranami et al. |
| 8,274,077 B2 | 9/2012 | Akimoto et al. |
| 8,310,883 B2 | 11/2012 | Yabuuchi et al. |
| 8,330,496 B2 | 12/2012 | Yamaoka et al. |
| 8,343,817 B2 | 1/2013 | Miyairi et al. |
| 8,363,452 B2 | 1/2013 | Yamazaki et al. |
| 8,364,988 B2 | 1/2013 | Totsuka et al. |
| 8,477,085 B2 | 7/2013 | Shishido |
| 8,502,222 B2 | 8/2013 | Yabuta et al. |
| 8,629,432 B2 | 1/2014 | Sakata et al. |
| 8,705,267 B2 | 4/2014 | Endo et al. |
| 8,729,544 B2 | 5/2014 | Yamazaki et al. |
| 8,729,547 B2 | 5/2014 | Miyairi et al. |
| 8,743,044 B2 | 6/2014 | Umezaki et al. |
| 8,785,240 B2 | 7/2014 | Watanabe |
| 8,803,149 B2 | 8/2014 | Sakata |
| 8,816,484 B2 | 8/2014 | Koyama et al. |
| 8,884,287 B2 | 11/2014 | Sakata et al. |
| 8,895,407 B2 | 11/2014 | Miyairi et al. |
| 8,902,145 B2 | 12/2014 | Umezaki et al. |
| 8,946,703 B2 | 2/2015 | Miyairi et al. |
| 9,087,745 B2 | 7/2015 | Yamazaki et al. |
| 9,111,804 B2 | 8/2015 | Yamazaki et al. |
| 9,166,058 B2 | 10/2015 | Miyairi et al. |
| 9,236,456 B2 | 1/2016 | Miyairi et al. |
| 9,437,748 B2 | 9/2016 | Miyairi et al. |
| 9,536,903 B2 | 1/2017 | Umezaki et al. |
| 9,793,416 B2 | 10/2017 | Miyairi et al. |
| 10,205,030 B2 | 2/2019 | Miyairi et al. |
| 10,937,897 B2 | 3/2021 | Yamazaki et al. |
| 2001/0046027 A1 | 11/2001 | Tai et al. |
| 2002/0000873 A1 | 1/2002 | Tanizaki et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |

(56) References Cited

U.S. PATENT DOCUMENTS

| | | |
|---|---|---|
| 2004/0127038 A1 | 7/2004 | Carcia et al. |
| 2004/0263237 A1 | 12/2004 | Kim et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0146596 A1 | 7/2006 | Madurawe |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Theiss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0255849 A1 | 11/2006 | Chun |
| 2006/0284171 A1 | 12/2006 | Levy et al. |
| 2006/0284172 A1 | 12/2006 | Ishii |
| 2006/0292777 A1 | 12/2006 | Dunbar |
| 2007/0002619 A1 | 1/2007 | Schoenauer et al. |
| 2007/0005995 A1 | 1/2007 | Kardach et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0211553 A1 | 9/2007 | Tada |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0048744 A1* | 2/2008 | Fukuoka ............ H03K 3/013 327/203 |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0093595 A1 | 4/2008 | Song et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0225061 A1* | 9/2008 | Kimura ............ G09G 3/3233 345/690 |
| 2008/0225590 A1 | 9/2008 | Lamorey |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299702 A1 | 12/2008 | Son et al. |
| 2008/0308796 A1 | 12/2008 | Akimoto et al. |
| 2008/0308805 A1 | 12/2008 | Akimoto et al. |
| 2009/0008639 A1 | 1/2009 | Akimoto et al. |
| 2009/0009214 A1 | 1/2009 | Tada |
| 2009/0016108 A1 | 1/2009 | Matsunaga et al. |
| 2009/0068773 A1 | 3/2009 | Lai et al. |
| 2009/0073325 A1 | 3/2009 | Kuwabara et al. |
| 2009/0085552 A1 | 4/2009 | Franza et al. |
| 2009/0114910 A1 | 5/2009 | Chang |
| 2009/0115028 A1 | 5/2009 | Shimomura et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0189636 A1 | 7/2009 | Amedeo et al. |
| 2009/0237107 A1* | 9/2009 | Lee ................ H04B 15/02 326/21 |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0001774 A1 | 1/2010 | Djaja et al. |
| 2010/0025676 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0109708 A1 | 5/2010 | Koyama et al. |
| 2010/0134735 A1 | 6/2010 | Nakamura et al. |
| 2010/0136743 A1 | 6/2010 | Akimoto et al. |
| 2010/0153759 A1 | 6/2010 | Singhal |
| 2010/0165776 A1 | 7/2010 | Tada |
| 2010/0177232 A1 | 7/2010 | Yu |
| 2011/0001732 A1 | 1/2011 | Morii et al. |
| 2011/0095288 A1 | 4/2011 | Morosawa et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0136301 A1* | 6/2011 | Yamazaki ............ H01L 29/045 257/E21.414 |
| 2011/0148463 A1 | 6/2011 | Kato et al. |
| 2011/0163311 A1 | 7/2011 | Akimoto et al. |
| 2011/0221475 A1 | 9/2011 | Koyama et al. |
| 2012/0032943 A1 | 2/2012 | Kimura et al. |
| 2014/0353758 A1 | 12/2014 | Koyama et al. |
| 2015/0037912 A1 | 2/2015 | Sakata |
| 2015/0349099 A1 | 12/2015 | Yamazaki et al. |
| 2017/0179161 A1 | 6/2017 | Umezaki et al. |
| 2021/0091210 A1 | 3/2021 | Yamazaki et al. |

FOREIGN PATENT DOCUMENTS

| | | |
|---|---|---|
| CN | 001235423 A | 11/1999 |
| CN | 001283308 A | 2/2001 |
| CN | 001101049 C | 2/2003 |
| CN | 101162737 A | 4/2008 |
| CN | 101174823 A | 5/2008 |
| CN | 101178930 A | 5/2008 |
| CN | 101189367 A | 5/2008 |
| CN | 101206832 A | 6/2008 |
| CN | 101308782 A | 11/2008 |
| CN | 101310371 A | 11/2008 |
| CN | 101425449 A | 5/2009 |
| CN | 101625472 A | 1/2010 |
| CN | 101640220 A | 2/2010 |
| CN | 101669208 A | 3/2010 |
| CN | 101728383 A | 6/2010 |
| CN | 101753861 A | 6/2010 |
| EP | 0943978 A | 9/1999 |
| EP | 0949629 A | 10/1999 |
| EP | 1043774 A | 10/2000 |
| EP | 1737044 A | 12/2006 |
| EP | 1770788 A | 4/2007 |
| EP | 1900859 A | 3/2008 |
| EP | 1905874 A | 4/2008 |
| EP | 1906414 A | 4/2008 |
| EP | 1919079 A | 5/2008 |
| EP | 1921681 A | 5/2008 |
| EP | 1933293 A | 6/2008 |
| EP | 1993127 A | 11/2008 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 54-044842 A | 4/1979 |
| JP | 60-198861 A | 10/1985 |
| JP | 61-113189 A | 5/1986 |

(56) References Cited

FOREIGN PATENT DOCUMENTS

| | | |
|---|---|---|
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-110392 A | 4/1993 |
| JP | 05-242667 A | 9/1993 |
| JP | 05-251705 A | 9/1993 |
| JP | 08-264794 A | 10/1996 |
| JP | 08-279290 A | 10/1996 |
| JP | 09-064723 A | 3/1997 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2000-163964 A | 6/2000 |
| JP | 2001-230326 A | 8/2001 |
| JP | 2002-026142 A | 1/2002 |
| JP | 2002-076356 A | 3/2002 |
| JP | 2002-197885 A | 7/2002 |
| JP | 2002-289859 A | 10/2002 |
| JP | 2002-304889 A | 10/2002 |
| JP | 2003-086000 A | 3/2003 |
| JP | 2003-086808 A | 3/2003 |
| JP | 2003-203475 A | 7/2003 |
| JP | 2003-298062 A | 10/2003 |
| JP | 2004-088469 A | 3/2004 |
| JP | 2004-103957 A | 4/2004 |
| JP | 2004-222256 A | 8/2004 |
| JP | 2004-273614 A | 9/2004 |
| JP | 2004-273732 A | 9/2004 |
| JP | 2005-222677 A | 8/2005 |
| JP | 2005-268694 A | 9/2005 |
| JP | 2007-096055 A | 4/2007 |
| JP | 2007-123861 A | 5/2007 |
| JP | 2007-173385 A | 7/2007 |
| JP | 2007-251100 A | 9/2007 |
| JP | 2008-089915 A | 4/2008 |
| JP | 2008-098637 A | 4/2008 |
| JP | 2008-103732 A | 5/2008 |
| JP | 2008-109023 A | 5/2008 |
| JP | 2008-217778 A | 9/2008 |
| JP | 2008-277665 A | 11/2008 |
| JP | 2008-281988 A | 11/2008 |
| JP | 2008-300518 A | 12/2008 |
| JP | 2009-094494 A | 4/2009 |
| JP | 2009-135350 A | 6/2009 |
| JP | 2009-167087 A | 7/2009 |
| JP | 2009-212736 A | 9/2009 |
| JP | 2010-016163 A | 1/2010 |
| JP | 2010-040552 A | 2/2010 |
| JP | 2010-056539 A | 3/2010 |
| JP | 2010-062549 A | 3/2010 |
| JP | 2010-135760 A | 6/2010 |
| JP | 2010-166030 A | 7/2010 |
| JP | 2010-186994 A | 8/2010 |
| KR | 2009-0108468 A | 10/2009 |
| KR | 2010-0048886 A | 5/2010 |
| TW | 200730985 | 8/2007 |
| WO | WO-2004/114391 | 12/2004 |
| WO | WO-2006/075122 | 7/2006 |
| WO | WO-2007/094501 | 8/2007 |
| WO | WO-2008/126879 | 10/2008 |
| WO | WO-2008/133220 | 11/2008 |
| WO | WO-2008/149754 | 12/2008 |
| WO | WO-2009/104307 | 8/2009 |
| WO | WO-2010/071034 | 6/2010 |

OTHER PUBLICATIONS

Written Opinion (Application No. PCT/JP2011/066780) dated Sep. 27, 2011.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:AL and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

(56) References Cited

OTHER PUBLICATIONS

Jin.D et al., "65.2:Distinguished Paper:World-Largest (6.5") Flexible Full Color Top Emission Amoled Display on Plastic Film and its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,Or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IgZo Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors By DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of The Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way To Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of The 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven By Peald Grown ZnO TFT", IMID '07 Digest, 2007, pp. 1249-1252.
Park.S et al., "42.3: Transparent ZnO Thin Film Transistor for the Application of High Aperture Ratio Bottom Emission AM-OLED

(56) References Cited

OTHER PUBLICATIONS

Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW'09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IgZo Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW'02 : Proceedings of The 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Tang.T et al., "Analysis and Realization of Nonvolatile Logic Circuits by Using Ferroelectric Technology", Chinese Journal of Semiconductors, Nov. 30, 2002, vol. 23, No. 11, pp. 1201-1206.

Chinese Office Action (Application No. 201180038709.5) dated Apr. 24, 2015.

Chinese Office Action (Application No. 201180038709.5) dated Oct. 28, 2015.

Taiwanese Office Action (Application No. 100127419) dated Nov. 10, 2015.

Taiwanese Office Action (Application No. 105104134) dated Nov. 15, 2016.

Su.N et al., "A Nonvolatile InGaZnO Charge-Trapping-Engineered Flash Memory With Good Retention Characteristics", IEEE Electron Device Letters, Jan. 12, 2010, vol. 31, No. 3, pp. 201-203.

Taiwanese Office Action (Application No. 106111164) dated Oct. 27, 2017.

Yamaoka.M et al., "A 300-MHz 25-µA/Mb-Leakage On-Chip SRAM Module Featuring Process-Variation Immunity and Low-Leakage-Active Mode for Mobile-Phone Application Processor", IEEE Journal of Solid-State Circuits, Jan. 3, 2005, vol. 40, No. 1, pp. 186-194.

Chinese Office Action (Application No. 201711425966.X) dated Oct. 9, 2020.

Chinese Office Action (Application No. 201711425966.X) dated Apr. 12, 2021.

\* cited by examiner c-axis direction charge 0 charge +1 charge 0 ab plane charge −1 charge 0

FIG. 24A  FIG. 24B
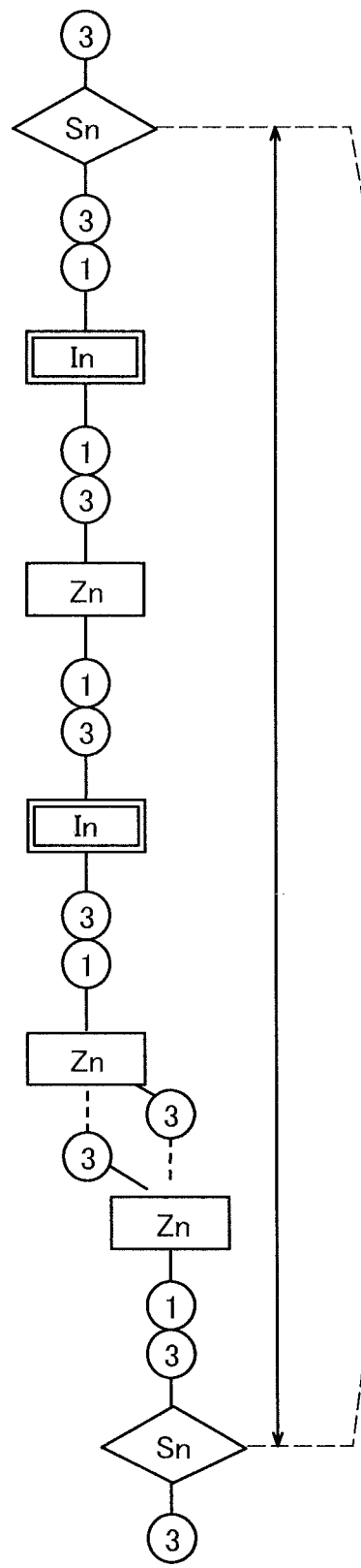
FIG. 24C
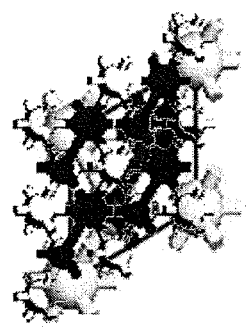
● In
☾ Sn
☽ Zn
● O

SEMICONDUCTOR INTEGRATED CIRCUIT WITH SEMICONDUCTOR LAYER HAVING INDIUM, ZINC, AND OXYGEN

CROSS-REFERENCE TO RELATED APPLICATIONS

This application is a continuation of U.S. application Ser. No. 15/986,920, filed May 23, 2018, now allowed, which is a continuation of U.S. application Ser. No. 14/670,536, filed Mar. 27, 2015, now abandoned, which is a continuation of U.S. application Ser. No. 14/037,450, filed Sep. 26, 2013, now U.S. Pat. No. 8,995,174, is a continuation of U.S. application Ser. No. 13/196,250, filed Aug. 2, 2011, now U.S. Pat. No. 8,547,771, which claims the benefit of foreign priority applications filed in Japan as Serial No. 2010-178167 on Aug. 6, 2010 and Serial No. 2011-108342 on May 13, 2011, all of which are incorporated by reference.

TECHNICAL FIELD

The present invention relates to a semiconductor integrated circuit. The present invention particularly relates to a semiconductor integrated circuit that includes a storage circuit including a sequential circuit and can control supply of power supply voltage to the storage circuit (i.e., can implement power gating).

BACKGROUND ART

The scale of semiconductor integrated circuits including logic circuits has increased year by year. Integrated circuits were constituted by several elements at an early stage of development; nowadays, there are central processing units (CPUs) and digital signal processors (DSPs) constituted by tens of millions of elements. Although power consumption per element is reduced by miniaturization and reduction in voltage of elements, power consumption of the entire integrated circuit is being increased because the number of elements is more increased. As a method for reducing power consumption, clock gating by which clocks are partly stopped, a method for lowering the clock frequency, and a method for lowering power supply voltage partly have been developed.

Power consumption includes static power due to leakage current of an element such as a transistor in the off state, as well as dynamic power due to charge and discharge caused by switching of the element. The static power can be almost negligible in integrated circuits including a small number of elements, but is too large to ignore in integrated circuits including an enormous number of elements. In view of this, a method for controlling supply of power supply voltage to a circuit included in an integrated circuit (power gating) has been developed. Such a method can reduce power consumption due to leakage current.

For example, Patent Document 1 discloses a semiconductor integrated circuit that can implement power gating. Specifically, Patent Document 1 discloses a semiconductor integrated circuit that includes a transistor between a logic circuit and a power supply line, and can control supply of power supply voltage to the logic circuit by controlling switching of the transistor.

REFERENCE

Patent Document 1: Japanese Published Patent Application No. 2005-268694

BRIEF SUMMARY OF THE INVENTION

However, in the case where the logic circuit includes a storage circuit (e.g., a register) constituted by a plurality of sequential circuits, stored data is erased by power gating. In fact, it is common knowledge that storage circuits such as registers are frequently used in logic circuits included in existing semiconductor integrated circuits, and power gating causes erasing of stored data. In that case, arithmetic operation or the like needs to be performed again when supply of power supply voltage to the storage circuit is restarted. That is, similar arithmetic operation needs to be performed twice. For that reason, the effect of reducing power consumption due to power gating is weakened. Further, the operation of the semiconductor integrated circuit cannot be restarted until the arithmetic operation is completed, so that the operation of the semiconductor integrated circuit is delayed.

In view of the foregoing problems, an object of one embodiment of the present invention is to reduce power consumption of a semiconductor integrated circuit. Another object of one embodiment of the present invention is to reduce delay of the operation in a semiconductor integrated circuit. Note that one embodiment of the present invention aims to achieve at least one of the above objects.

At least one of the above objects can be achieved as follows: a plurality of sequential circuits included in a storage circuit each include a transistor whose channel formation region is formed with an oxide semiconductor, and a capacitor whose one electrode is electrically connected to a node that is brought into a floating state when the transistor is turned off. The oxide semiconductor has a band gap wider than silicon and an intrinsic carrier density lower than silicon. By using such an oxide semiconductor for a channel formation region of the transistor, the transistor with an extremely low off-state current (leakage current) can be realized. Thus, by turning off the transistor in a period during which power supply voltage is not supplied to the storage circuit, the potential in that period of the node to which one electrode of the capacitor is electrically connected can be kept constant or almost constant. As a result, arithmetic operation or the like does not need to be performed again when supply of power supply voltage to the storage circuit is restarted. In other words, in the semiconductor integrated circuit according to one embodiment of the present invention, there is no power consumption nor delay of the operation due to the additional arithmetic operation, which means that the above object can be achieved.

In addition, the oxide semiconductor is preferably an i-type (intrinsic) or substantially intrinsic oxide semiconductor (purified OS) in which the concentration of impurities such as moisture or hydrogen that might serve as electron donors (donors) has been reduced. Specifically, the oxide semiconductor has a hydrogen concentration of $5\times10^{19}$ (atoms/cm$^3$) or less, preferably $5\times10^{18}$ (atoms/cm$^3$) or less, further preferably $5\times10^{17}$ (atoms/cm$^3$) or less when the hydrogen concentration is measured by secondary ion mass spectrometry (SIMS). The carrier density of the oxide semiconductor measured by Hall effect measurement is less than $1\times10^{14}$/cm$^3$, preferably less than $1\times10^{12}$/cm$^3$, further preferably less than $1\times10^{11}$/cm$^3$. The band gap of the oxide semiconductor is 2 eV or more, preferably 2.5 eV or more, further preferably 3 eV or more.

Here, analysis of the hydrogen concentration by secondary ion mass spectrometry (SIMS) is mentioned. It is known that it is difficult to accurately obtain data in the proximity of a surface of a sample or in the proximity of an interface between stacked films formed using different materials by the SIMS analysis in principle. Thus, in the case where distributions of the hydrogen concentrations of the film in the thickness direction are analyzed by SIMS, an average value in a region of the film where the value is not greatly changed and almost the same value can be obtained is employed as the hydrogen concentration. Further, in the case where the thickness of the film to be measured is small, a region where almost the same value can be obtained cannot be found in some cases because of the influence of the hydrogen concentration of the films adjacent to each other. In that case, the maximum value or the minimum value of the hydrogen concentration of a region where the films are provided is employed as the hydrogen concentration of the film. Furthermore, in the case where a mountain-shaped peak having the maximum value and a valley-shaped peak having the minimum value do not exist in the region where the films are provided, the value of the inflection point is employed as the hydrogen concentration.

Examples of the oxide semiconductor are an In—Sn—Ga—Zn—O-based oxide semiconductor which is an oxide of four metal elements; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor which are oxides of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor which are oxides of two metal elements; and an In—O-based oxide semiconductor, a Sn—O-based oxide semiconductor, and a Zn—O-based oxide semiconductor. Note that in this specification, for example, an In—Sn—Ga—Zn—O-based oxide semiconductor means a metal oxide containing indium (In), tin (Sn), gallium (Ga), and zinc (Zn). There is no particular limitation on the composition ratio. The above oxide semiconductor may contain silicon.

Further, in this specification, an oxide semiconductor can be represented by the chemical formula, $InMO_3(ZnO)_m$ (m>0), for example. Here, M represents one or more metal elements selected from Ga, Al, Mn, and Co.

In a semiconductor integrated circuit according to one embodiment of the present invention, the potential of a specific node can be held in each of a plurality of sequential circuits included in a storage circuit even in a period when power supply voltage is not supplied to the storage circuit. In addition, the potential held in the node can be matched to data held in the sequential circuit. In other words, in the semiconductor integrated circuit according to one embodiment of the present invention, arithmetic operation or the like does not need to be performed on the storage circuit when supply of power supply voltage is started again. Thus, power consumption can be reduced and delay of the operation can be reduced in the semiconductor integrated circuit according to one embodiment of the present invention.

BRIEF DESCRIPTION OF DRAWINGS

In the accompanying drawings:
FIGS. 24A to 24C illustrate a crystal structure of an oxide semiconductor material.

BEST MODE FOR CARRYING OUT THE INVENTION

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiments below.

<Structural Example of Semiconductor Integrated Circuit>

First, a structural example of a semiconductor integrated circuit according to one embodiment of the present invention will be described with reference to FIGS. 1A to 1C.

Figure 1A:
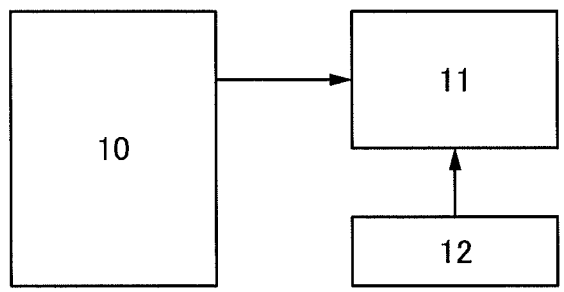
FIGS. 1A to 1C illustrate a structural example of a semiconductor integrated circuit.

FIG. 1A is a block diagram illustrating a structural example of a semiconductor integrated circuit. The semiconductor integrated circuit in FIG. 1A includes an arithmetic circuit 10, a storage circuit 11 that stores data obtained by arithmetic operation performed in the arithmetic circuit 10, and a power-gating control circuit 12 that controls supply of power supply voltage to the storage circuit 11.

Figure 1B:
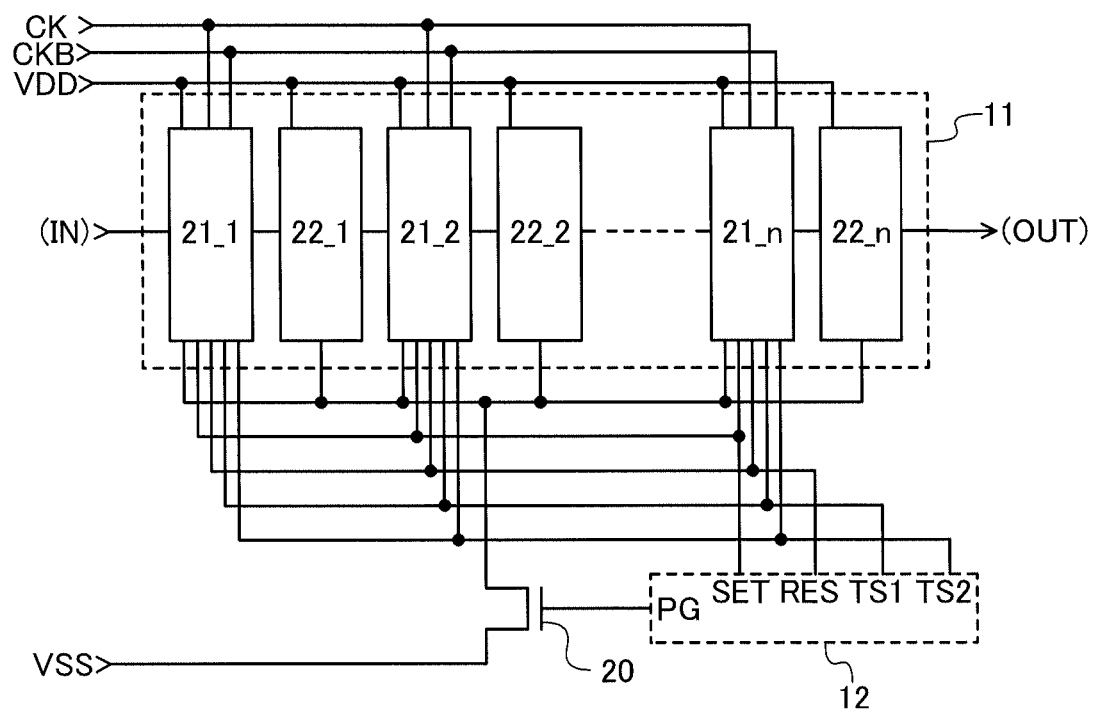

FIG. 1B illustrates a specific structural example of the storage circuit 11 and the power-gating control circuit 12 illustrated in FIG. 1A. The storage circuit 11 in FIG. 1B includes sequential circuits 21_1 to 21_n (n is a natural number of 3 or more) that can operate when a clock signal (CK), an inverted clock signal (CKB), a high power supply potential (VDD), and a low power supply potential (VSS) are supplied; and combinational circuits 22_1 to 22_n that can operate when the high power supply potential (VDD) and the low power supply potential (VSS) are supplied.

An input terminal of the sequential circuit 21_1 is electrically connected to an input terminal (IN) of the storage circuit 11. An output terminal of the sequential circuit 21_1 is electrically connected to an input terminal of the combinational circuit 22_1. An input terminal of the sequential circuit 21_a (a is a natural number of 2 to n) is electrically connected to an output terminal of the combinational circuit 22_a-1. An output terminal of the sequential circuit 21_a is electrically connected to an input terminal of the combinational circuit 22_a. An output terminal of the combinational circuit 22_n is electrically connected to an output terminal (OUT) of the storage circuit 11.

The power-gating control circuit 12 in FIG. 1B can output a power-gating control signal (PG) to a gate of a power-gating transistor 20, and output a set signal (SET), a reset signal (RES), a first transfer signal (TS1), and a second transfer signal (TS2) to each of the sequential circuits 21_1 to 21_n. A drain of the power-gating transistor 20 is electrically connected to a wiring that supplies the low power supply potential (VSS) to the sequential circuits 21_1 to 21_n and the combinational circuits 221 to 22n. A source of the power-gating transistor 20 is electrically connected to a supply source of the low power supply potential (VSS). Thus, supply of the low power supply potential (VSS) to the sequential circuits 21_1 to 21_n and the combinational circuits 22_1 to 22_n can be controlled by switching of the power-gating transistor 20. The first transfer signal (TS1) is a signal for transmitting data held in the sequential circuits 21_1 to 21_n to a node described later, which is brought into a floating state when a transistor whose channel formation region is formed using an oxide semiconductor is turned off. The second transfer signal (TS2) is a signal for transmitting the data from the node.

Note that FIG. 1B illustrates the structure in which supply of the low power supply potential (VSS) to the sequential circuits 21_1 to 21_n and the combinational circuits 22_1 to 22_n is controlled; alternatively, it is possible to employ a structure in which supply of the high power supply potential (VDD) is controlled or a structure in which supply of the low power supply potential (VSS) and the high power supply potential (VDD) is controlled. Specifically, a power-gating transistor can be provided between a wiring that supplies high power supply potential (VDD) and the sequential circuits 21_1 to 21_n and the combinational circuits 221 to 22n.

Figure 1C:
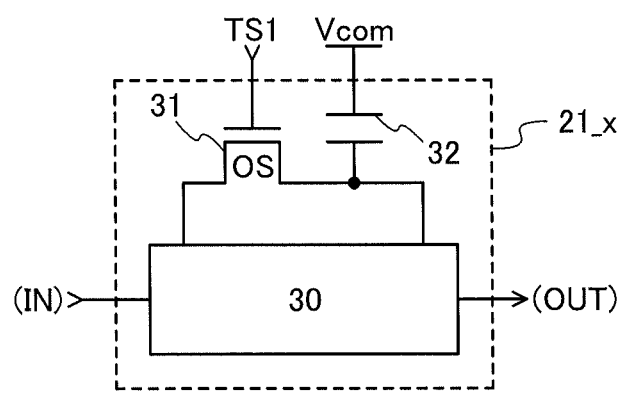

FIG. 1C illustrates a structural example of the sequential circuit 21_x (x is any one of natural numbers from 1 to n) shown in FIG. 1B. The sequential circuit 21_x in FIG. 1C includes a flip-flop 30, a transistor 31, and a capacitor 32. An input terminal of the flip-flop 30 is electrically connected to an input terminal (IN) of the sequential circuit 21_x. An output terminal of the flip-flop 30 is electrically connected to an output terminal (OUT) of the sequential circuit 21_x. A gate of the transistor 31 is electrically connected to a wiring that supplies the first transfer signal (TS1). One of a source and a drain of the transistor 31 is electrically connected to a first node that is a node in the flip-flop 30. The other of the source and the drain of the transistor 31 is electrically connected to a second node that is a node in the flip-flop 30. One electrode of the capacitor 32 is electrically connected to the second node and the other of the source and the drain of the transistor 31. The other electrode of the capacitor 32 is electrically connected to a wiring that supplies a fixed potential (Vcom). The transistor 31 is a transistor whose channel formation region is formed using an oxide semiconductor. The fixed potential (Vcom) always has a fixed value regardless of whether power gating is implemented or not. For example, the high power supply potential (VDD) or the low power supply potential (VSS) can be used as the fixed potential (Vcom), which is preferable because it is not necessary to generate a new potential as the fixed potential (Vcom). Note that in the case where the low power supply potential (VSS) is used as the fixed potential (Vcom), the low power supply potential (VSS) supplied to the sequential circuit 21_x as the fixed potential (Vcom) needs to be controlled to be supplied to a logic gate included in the flip-flop 30 even in a period when power gating is implemented. Specifically, a path for supplying the low power supply potential (VSS) to the sequential circuit 21_x as the fixed potential (Vcom) and a path for supplying the low power supply potential (VSS) to the logic gate included in the flip-flop 30 may be separately provided, for example.

Further, one of the source and the drain of the transistor 31 (the first node) can be electrically connected to the wiring that supplies the high power supply potential (VDD) or the wiring that supplies the low power supply potential (VSS), through a transistor included in the logic gate in the flip-flop 30; the other of the source and the drain of the transistor 31 and the one electrode of the capacitor 32 (the second node) cannot be electrically connected to these wirings. For example, it is designed so that the former is electrically connected to a source or a drain of at least one of a plurality of transistors included in the logic circuit in the flip-flop 30, and the latter is not electrically connected to the sources and the drains of the plurality of transistors and is electrically connected to a gate of at least one of the plurality of transistors. In other words, in the sequential circuit 21_x illustrated in FIG. 1C, the node (second node) to which the other of the source and the drain of the transistor 31 and the one electrode of the capacitor 32 are electrically connected can be brought into a floating state by turning off the transistor 31.

That is, in the sequential circuit 21_x in FIG. 1C, by supply of a high-level potential as the first transfer signal (TS1), data held in the flip-flop 30 can be transferred to the node (second node) to which the other of the source and the drain of the transistor 31 and the one electrode of the capacitor 32 are electrically connected, and the data can be held in the node.

Note that the transistor 31 and the capacitor 32 are included in each of the sequential circuits 21_1 to 21_n here; not all the sequential circuits 21_1 to 21_n need to have this structure. That is, only m sequential circuits (m is a natural number larger than or equal to 1 and smaller than n) among the sequential circuits 21_1 to 21_n may include the transistor 31 and the capacitor 32. Note that in that case, the first transfer signal (TS1) and the second transfer signal (TS2) do not need to be supplied to a sequential circuit that does not include the transistor 31 and the capacitor 32.

<Off-State Current of Transistor Whose Channel Formation Region is Formed with Oxide Semiconductor>

Here, the results of measuring the off-state current (leakage current) of a transistor whose channel formation region is formed with an oxide semiconductor will be described.

First, a method for forming a transistor used for the measurement will be described with reference to FIGS. 2A to 2H.

Figure 2A:
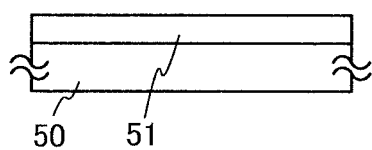
FIGS. 2A to 2H illustrate an example of a method for forming a transistor.
Figure 2B:
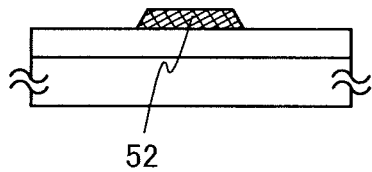

First, a base layer 51 formed of a stack of a 100-nm-thick silicon nitride layer and a 150-nm-thick silicon oxynitride layer was formed by CVD over a glass substrate 50 (see FIG. 2A).

Next, a 100-nm-thick tungsten layer was formed by sputtering over the base layer 51. Then, the tungsten layer was selectively etched by photolithography, so that a gate layer 52 was formed (see FIG. 2B).

Figure 2C:
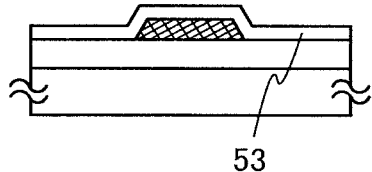
Figure 2D:
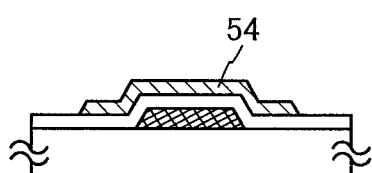
Figure 2E:
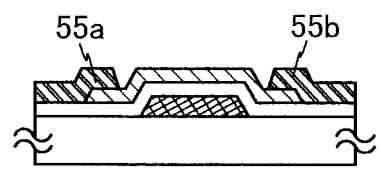
Figure 2F:
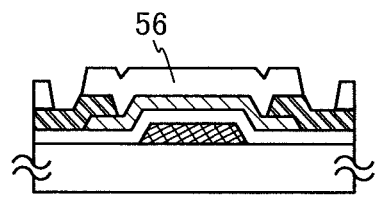

Next, a gate insulating layer 53 formed of a 100-nm-thick silicon oxynitride layer was formed by CVD over the base layer 51 and the gate layer 52 (see FIG. 2C).

Then, a 25-nm-thick oxide semiconductor layer was formed by sputtering over the gate insulating layer 53. A metal oxide target having a composition ratio of $In_2O_3$: $Ga_2O_3$:ZnO=1:1:2 [molar ratio] was used for forming the oxide semiconductor layer. In addition, the oxide semiconductor layer was formed under the following conditions: the substrate temperature was 200° C., the internal pressure of the chamber was 0.6 Pa, the direct-current power was 5 kW, and the atmosphere was a mixed atmosphere of oxygen and argon (the oxygen flow rate was 50 sccm and the argon flow rate was 50 sccm). Then, the oxide semiconductor layer was selectively etched by photolithography, so that an oxide semiconductor layer 54 was formed (see FIG. 2D).

Subsequently, heat treatment was performed at 450° C. for one hour in a mixed atmosphere of nitrogen and oxygen (the percentage of nitrogen is 80% and that of oxygen is 20%).

Then, the gate insulating layer 53 was selectively etched by photolithography (not illustrated). Note that this etching is a step for forming a contact hole for connecting the gate layer 52 and a conductive layer to be formed.

Next, a stack of a 100-nm-thick titanium layer, a 200-nm-thick aluminum layer, and a 100-nm-thick titanium layer was formed by sputtering over the gate insulating layer 53 and the oxide semiconductor layer 54. Then, the stack was selectively etched by photolithography, so that a source layer 55a and a drain layer 55b were formed (see FIG. 2E).

Then, heat treatment was performed at 300° C. for one hour in a nitrogen atmosphere.

Next, a protective insulating layer 56 formed of a 300-nm-thick silicon oxide layer was formed over the gate insulating layer 53, the oxide semiconductor layer 54, the source layer 55a, and the drain layer 55b. Then, the protective insulating layer 56 was selectively etched by photolithography (see FIG. 2F). Note that this etching is a step for forming a contact hole for connecting the gate layer, the source layer, and the drain layer and the conductive layer to be formed.

Figure 2G:
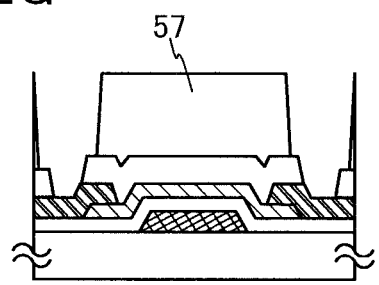
Figure 2H:
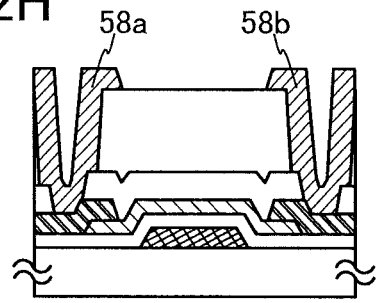

Next, a 1.5-μm-thick acrylic layer was applied over the protective insulating layer 56 and selectively exposed to light, so that a planarization insulating layer 57 was formed (see FIG. 2G). Then, the planarization insulating layer 57 formed of the acrylic layer was baked with heat treatment at 250° C. for one hour in a nitrogen atmosphere.

Subsequently, a 200-nm-thick titanium layer was formed by sputtering over the planarization insulating layer 57. Then, the titanium layer was selectively etched by photolithography, thereby forming a conductive layer (not illustrated) connected to the gate layer 52, a conductive layer 58a connected to the source layer 55a, and a conductive layer 58b connected to the drain layer 55b (see FIG. 2H).

Next, heat treatment was performed at 250° C. for one hour in a nitrogen atmosphere.

Through the above steps, the transistor used for the measurement was formed.

Next, a method for calculating the value of off-state current by using a circuit for evaluating characteristics, used in the measurement, will be described below.

Figure 3A:
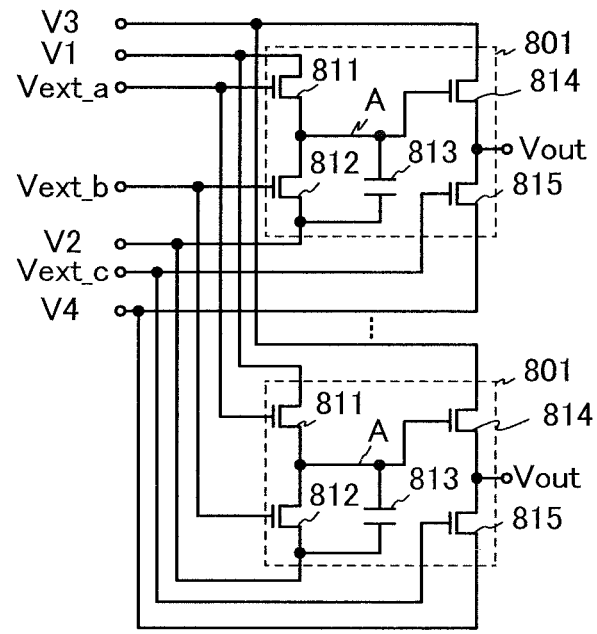
FIGS. 3A to 3C are diagrams for explaining a method for measuring off-state current of a transistor.
Figure 3B:
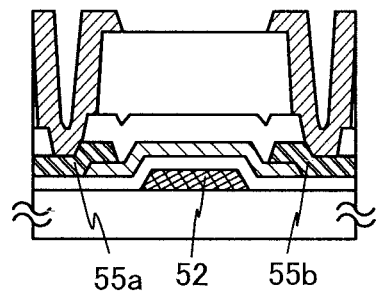
Figure 3C:
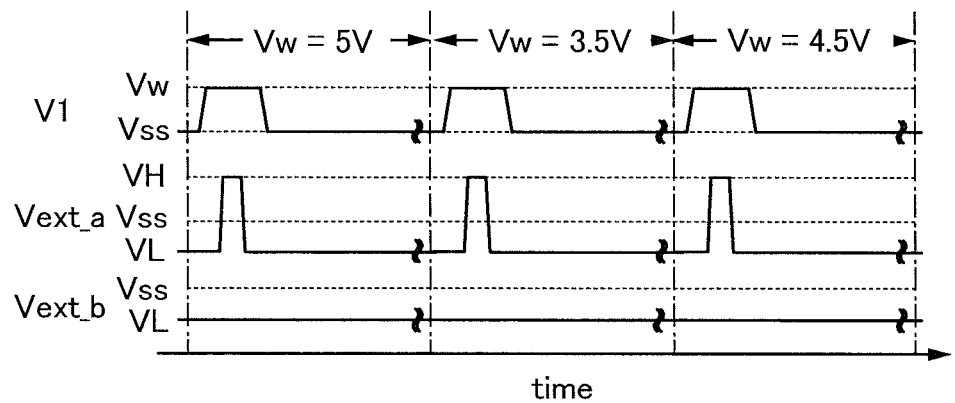

Current measurement using a circuit for evaluating characteristics will be described with reference to FIGS. 3A to 3C. FIGS. 3A to 3C are diagrams for explaining a circuit for evaluating characteristics.

First, a configuration of a circuit for evaluating characteristics is described with reference to FIG. 3A. FIG. 3A is a circuit diagram illustrating the configuration of the circuit for evaluating characteristics.

The circuit for evaluating characteristics illustrated in FIG. 3A includes a plurality of measurement systems 801. The plurality of measurement systems 801 are connected in parallel with each other. Here, eight measurement systems 801 are connected in parallel with each other. By using the plurality of measurement systems 801, a plurality of leakage currents can be measured at the same time.

The measurement system 801 includes a transistor 811, a transistor 812, a capacitor 813, a transistor 814, and a transistor 815.

The transistors 811, 812, 814, and 815 are n-channel field effect transistors.

A voltage V1 is input to one of a source and a drain of the transistor 811. A voltage Vext_a is input to a gate of the transistor 811. The transistor 811 is a transistor for injecting charge.

One of a source and a drain of the transistor 812 is connected to the other of the source and the drain of the transistor 811. A voltage V2 is input to the other of the source and the drain of the transistor 812. A voltage Vext_b is input to a gate of the transistor 812. The transistor 812 is a transistor for evaluating leakage current. Note that "leakage current" in this embodiment refers to a leakage current including an off-state current of the transistor.

One electrode of the capacitor 813 is connected to the other of the source and the drain of the transistor 811. The voltage V2 is input to the other electrode of the capacitor 813. Here, the voltage V2 is 0 V.

A voltage V3 is input to one of a source and a drain of the transistor 814. A gate of the transistor 814 is connected to the other of the source and the drain of the transistor 811. Note that a portion where the gate of the transistor 814, the other of the source and the drain of the transistor 811, the one of the source and the drain of the transistor 812, and the one electrode of the capacitor 813 are connected to each other is referred to as a node A. Here, the voltage V3 is 5 V.

One of a source and a drain of the transistor 815 is connected to the other of the source and the drain of the transistor 814. A voltage V4 is input to the other of the source and the drain of the transistor 815. A voltage Vext_c is input to a gate of the transistor 815. Here, the voltage Vext_c is 0.5 V.

The measurement system 801 outputs a voltage at a portion where the other of the source and the drain of the transistor 814 is connected to the one of the source and the drain of the transistor 815, as an output voltage Vout.

Here, as the transistor 811, a transistor that is formed by the formation method described with reference to FIGS. 2A to 2H and has a channel length L of 10 μm and a channel width W of 10 μm is used.

As the transistors 814 and 815, a transistor that is formed by the formation method described with reference to FIGS. 2A to 2H and has a channel length L of 3 μm and a channel width W of 100 μm is used.

At least the transistor 812 includes a 1-μm-wide offset region in which the gate layer 52 does not overlap with the source layer 55a and the drain layer 55b as illustrated in FIG. 3B. By providing the offset region, parasitic capacitance can be reduced. Further, as the transistor 812, six samples (SMP) of transistors having different channel lengths L and channel widths W are used (see Table 1).

TABLE 1

|      | L [μm] | W [μm]    |
|------|--------|-----------|
| SMP1 | 1.5    | $1 \times 10^5$ |
| SMP2 | 3      | $1 \times 10^5$ |
| SMP3 | 10     | $1 \times 10^5$ |
| SMP4 | 1.5    | $1 \times 10^6$ |
| SMP5 | 3      | $1 \times 10^6$ |
| SMP6 | 10     | $1 \times 10^6$ |

The transistor for injecting charge and the transistor for evaluating leakage current are separately provided as illustrated in FIG. 3A, so that the transistor for evaluating leakage current can be always kept off while electric charge is injected.

In addition, the transistor for injecting charge and the transistor for evaluating leakage current are separately provided, whereby each transistor can have an appropriate size. When the channel width W of the transistor for evaluating leakage current is made larger than that of the transistor for injecting charge, leakage current components of the circuit for evaluating characteristics other than the leakage current of the transistor for evaluating leakage current can be made relatively small. As a result, the leakage current of the transistor for evaluating leakage current can be measured with high accuracy. In addition, since the transistor for evaluating leakage current does not need to be turned on at the time of charge injection, the measurement is not adversely affected by variation in the voltage of the node A, which is caused when part of electric charge in the channel formation region flows into the node A.

Next, a method for measuring a leakage current of the circuit for evaluating characteristics illustrated in FIG. 3A will be described with reference to FIG. 3C. FIG. 3C is a timing chart for explaining the method for measuring a leakage current with use of the circuit for evaluating characteristics illustrated in FIG. 3A.

In the method for measuring the leakage current with the circuit for evaluating characteristics illustrated in FIG. 3A, a write period and a hold period are provided. The operation in each period is described below.

In the write period, a voltage VL (−3 V) with which the transistor 812 is turned off is input as the voltage Vext_b. Moreover, a write voltage Vw is input as the voltage V1, and then, a voltage VH (5 V) with which the transistor 811 is turned on is input as the voltage Vext_a for a given period. Thus, electric charge is accumulated in the node A, and the voltage of the node A becomes equivalent to the write voltage Vw. Then, the voltage VL with which the transistor 811 is turned off is input as the voltage Vext_a. After that, a voltage VSS (0 V) is input as the voltage V1.

In the hold period, the amount of change in the voltage of the node A, caused by change in the amount of the electric charge held in the node A, is measured. From the amount of change in the voltage, the value of the current flowing between the source and the drain of the transistor 812 can be calculated. In the above manner, electric charge can be accumulated in the node A, and the amount of change in the voltage of the node A can be measured.

Accumulation of electric charge in the node A and measurement of the amount of change in the voltage of the node A (also referred to as an accumulation and measurement operation) are repeatedly performed. First, a first accumulation and measurement operation is repeated 15 times. In the first accumulation and measurement operation, a voltage of 5 V is input as the write voltage Vw in the write period and retained for 1 hour in the hold period. Next, a second accumulation and measurement operation is repeated twice. In the second accumulation and measurement operation, a voltage of 3.5 V is input as the write voltage Vw in the write period and retained for 50 hours in the hold period. Next, a third accumulation and measurement operation is performed once. In the third accumulation and measurement operation, a voltage of 4.5 V is input as the write voltage Vw in the write period and retained for 10 hours in the hold period. By repeating the accumulation and measurement operation, the measured current value can be confirmed to be the value in the steady state. In other words, the transient current (a current component that decreases over time after the measurement starts) can be removed from a current IA flowing through the node A. Consequently, the leakage current can be measured with higher accuracy.

In general, a voltage $V_A$ of the node A is expressed as a function of the output voltage Vout by Formula 1.

[Formula 1]

$$V_A = F(Vout) \tag{1}$$

Electric charge $Q_A$ of the node A is expressed by Formula 2, using the voltage $V_A$ of the node A, capacitance $C_A$ connected to the node A, and a constant (const). Here, the capacitance $C_A$ connected to the node A is the sum of the capacitance of the capacitor 813 and a capacitance other than that of the capacitor 813.

[Formula 2]

$$Q_A = C_A V_A + const \tag{2}$$

Since the current IA of the node A is the time differential of electric charge flowing into the node A (or electric charge flowing from the node A), the current IA of the node A is expressed by Formula 3.

[Formula 3]

$$I_A = \frac{\Delta Q_A}{\Delta t} = \frac{C_A \cdot \Delta F(V_{out})}{\Delta t} \quad (3)$$

Here, Δt is about 54000 sec. As above, the current IA of the node A, which is the leakage current, can be calculated with the capacitance $C_A$ connected to the node A and the output voltage Vout, so that the leakage current of the circuit for evaluating characteristics can be obtained.

Next, the results of measuring the output voltage by the measurement method using the above circuit for evaluating characteristics and the value of the leakage current of the circuit for evaluating characteristics, which is calculated from the measurement results, will be described with reference to FIGS. 4A and 4B.

Figure 4A:
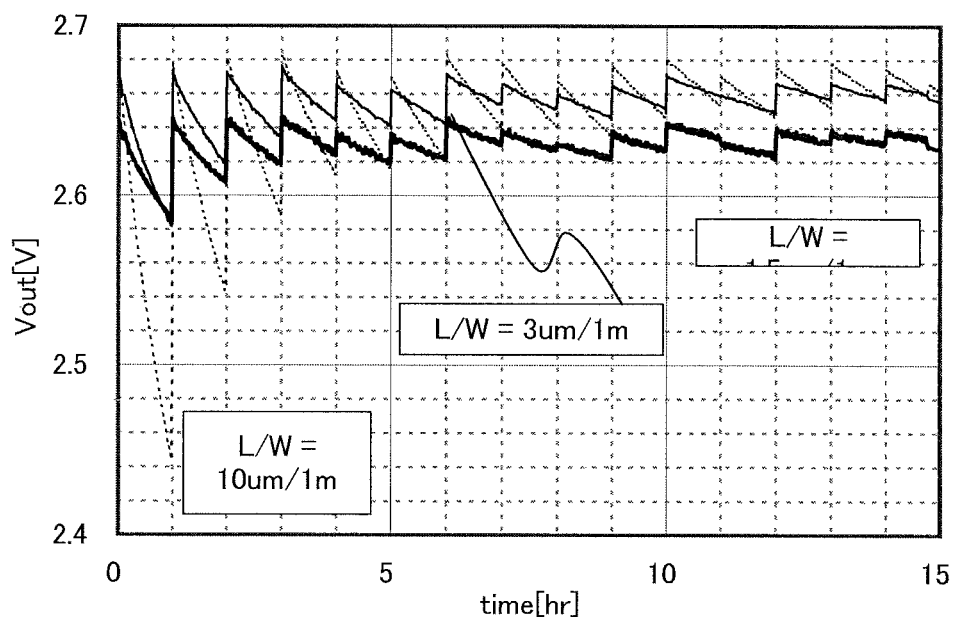
FIGS. 4A and 4B show characteristics of transistors.
Figure 4B:
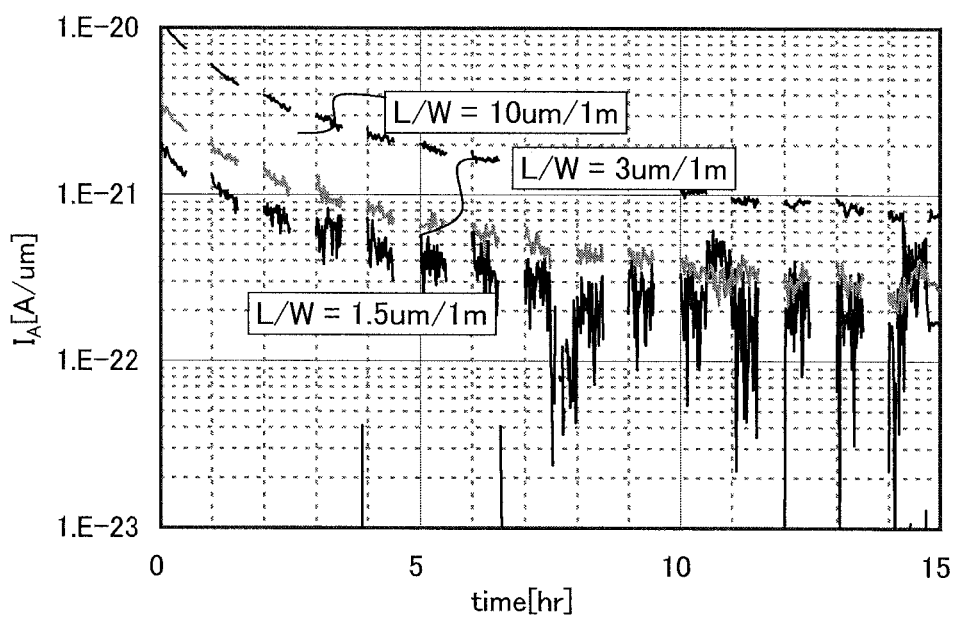

As an example, FIG. 4A shows the relation between the elapsed time Time of the above measurement (the first accumulation and measurement operation) of the transistors SMP4, SMP5, and SMP6 and the output voltage Vout. FIG. 4B shows the relation between the elapsed time Time of the above measurement and the current IA calculated by the measurement. It is found that the output voltage Vout varies after the measurement starts and it takes 10 hours or longer to reach a steady state.

Figure 5:
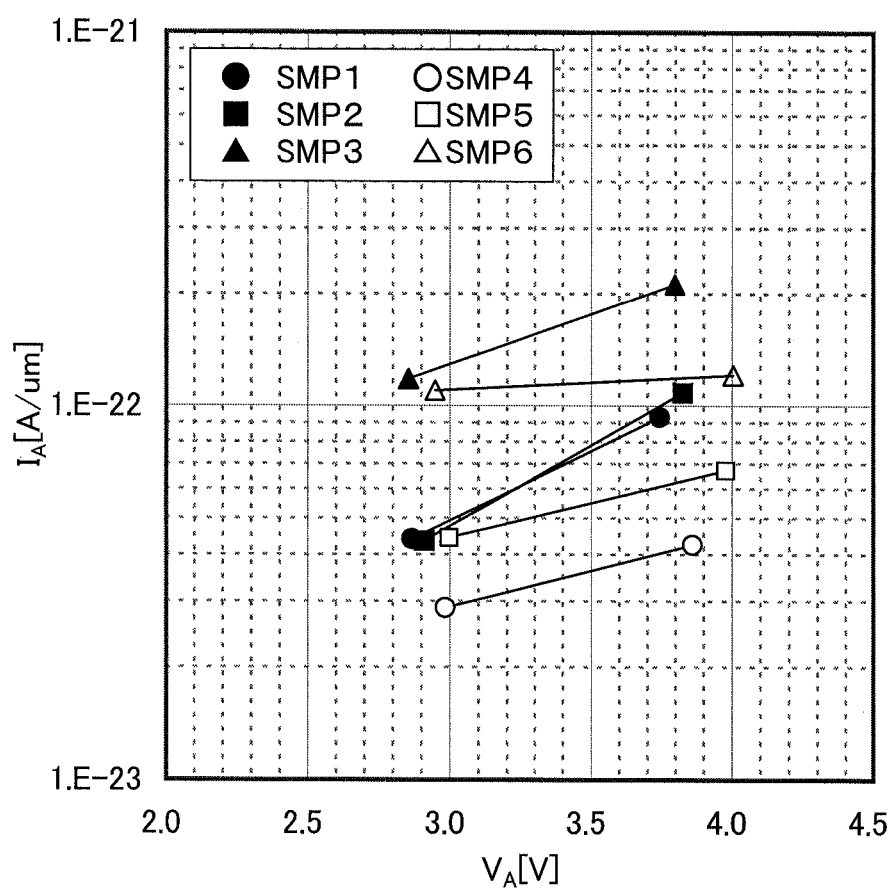
FIG. 5 shows characteristics of transistors.

FIG. 5 shows the relation between the voltage of the node A in SMP1 to SMP6 and the leakage current estimated by the above measurement. In SMP4 in FIG. 5, for example, when the voltage of the node A is 3.0 V, the leakage current is 28 yA/μm. Since the leakage current includes the off-state current of the transistor 812, the off-state current of the transistor 812 can be considered to be 28 yA/μm or less.

Figure 6:
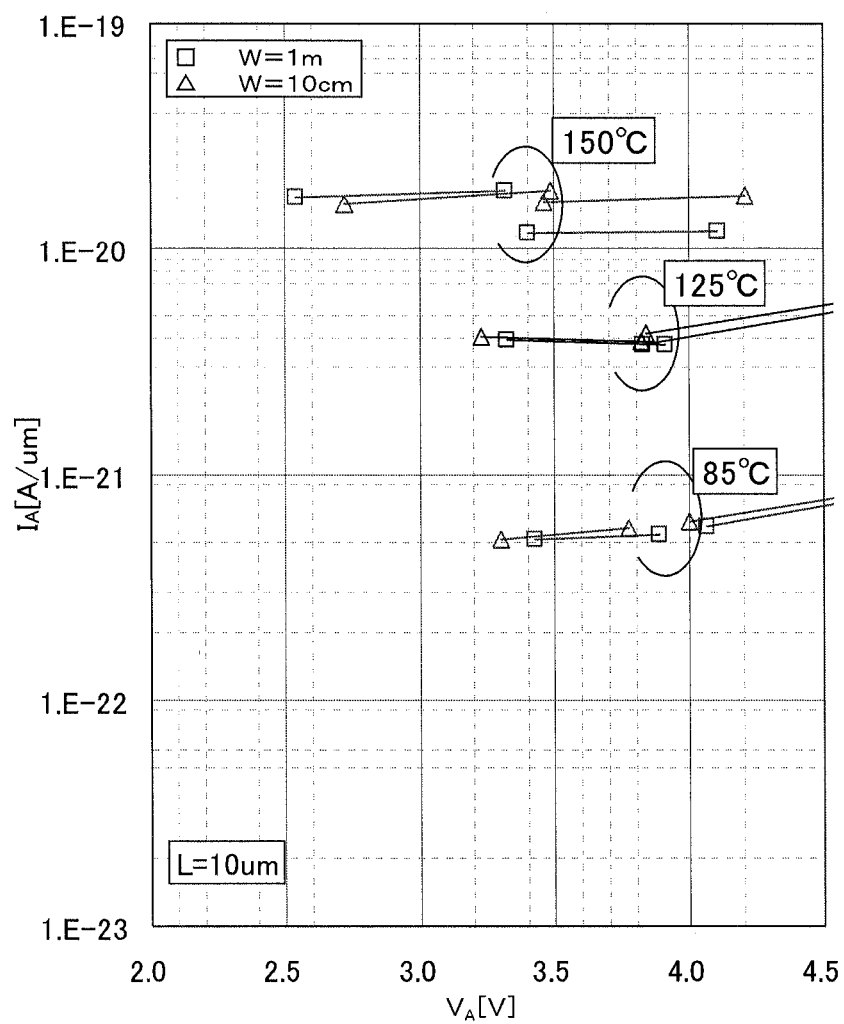
FIG. 6 shows characteristics of transistors.
Figure 7:
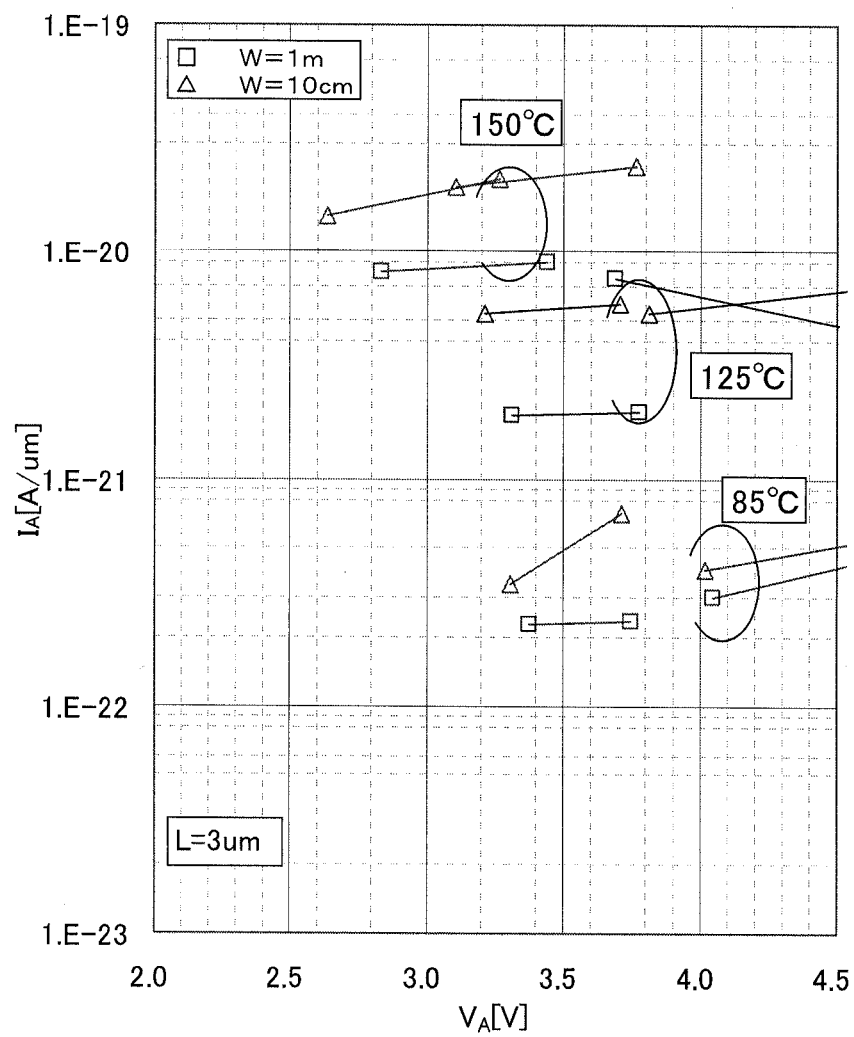
FIG. 7 shows characteristics of transistors.
Figure 8:
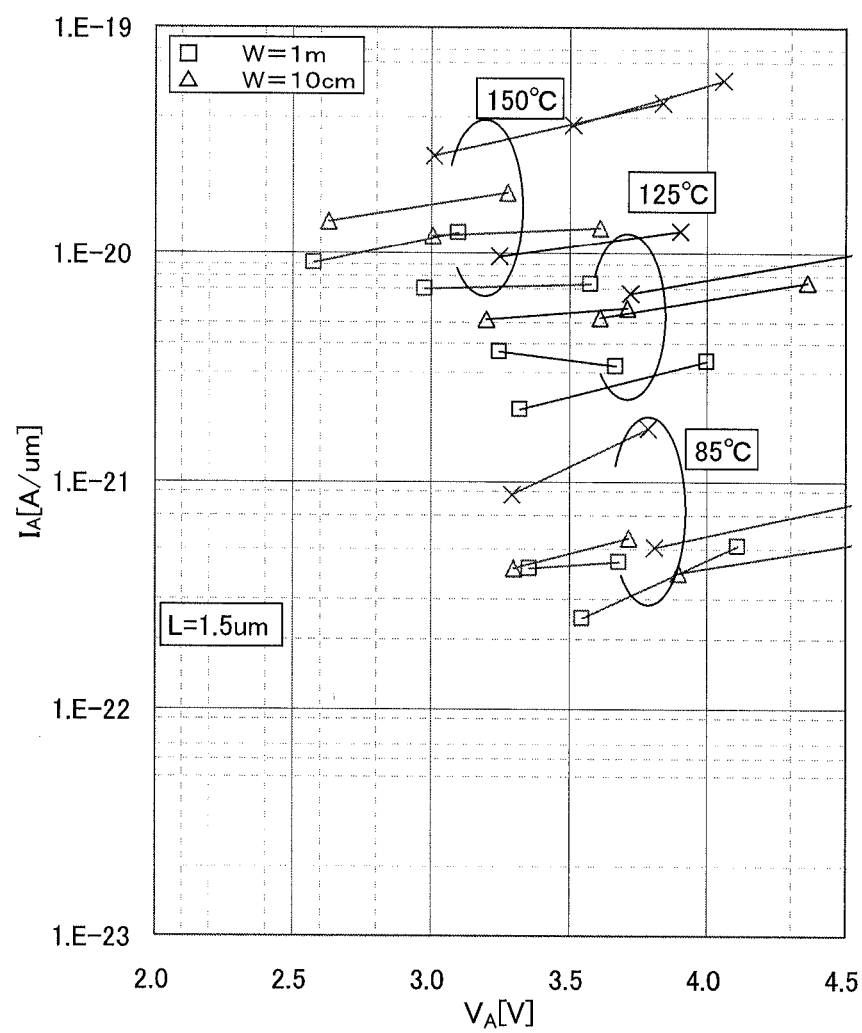
FIG. 8 shows characteristics of transistors.

FIG. 6, FIG. 7, and FIG. 8 each show the relation between the voltage of the node A in SMP1 to SMP6 at 85° C., 125° C., and 150° C. and the leakage current estimated by the above measurement. As shown in FIGS. 6 to 8, the leakage current is 100 zA/μm or less even at 150° C.

As described above, the leakage current is sufficiently low in the circuit for evaluating characteristics, including the transistor whose channel formation region is formed with an oxide semiconductor, which means that the off-state current of the transistor is sufficiently low. In addition, the off-state current of the transistor is sufficiently low even when the temperature rises.

<Semiconductor Integrated Circuit Disclosed in this Specification>

In the semiconductor integrated circuit disclosed in this specification, the potential of a specific node (the node illustrated in FIG. 1C, to which the other of the source and the drain of the transistor 31 and the one electrode of the capacitor 32 are electrically connected) can be held in each of a plurality of sequential circuits included in the storage circuit even in a period when power supply voltage is not supplied to the storage circuit. In addition, the potential held in the node can be matched to data held in the sequential circuit. In other words, in the semiconductor integrated circuit disclosed in this specification, arithmetic operation or the like does not need to be performed on the storage circuit when supply of power supply voltage is started again. Thus, power consumption can be reduced and delay of the operation can be reduced in the semiconductor integrated circuit disclosed in this specification.

SPECIFIC EXAMPLE

Specific examples of the semiconductor integrated circuit will be described with reference to FIG. 9, FIG. 10, FIG. 11, FIGS. 12A to 12H, FIGS. 13A to 13G FIGS. 14A to 14D, FIG. 15, FIGS. 16A and 16B, FIGS. 17A and 17B, FIGS. 18A and 18B, and FIG. 19.

<Sequential Circuit 21_x>

Figure 9:
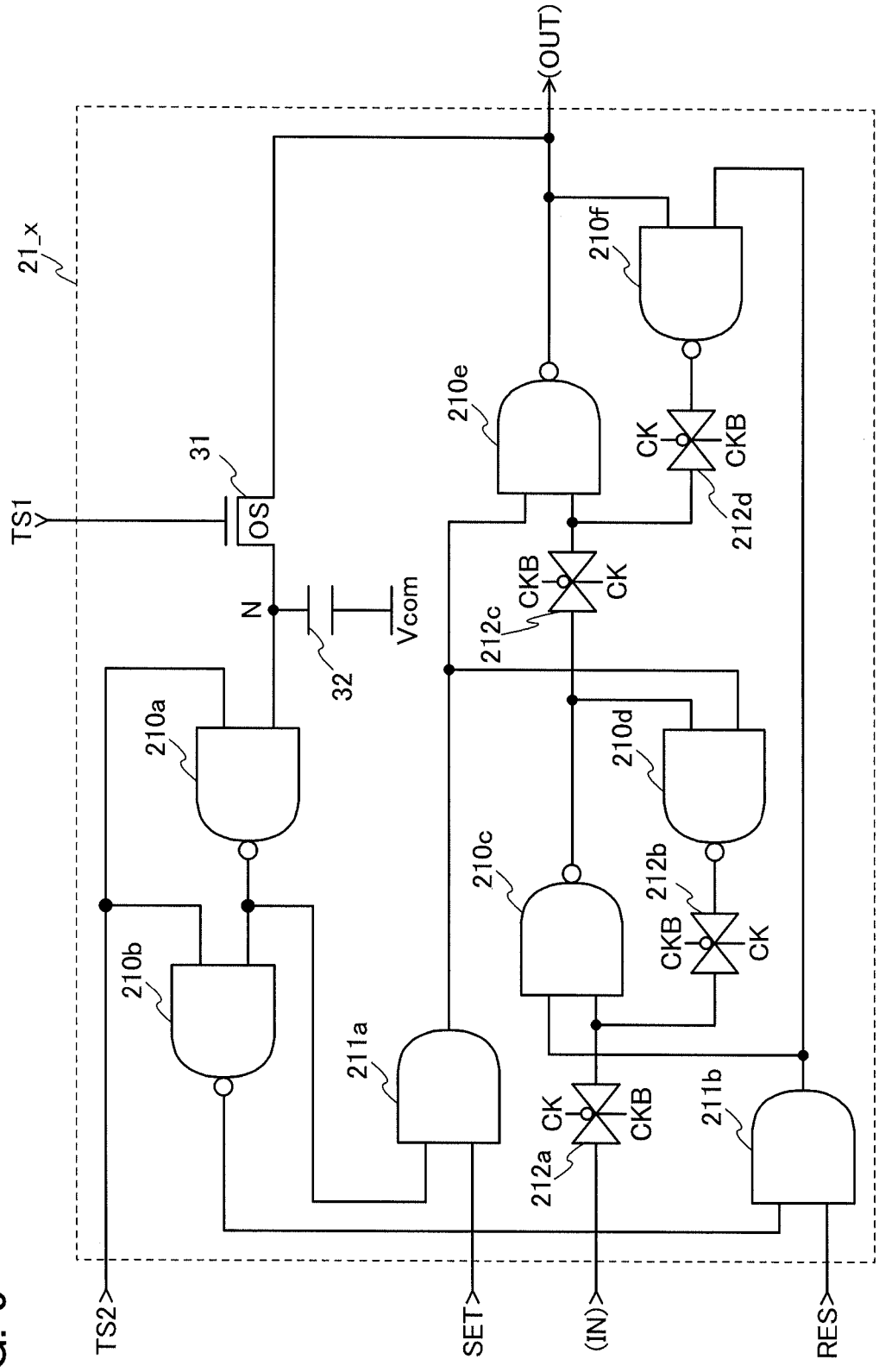
FIG. 9 illustrates a specific example of a sequential circuit.

FIG. 9 illustrates a specific example of the sequential circuit 21_x illustrated in FIG. 1C. The sequential circuit 21_x in FIG. 9 includes the transistor 31, the capacitor 32, NAND gates 210a to 210f, AND gates 211a and 211b, and switches 212a to 212d. Since the connection relation is clear from FIG. 9, FIG. 9 can be referred to for the details of the connection relation in the sequential circuit 21_x. A node that is electrically connected to the other of the source and the drain of the transistor 31 and the one electrode of the capacitor 32 is referred to as a node N. A data retention operation in the node A will be described below.

Figure 10:
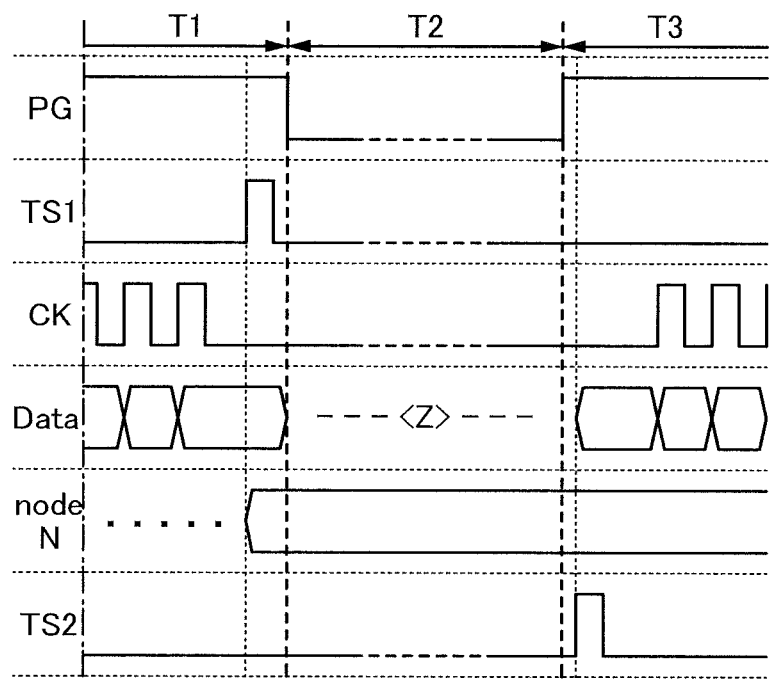
FIG. 10 illustrates an operation example of a sequential circuit.

FIG. 10 illustrates an example of an operation at the time when data (Data) is held in the node N in the sequential circuit 21_x in FIG. 9. In the operation example illustrated in FIG. 10, periods T1 and T3 are each a period during which a power-gating signal (PG) is a high-level potential (a power supply period), and a period T2 is a period during which the power-gating signal (PG) is a low-level potential (a power stop period).

In the period T1, supply of the clock signal (CK) to the sequential circuit 21_x is stopped in order to decide data (Data) held in the sequential circuit 21_x before clock gating. After that, a high-level potential is supplied as the first transfer signal (TS1). Thus, the data (Data) held in the sequential circuit 21_x is transferred to the node N.

In the period T2, supply of power supply voltage to the logic gates in the sequential circuit 21_x is stopped. Consequently, data in the sequential circuit 21_x is brought into a floating state (Z). On the other hand, the data held in the node N is not erased.

In the period T3, a high-level potential is supplied as the second transfer signal (TS2). Thus, data in the sequential circuit 21_x is restored. Then, by restarting supply of the clock signal (CK), the operation of the semiconductor integrated circuit including the sequential circuit 21_x can be restarted early.

<Transistor>

The semiconductor integrated circuit includes a large number of transistors. The large number of transistors can be selected as appropriate from a variety of transistors in accordance with desired characteristics or the like. For example, in the semiconductor integrated circuit, transistors included in logic gates in the sequential circuits 21_1 to 21_n and the combinational circuits 22_1 to 22_n need to operate at high speed. Therefore, these transistors are each preferably a transistor whose channel formation region is formed with single crystal silicon, polycrystalline silicon, or a compound semiconductor such as gallium arsenide (GaAs). Further, the power-gating transistor 20 needs to have a low off-state current (leakage current); therefore, the above-described transistor whose channel formation region is formed with an oxide semiconductor is preferably used.

In view of the above, an example of transistors included in the semiconductor integrated circuit will be described. Specifically, an example of a semiconductor integrated circuit that includes a transistor formed using a substrate containing a semiconductor material such as single crystal silicon and a transistor formed using an oxide semiconductor will be described.

Figure 11:
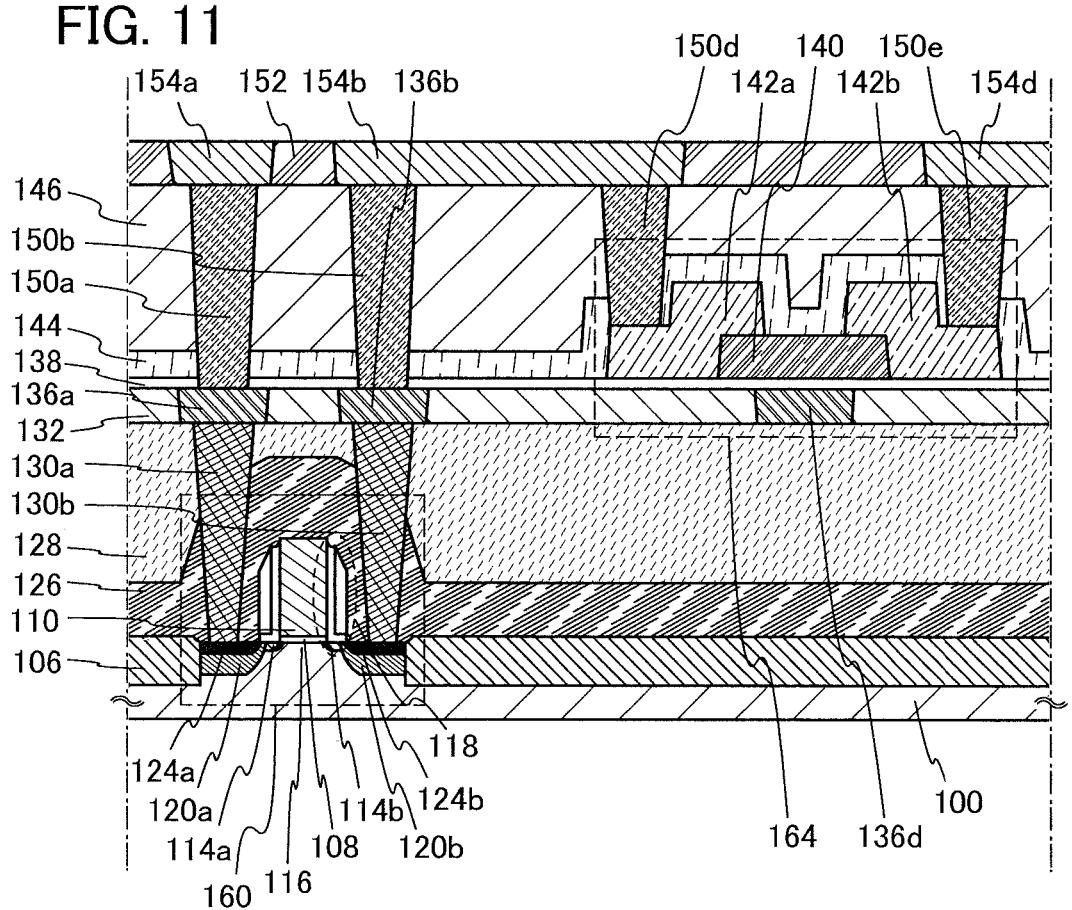
FIG. 11 illustrates a specific example of a transistor.

FIG. 11 illustrates an example of transistors included in the semiconductor integrated circuit. A transistor 160 illustrated in FIG. 11 includes a channel formation region 116 provided in a substrate 100 containing a semiconductor material, a pair of impurity regions 114a and 114b and a pair of high concentration impurity regions 120a and 120b (these regions are also collectively referred to simply as impurity regions) provided so that the channel formation region 116 is placed therebetween, a gate insulating layer 108 provided over the channel formation region 116, a gate layer 110 provided over the gate insulating layer 108, a source layer 130a electrically connected to the impurity region 114a, and a drain layer 130b electrically connected to the impurity region 114b.

Note that sidewall insulating layers 118 are provided on side surfaces of the gate layer 110. In the substrate 100 containing a semiconductor material, the pair of high concentration impurity regions 120a and 120b is placed in regions that do not overlap with the sidewall insulating layers 118. A pair of metal compound regions 124a and 124b is placed on the pair of high concentration impurity regions 120a and 120b. An element isolation insulating layer 106 is provided over the substrate 100 so as to surround the transistor 160. An interlayer insulating layer 126 and an interlayer insulating layer 128 are provided so as to cover the transistor 160. The source layer 130a and the drain layer 130b are electrically connected to the metal compound region 124a and the metal compound region 124b, respectively, through openings formed in the interlayer insulating layers 126 and 128. That is, the source layer 130a is electrically connected to the high concentration impurity region 120a and the impurity region 114a through the metal compound region 124a, and the drain layer 130b is electrically connected to the high concentration impurity region 120b and the impurity region 114b through the metal compound region 124b.

A transistor 164 illustrated in FIG. 11 includes a gate layer 136d provided over the interlayer insulating layer 128, a gate insulating layer 138 provided over the gate layer 136d, an oxide semiconductor layer 140 provided over the gate insulating layer 138, and a source layer 142a and a drain layer 142b that are provided over the oxide semiconductor layer 140 and electrically connected to the oxide semiconductor layer 140.

Here, the gate layer 136d is provided to be embedded in an insulating layer 132 formed over the interlayer insulating layer 128. Like the gate layer 136d, an electrode layer 136a and an electrode layer 136b that are included in the transistor 160 and are in contact with the source layer 130a and the drain layer 130b, respectively, are formed.

A protective insulating layer 144 is provided over the transistor 164 so as to be in contact with part of the oxide semiconductor layer 140. An interlayer insulating layer 146 is provided over the protective insulating layer 144. Here, openings reaching the source layer 142a and the drain layer 142b are provided in the protective insulating layer 144 and the interlayer insulating layer 146. An electrode layer 150d in contact with the source layer 142a and an electrode layer 150e in contact with the drain layer 142b are formed through the openings. Like the electrode layers 150d and 150e, an electrode layer 150a in contact with the electrode layer 136a and an electrode layer 150b in contact with the electrode layer 136b are formed through openings provided in the gate insulating layer 138, the protective insulating layer 144, and the interlayer insulating layer 146.

The oxide semiconductor layer 140 is purified by sufficient removal of impurities such as hydrogen. Specifically, the hydrogen concentration of the oxide semiconductor layer 140 is $5\times10^{19}$ (atoms/cm$^3$) or lower. Note that the hydrogen concentration of the oxide semiconductor layer 140 is preferably $5\times10^{18}$ (atoms/cm$^3$) or lower, further preferably $5\times10^{17}$ (atoms/cm$^3$) or lower. Note that the hydrogen concentration of the oxide semiconductor layer 140 is measured by secondary ion mass spectrometry (SIMS).

Further, an insulating layer 152 is provided over the interlayer insulating layer 146, and an electrode layer 154a, an electrode layer 154b, and an electrode layer 154d are provided so as to be embedded in the insulating layer 152. Note that the electrode layer 154a is in contact with the electrode layer 150a, the electrode layer 154b is in contact with the electrode layer 150b and the electrode layer 150d, and the electrode layer 154d is in contact with the electrode layer 150e.

As illustrated in FIG. 11, the drain layer 130b in the transistor 160 is electrically connected to the source layer 142a in the transistor 164 through the electrode layer 136b, the electrode layer 150b, the electrode layer 154b, and the electrode layer 150d which are provided in the upper region.

<Example of Formation Process>

Next, examples of methods for forming the transistor 160 and the transistor 164 will be described. A method for forming the p-channel transistor 160 is described first with reference to FIGS. 12A to 12H, and then, a method for forming the transistor 164 is described with reference to FIGS. 13A to 13G and FIGS. 14A to 14D.

Figure 12A:
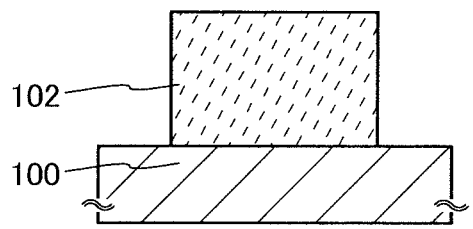
FIGS. 12A to 12H illustrate an example of specific steps for forming a transistor.

First, the substrate 100 containing a semiconductor material is prepared (see FIG. 12A). As the substrate 100 containing a semiconductor material, a single crystal semiconductor substrate or a polycrystalline semiconductor substrate of silicon, silicon carbide, or the like, a compound semiconductor substrate of silicon germanium or the like, an SOI substrate, or the like can be used. Here, an example where a single crystal silicon substrate is used as the substrate 100 containing a semiconductor material is described. Note that in general, the "SOI substrate" means a substrate in which a silicon semiconductor layer is provided on an insulating surface. In this specification and the like, the "SOI substrate" also includes a substrate in which a semiconductor layer containing a material other than silicon is provided over an insulating surface in its category. That is, a semiconductor layer included in the "SOI substrate" is not limited to a silicon semiconductor layer. Further, the "SOI substrate" includes a substrate in which a semiconductor layer is formed over an insulating substrate such as a glass substrate with an insulating layer placed therebetween.

A protective layer 102 serving as a mask for formation of an element isolation insulating layer is formed over the substrate 100 (see FIG. 12A). As the protective layer 102, an insulating layer formed using silicon oxide, silicon nitride, silicon nitride oxide, or the like can be used, for example. Note that before or after this step, an impurity element imparting n-type conductivity or an impurity element imparting p-type conductivity may be added to the substrate 100 in order to control the threshold voltage of a transistor. When silicon is used as the semiconductor, phosphorus, arsenic, or the like can be used as the impurity imparting n-type conductivity. Boron, aluminum, gallium, or the like can be used as the impurity imparting p-type conductivity.

Next, part of the substrate 100 which is not covered with the protective layer 102 (i.e., the substrate 100 in an exposed region) is removed by etching with the use of the protective layer 102 as a mask. Thus, an isolated semiconductor region 104 is formed (see FIG. 12B). As the etching, dry etching is preferably performed, but wet etching may be performed. An etching gas or an etchant can be selected as appropriate depending on materials of layers to be etched.

Figure 12B:
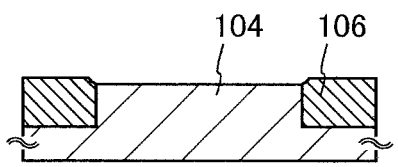

Then, an insulating layer is formed to cover the semiconductor region 104, and part of the insulating layer which overlaps with the semiconductor region 104 is selectively removed, so that the element isolation insulating layers 106 are formed (see FIG. 12B). The insulating layer is formed using silicon oxide, silicon nitride, silicon nitride oxide, or the like. As a method for removing the insulating layer, any of polishing treatment such as chemical mechanical polishing (CMP), etching treatment, and the like can be employed. Note that the protective layer 102 is removed after the formation of the semiconductor region 104 or after the formation of the element isolation insulating layers 106.

Next, an insulating layer is formed over the semiconductor region 104, and a layer containing a conductive material is formed over the insulating layer.

The insulating layer serves as a gate insulating layer later, and preferably has a single-layer structure or a stacked structure using a film containing silicon oxide, silicon nitride oxide, silicon nitride, hafnium oxide, aluminum oxide, tantalum oxide, or the like formed by CVD, sputtering, or the like. Alternatively, the insulating layer may be formed in such a manner that a surface of the semiconductor region 104 is oxidized or nitrided by high-density plasma treatment or thermal oxidation treatment. The high-density plasma treatment can be performed using, for example, a mixed gas of a rare gas such as He, Ar, Kr, or Xe and a gas such as oxygen, nitrogen oxide, ammonia, or nitrogen. There is no particular limitation on the thickness of the insulating layer; the insulating layer can have a thickness of 1 nm to 100 nm, for example.

The layer containing a conductive material can be formed using a metal material such as aluminum, copper, titanium, tantalum, or tungsten. The layer containing a conductive material may be formed using a semiconductor material such as polycrystalline silicon containing a conductive material. There is no particular limitation on the method for forming the layer containing a conductive material, and a variety of film formation methods such as evaporation, CVD, sputtering, and spin coating can be employed. Note that here, an example of the case where the layer containing a conductive material is formed using a metal material is described.

Figure 12C:
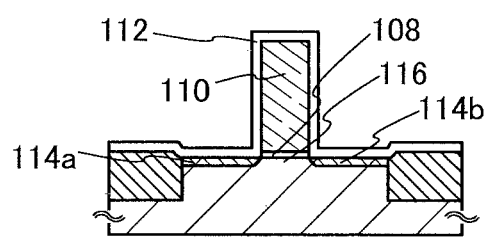

After that, the insulating layer and the layer containing a conductive material are selectively etched, so that the gate insulating layer 108 and the gate layer 110 are formed (see FIG. 12C).

Next, an insulating layer 112 that covers the gate layer 110 is formed (see FIG. 12C). Then, boron (B), phosphorus (P), arsenic (As), or the like is added to the semiconductor region 104, so that the pair of impurity regions 114a and 114b with a shallow junction is formed (see FIG. 12C). Note that by formation of the pair of impurity regions 114a and 114b, the channel formation region 116 is formed in the semiconductor region 104 below the gate insulating layer 108 (see FIG. 12C). Here, the concentration of the impurity added can be set as appropriate; the concentration is preferably increased when the size of the transistor is extremely decreased. Although the pair of impurity regions 114a and 114b is formed after formation of the insulating layer 112 here, the insulating layer 112 may be formed after formation of the pair of impurity regions 114a and 114b.

Figure 12D:
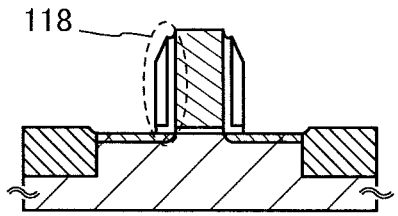
Figure 12E:
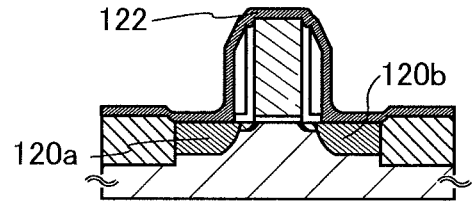
Figure 12F:
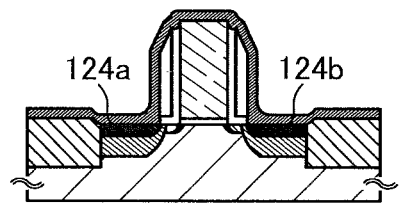

Next, the sidewall insulating layers 118 are formed (see FIG. 12D). The sidewall insulating layers 118 can be formed in a self-aligned manner by forming an insulating layer so as to cover the insulating layer 112 and then performing highly anisotropic etching on the insulating layer. At this time, by partial etching of the insulating layer 112, an upper surface of the gate layer 110 and upper surfaces of the pair of impurity regions 114a and 114b are preferably exposed.

Next, an insulating layer is formed so as to cover the gate layer 110, the pair of impurity regions 114a and 114b, the sidewall insulating layers 118, and the like. Then, boron (B), phosphorus (P), arsenic (As), or the like is added to part of the impurity regions 114a and 114b, whereby the pair of high concentration impurity regions 120a and 120b is formed (see FIG. 12E). After that, the insulating layer is removed, and a metal layer 122 is formed so as to cover the gate layer 110, the sidewall insulating layers 118, the pair of high concentration impurity regions 120a and 120b, and the like (see FIG. 12E). The metal layer 122 can be formed by a variety of film formation methods such as vacuum evaporation, sputtering, and spin coating. The metal layer 122 is preferably formed using a metal material that reacts with a semiconductor material included in the semiconductor region 104 to be a low-resistance metal compound. Examples of such metal materials are titanium, tantalum, tungsten, nickel, cobalt, and platinum.

Next, heat treatment is performed so that the metal layer 122 reacts with the semiconductor material. Thus, the pair of metal compound regions 124a and 124b in contact with the pair of high concentration impurity regions 120a and 120b is formed (see FIG. 12F). Note that when the gate layer 110 is formed using polycrystalline silicon or the like, a metal compound region is also formed in a region of the gate layer 110 in contact with the metal layer 122.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction for formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the pair of metal compound regions 124a and 124b is formed.

Figure 12G:
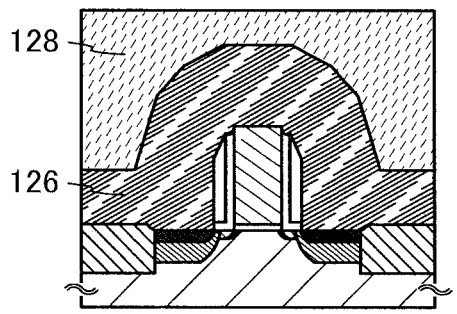

Next, the interlayer insulating layer 126 and the interlayer insulating layer 128 are formed so as to cover the components formed in the above steps (see FIG. 12G). The interlayer insulating layers 126 and 128 can be formed using an inorganic insulating material such as silicon oxide, silicon nitride oxide, silicon nitride, hafnium oxide, aluminum oxide, or tantalum oxide. Moreover, the interlayer insulating layers 126 and 128 can be formed using an organic insulating material such as polyimide or acrylic. Note that the interlayer insulating layer has a two-layer structure of the interlayer insulating layer 126 and the interlayer insulating layer 128 here; it is not limited to having this structure. After the formation of the interlayer insulating layer 128, a surface of the interlayer insulating layer 128 is preferably planarized with CMP, etching, or the like.

Figure 12H:
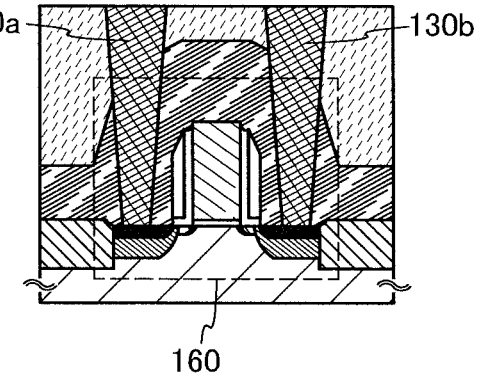

After that, openings reaching the pair of metal compound regions 124a and 124b are formed in the interlayer insulating layers, and the source layer 130a and the drain layer 130b are formed in the openings (see FIG. 12H). The source layer 130a and the drain layer 130b can be formed in such a manner, for example, that a conductive layer is formed in a region including the openings by PVD, CVD, or the like and then part of the conductive layer is removed by etching or CMP.

It is preferable that the source layer 130a and the drain layer 130b be formed to have a planar surface. For example, when a thin titanium film or a thin titanium nitride film is formed in a region including the openings and then a tungsten film is formed to be embedded in the openings, excess tungsten, titanium, titanium nitride, or the like is removed and the planarity of the surface can be improved by subsequent CMP In such a manner, the surface including the source layer 130a and the drain layer 130b is planarized, whereby an electrode, a wiring, an insulating layer, a semiconductor layer, and the like can be favorably formed in later steps.

Note that here, only the source layer 130a and the drain layer 130b which are in contact with the pair of metal compound regions 124a and 124b are illustrated; an electrode layer serving as a wiring or the like can be formed together in this step. There is no particular limitation on a material used for the source layer 130a and the drain layer 130b, and a variety of conductive materials can be used. For example, a conductive material such as molybdenum, titanium, chromium, tantalum, tungsten, aluminum, copper, neodymium, or scandium can be used.

Through the above steps, the transistor 160 using the substrate 100 containing a semiconductor material is formed. Note that an electrode, a wiring, an insulating layer, or the like may be further formed after the above step. When the wiring has a multilayer wiring structure which is a stacked structure including an interlayer insulating layer and a conductive layer, a highly integrated circuit can be provided.

Next, steps for forming the transistor 164 over the interlayer insulating layer 128 will be described with reference to FIGS. 13A to 13G and FIGS. 14A to 14D. Note that FIGS. 13A to 13G and FIGS. 14A to 14D illustrate steps for forming various electrode layers, the transistor 164, and the like over the interlayer insulating layer 128; therefore, the transistor 160 and the like placed below the transistor 164 are omitted.

Figure 13A:
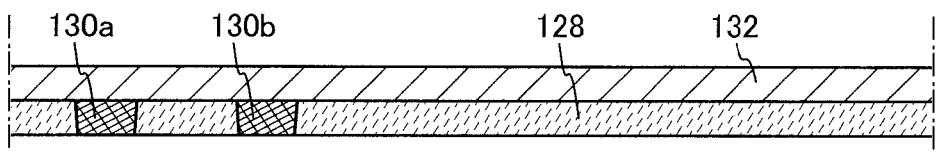
FIGS. 13A to 13G illustrate an example of specific steps for forming a transistor.

First, the insulating layer 132 is formed over the interlayer insulating layer 128, the source layer 130a, and the drain layer 130b (see FIG. 13A). The insulating layer 132 can be formed by PVD, CVD, or the like. The insulating layer 132 can be formed using an inorganic insulating material such as silicon oxide, silicon nitride oxide, silicon nitride, hafnium oxide, aluminum oxide, or tantalum oxide.

Figure 13B:
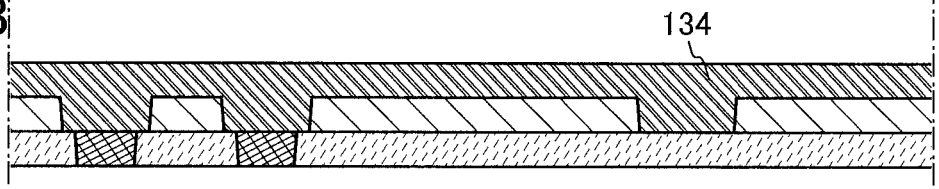

Next, openings that reach the source layer 130a and the drain layer 130b are formed in the insulating layer 132. At this time, an opening is also formed in a region where the gate layer 136d is to be formed later. Then, a conductive layer 134 is formed so as to fill the openings (FIG. 13B). The openings can be formed by etching using a mask or the like. The mask can be formed by light exposure using a photomask or the like. Either wet etching or dry etching may be used as the etching; dry etching is preferably used in terms of microfabrication. The conductive layer 134 can be formed by a film formation method such as PVD or CVD. The conductive layer 134 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings by PVD and a thin titanium nitride film is formed by CVD, and then, a tungsten film is formed to fill the openings. Here, the titanium film formed by PVD has a function of deoxidizing an oxide film at an interface so as to reduce contact resistance with the lower electrode layers (here, the source layer 130a, the drain layer 130b, and the like). The titanium nitride film formed after the formation of the titanium film has a barrier function of preventing diffusion of the conductive material. A copper film may be formed by plating after the formation of the barrier film of titanium, titanium nitride, or the like.

Figure 13C:
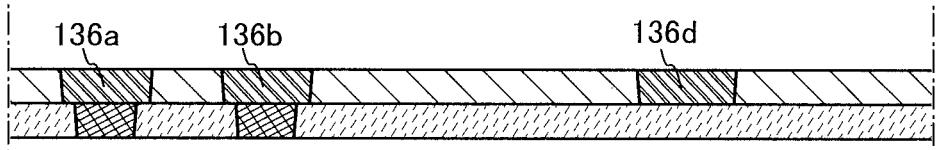

After the conductive layer 134 is formed, part of the conductive layer 134 is removed by etching, CMP, or the like, whereby the insulating layer 132 is exposed and the electrode layers 136a and 136b and the gate layer 136d are formed (see FIG. 13C). Note that when the electrode layers 136a and 136b and the gate layer 136d are formed by removal of part of the conductive layer 134, the process is preferably performed so that the surfaces are planarized. The surfaces of the insulating layer 132, the electrode layers 136a and 136b, and the gate layer 136d are planarized in such a manner, whereby an electrode, a wiring, an insulating layer, a semiconductor layer, and the like can be favorably formed in later steps.

Figure 13D:
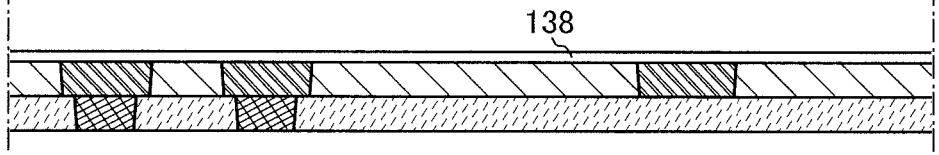

Next, the gate insulating layer 138 is formed so as to cover the insulating layer 132, the electrode layers 136a and 136b, and the gate layer 136d (see FIG. 13D). The gate insulating layer 138 can be formed by CVD, sputtering, or the like. It is preferable that the gate insulating layer 138 contain silicon oxide, silicon nitride, silicon oxynitride, silicon nitride oxide, aluminum oxide, hafnium oxide, tantalum oxide, gallium oxide, or the like. Note that the gate insulating layer 138 may have a single-layer structure or a stacked structure. For example, the gate insulating layer 138 made of silicon oxynitride can be formed by plasma-enhanced CVD using silane (Sint), oxygen, and nitrogen as a source gas. There is no particular limitation on the thickness of the gate insulating layer 138; the gate insulating layer 138 can have a thickness of 10 nm to 500 nm, for example. In the case of employing a stacked structure, for example, the gate insulating layer 138 is preferably a stack of a first gate insulating layer with a thickness of 50 nm to 200 nm, and a second gate insulating layer with a thickness of 5 nm to 300 nm over the first gate insulating layer.

Figure 13E:
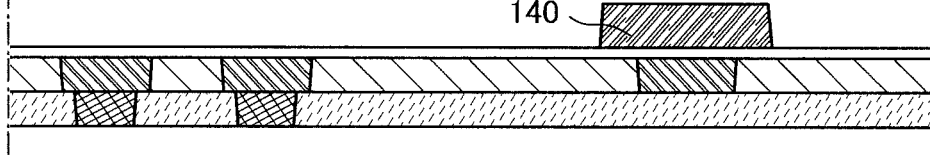

Then, an oxide semiconductor layer is formed over the gate insulating layer 138 and processed by etching using a mask or the like, whereby the island-shaped oxide semiconductor layer 140 is formed (see FIG. 13E).

An oxide semiconductor to be used preferably contains at least indium (In) or zinc (Zn). In particular, the oxide semiconductor preferably contains In and Zn. As a stabilizer for reducing variation in electric characteristics of a transistor including the oxide semiconductor, the oxide semiconductor preferably contains gallium (Ga) in addition to In and Zn. Moreover, the oxide semiconductor preferably contains tin (Sn), hafnium (Hf), and/or aluminum (Al) as a stabilizer.

As another stabilizer, one or plural kinds of lanthanoid such as lantern (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

Examples of the oxide semiconductor to be used are an indium oxide; a tin oxide; a zinc oxide; an oxide of two metal elements, such as an In—Zn-based oxide, a Sn—Zn-based oxide, an Al—Zn-based oxide, a Zn—Mg-based oxide, a Sn—Mg-based oxide, an In—Mg-based oxide, and an In—Ga-based oxide; an oxide of three metal elements, such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In—Lu—Zn-based oxide; and an oxide of four metal elements, such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no particular limitation on the composition ratio of In, Ga, and Zn. Further, a metal element in addition to In, Ga, and Zn may be contained.

Further, a material represented by $InMO_3(ZnO)_m$ (m is larger than 0 and is not an integer) may be used as the oxide semiconductor. Note that M represents one or more metal elements selected from Ga, Fe, Mn, and Co. As the oxide semiconductor, a material represented by $In_3SnO_5(ZnO)_n$ (n is larger than 0 and is an integer) may be used.

For example, it is possible to use an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above compositions. Alternatively, it is possible to use an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the above compositions.

Without limitation to the above, an oxide semiconductor with an appropriate composition ratio can be used in accordance with desired semiconductor characteristics (e.g., mobility, threshold voltage, and variation). In order to obtain needed semiconductor characteristics, an oxide semiconductor preferably has appropriate carrier concentration, impurity concentration, defect density, atomic ratio of a metal element to oxygen, bond distance, density, or the like.

For example, high mobility can be relatively easily obtained with an In—Sn—Z-based oxide. Even when an In—Ga—Zn-based oxide is used, the mobility can be increased by a reduction in bulk defect density.

Note that the case where the composition of an oxide having an atomic ratio of In:Ga:Zn=a:b:c (a+b+c=1) is in the neighborhood of the composition of an oxide having an atomic ratio of In:Ga:Zn=A:B:C (A+B+C=1) means that a, b, and c satisfy the following relation: $(a-A)^2+(b-B)^2+(c-C)^2$ and r may be 0.05, for example. The same can be applied to other oxides.

The oxide semiconductor may be single crystal or non-single-crystal. A non-single-crystal oxide semiconductor may be amorphous or polycrystalline. Further, the oxide semiconductor may have an amorphous structure including a portion having crystallinity or a non-amorphous structure.

In an oxide semiconductor in an amorphous state, a flat surface can be obtained with relative ease. When a transistor is formed using the oxide semiconductor in an amorphous state, interface scattering can be reduced, and relatively high mobility can be obtained with relative ease.

In an oxide semiconductor having crystallinity, defects in the bulk can be further reduced. When a surface flatness is improved, mobility higher than that of an oxide semiconductor in an amorphous state can be obtained. In order to improve the surface flatness, the oxide semiconductor is preferably formed on a flat surface. Specifically, it is preferable that the oxide semiconductor be formed on a surface with an average surface roughness ($R_a$) of 1 nm or less, preferably 0.3 nm or less, further preferably 0.1 nm or less.

Note that $R_a$ is obtained by expanding centerline average roughness, which is defined by JIS B 0601, into three dimensions so as to be applicable to a surface. Moreover, $R_a$ can be expressed as average value of the absolute values of deviations from a reference surface to a specific surface and is defined by the following formula.

$$Ra = \frac{1}{S_0} \int_{x_2}^{x_1} \int_{y_2}^{y_1} |f(x, y) - Z_0| dx dy \qquad \text{[Formula 4]}$$

Note that in Formula 4, $S_0$ represents the area of a measurement surface (a rectangular region defined by four points represented by the coordinates $(x_1,y_1)$, $(x_1,y_2)$, $(x_2,y_1)$, and $(x_2,y_2)$), and Zo represents average height of the measurement surface. Further, $R_a$ can be measured with an atomic force microscope (AFM).

Here, as the oxide semiconductor layer, an amorphous oxide semiconductor layer is formed by sputtering using an In—Ga—Zn—O-based metal oxide target.

As a target used for forming the oxide semiconductor layer 140 by sputtering, a metal oxide target containing zinc oxide or the like as its main component can be used, for example. It is possible to use a metal oxide target containing In, Ga, and Zn (a composition ratio of $In_2O_3:Ga_2O_3:ZnO=1:1:1$ [molar ratio] and In:Ga:Zn=1:1:0.5 [atomic ratio]). As the metal oxide target containing In, Ga, and Zn, it is possible to use a target having a composition ratio of In:Ga:Zn=1:1:1 [atomic ratio] or a composition ratio of In:Ga:Zn=1:1:2 [atomic ratio]. The filling factor of the metal oxide target is 90% to 100, and preferably 95% or higher (e.g., 99.9%). With use of a metal oxide target with high filling factor, a dense oxide semiconductor layer can be formed.

In the case where an In—Zn—O-based material is used for the oxide semiconductor layer 140, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 ($In_2O_3$:ZnO=15:2 to 3:4 in a molar ratio). For example, when a metal oxide target used for forming an In—Zn—O-based oxide semiconductor has an atomic ratio of In:Zn:O=X:Y:Z, the relation of Z>1.5X+Y is satisfied.

An In—Sn—Zn-based oxide can be referred to as ITZO. For ITZO, an oxide target having a composition ratio of In:Sn:Zn=1:2:2, 2:1:3, 1:1:1, or 20:45:35 in an atomic ratio is used, for example.

The atmosphere in which the oxide semiconductor layer is formed is preferably a rare gas (typically argon) atmosphere, an oxygen atmosphere, or a mixed atmosphere containing a rare gas (typically argon) and oxygen. Specifically, it is preferable to use a high-purity gas in which impurities such as hydrogen, water, a hydroxyl group, or a hydride are reduced to about several parts per million (ppm) (preferably about several parts per billion (ppb)).

At the time of forming the oxide semiconductor layer, the substrate is held in a treatment chamber that is maintained at reduced pressure, and the substrate temperature is set to 100° C. to 600° C., preferably 200° C. to 400° C. The oxide semiconductor layer is formed while the substrate is heated, so that the impurity concentration of the oxide semiconductor layer can be reduced. In addition, damage by sputtering can be reduced. Then, a sputtering gas from which hydrogen and water are removed is introduced into the treatment chamber from which remaining moisture is being removed, and the oxide semiconductor layer is formed using a metal oxide as a target. In order to remove remaining moisture in the treatment chamber, an entrapment vacuum pump is preferably used. For example, a cryopump, an ion pump, or a titanium sublimation pump can be used. The evacuation unit may be a turbo pump provided with a cold trap. A hydrogen atom, a compound containing a hydrogen atom, such as water ($H_2O$) (more preferably also a compound containing a carbon atom), and the like are removed from the deposition chamber evacuated with a cryopump, so that the impurity concentration of the oxide semiconductor layer formed in the deposition chamber can be reduced.

The oxide semiconductor layer can be formed under the following conditions, for example: the distance between the substrate and the target is 100 mm; the pressure is 0.6 Pa; the direct-current (DC) power is 0.5 kW; and the atmosphere is oxygen (the flow rate ratio of oxygen is 100%). Note that the use of a pulse direct-current (DC) power source is preferably used because dust can be reduced and the film thickness can be uniform. The thickness of the oxide semiconductor layer is 2 nm to 200 nm, preferably 5 nm to 30 nm. Note that an appropriate thickness differs depending on an oxide semiconductor material, and the thickness is set as appropriate depending on the material to be used.

Note that before the oxide semiconductor layer is formed by sputtering, dust attached on the surface of the gate insulating layer 138 is preferably removed by reverse sputtering in which plasma is generated with an argon gas introduced. Here, reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near a substrate. Note that an atmosphere of nitrogen, helium, oxygen, or the like may be used instead of an argon atmosphere.

As an etching method for the oxide semiconductor layer, either dry etching or wet etching can be employed. Needless to say, dry etching and wet etching can be used in combination. The etching conditions (e.g., an etching gas or an etchant, etching time, and temperature) are set as appropriate depending on the material so that the oxide semiconductor layer can be etched into a desired shape.

An example of an etching gas used for dry etching is a gas containing chlorine (a chlorine-based gas such as chlorine ($Cl_2$), boron trichloride ($BCl_3$), silicon tetrachloride ($SiCl_4$), or carbon tetrachloride ($CCl_4$)). Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, parallel plate RIE (reactive ion etching) or ICP (inductively coupled plasma) etching can be used. In order to etch the oxide semiconductor layer into a desired shape, etching conditions (e.g., the amount of electric power applied to a coiled electrode, the amount of electric power applied to an electrode on the substrate side, and the electrode temperature on the substrate side) are set as appropriate.

As an etchant used for wet etching, a mixed solution of phosphoric acid, acetic acid, and nitric acid can be used, for example. An etchant such as ITO07N (produced by Kanto Chemical Co., Inc.) may also be used.

Then, first heat treatment is preferably performed on the oxide semiconductor layer. The oxide semiconductor layer can be dehydrated or dehydrogenated with the first heat treatment. The temperature of the first heat treatment is 300° C. or more and 750° C. or less, preferably 400° C. or more and less than the strain point of the substrate. For example, the substrate is introduced into an electric furnace in which a resistance heating element or the like is used, and the oxide semiconductor layer 140 is subjected to heat treatment at 450° C. for one hour in a nitrogen atmosphere. The oxide semiconductor layer 140 is not exposed to the air during the heat treatment so that entry of water and hydrogen can be prevented.

The heat treatment apparatus is not limited to the electric furnace and can be an apparatus for heating an object by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object by heat treatment, for example, nitrogen or a rare gas such as argon is used.

For example, as the first heat treatment, a GRTA process may be performed as follows. The substrate is put in an inert gas that has been heated to a high temperature of 650° C. to 700° C., heated for several minutes, and taken out of the inert gas. The GRTA process enables high-temperature heat treatment for a short time. Moreover, the GRTA process can be employed even when the temperature exceeds the strain point of the substrate because it is heat treatment for a short time.

Note that the first heat treatment is preferably performed in an atmosphere that contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is 6N (99.9999%) or more, preferably 7N (99.99999%) or more (i.e., the impurity concentration is 1 ppm or less, preferably 0.1 ppm or less).

Depending on the conditions of the first heat treatment or the material of the oxide semiconductor layer, the oxide semiconductor layer is sometimes crystallized to be microcrystalline or polycrystalline. For example, the oxide semiconductor layer sometimes becomes a microcrystalline oxide semiconductor layer with a degree of crystallization of 90% or more, or 80% or more. Further, depending on the conditions of the first heat treatment or the material of the oxide semiconductor layer, the oxide semiconductor layer may be an amorphous oxide semiconductor layer including no crystalline component.

Furthermore, in the oxide semiconductor layer, a microcrystal (with a grain size of 1 nm to 20 nm, typically 2 nm to 4 nm) is sometimes mixed in an amorphous oxide semiconductor (e.g., a surface of the oxide semiconductor layer).

The electrical characteristics of the oxide semiconductor layer can be changed by aligning microcrystals in an amorphous semiconductor. For example, in the case where the oxide semiconductor layer is formed using an In—Ga—Zn—O-based metal oxide target, a microcrystalline portion where crystal grains of $In_2Ga_2ZnO_7$ having electrical anisotropy are aligned is formed, whereby the electric characteristics of the oxide semiconductor layer can be changed.

Specifically, for example, when the crystal grains are arranged so that the c-axis of $In_2Ga_2ZnO_7$ is perpendicular to a surface of the oxide semiconductor layer, the conductivity in the direction parallel to the surface of the oxide semiconductor layer can be improved and insulating properties in the direction perpendicular to the surface of the oxide semiconductor layer can be improved. Furthermore, such a microcrystalline portion has a function of suppressing entry of impurities such as water or hydrogen into the oxide semiconductor layer.

Note that the oxide semiconductor layer including the microcrystalline portion can be formed by heating the surface of the oxide semiconductor layer by a GRTA process. In addition, the oxide semiconductor layer can be formed in a more preferred manner by using a sputtering target in which the amount of Zn is smaller than that of In or Ga.

Here, an oxide including a crystal with c-axis alignment, which has a triangular or hexagonal atomic arrangement when seen from the direction of an a-b plane, a surface, or an interface, will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis). Such a crystal is also referred to as a c-axis aligned crystal (CAAC).

In a broad sense, an oxide including CAAC means a non-single-crystal oxide including a phase that has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

An example of such a CAAC is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 23A to 23E, FIGS. 24A to 24C, and FIGS. 25A to 25C. In FIGS. 23A to 23E, FIGS. 24A to 24C, and FIGS. 25A to 25C, the vertical direction corresponds to the c-axis direction and a plane perpendicular to the c-axis direction corresponds to the a-b plane, unless otherwise specified. In the case where the expressions "an upper half" and "a lower half" are simply used, they refer to an upper half above the a-b plane and a lower half below the a-b plane (an upper half and a lower half with respect to the a-b plane).

Figure 23A:
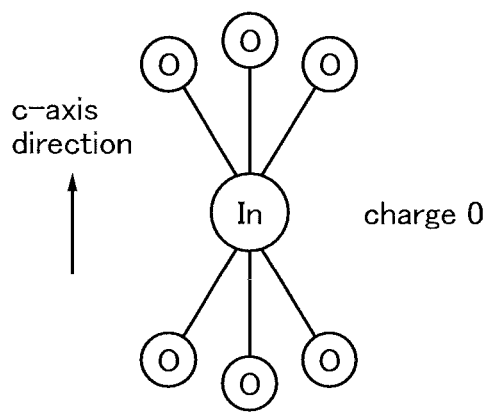
FIGS. 23A to 23E each illustrate a crystal structure of an oxide material.

FIG. 23A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 23A is actually an octahedral structure, but is illustrated as a planar structure for simplicity. Note that three tetracoordinate O atoms exist in each of an upper half and a lower half in FIG. 23A. In the small group illustrated in FIG. 23A, electric charge is 0.

Figure 23D:
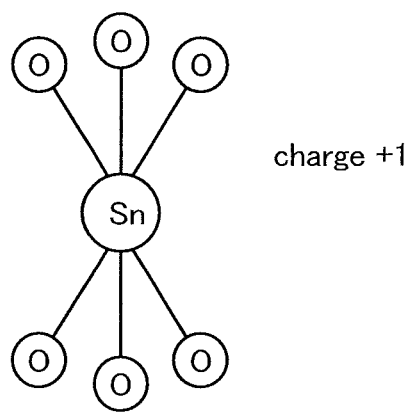
Figure 23B:
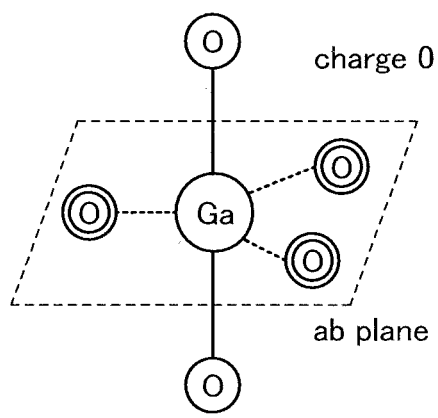

FIG. 23B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 23B. An In atom can also have the structure illustrated in FIG. 23B because an In atom can have five ligands. In the small group illustrated in FIG. 23B, electric charge is 0.

Figure 23E:
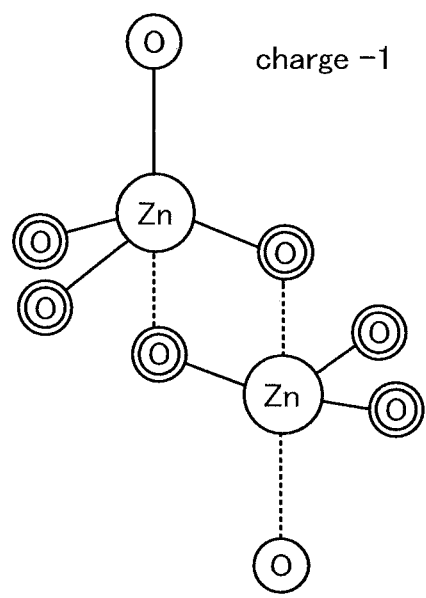
Figure 23C:
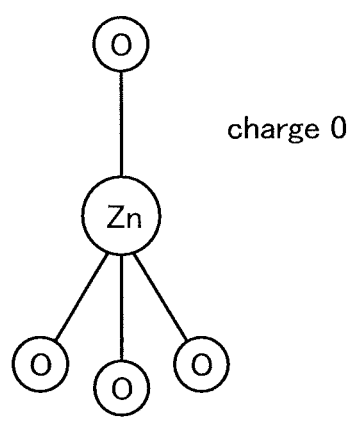

FIG. 23C illustrates a structure including one tetracoordinate Zn atom and four tetracoordinate O atoms proximate to the Zn atom. In FIG. 23C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 23C. In the small group illustrated in FIG. 23C, electric charge is 0.

FIG. 23D illustrates a structure including one hexacoordinate Sn atom and six tetracoordinate O atoms proximate to the Sn atom. In FIG. 23D, three tetracoordinate O atoms exist in each of an upper half and a lower half. In the small group illustrated in FIG. 23D, electric charge is +1.

FIG. 23E illustrates a small group including two Zn atoms. In FIG. 23E, one tetracoordinate O atom exists in each of an upper half and a lower half. In the small group illustrated in FIG. 23E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 23A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 24A illustrates a model of a medium group included in a layered structure of an In—Sn—Zn—O-based material. FIG. 24B illustrates a large group including three medium groups. FIG. 24C illustrates an atomic arrangement in the case where the layered structure in FIG. 24B is observed from the c-axis direction.

In FIG. 24A, for simplicity, a tricoordinate O atom is omitted and a tetracoordinate O atom is shown by a circle; the number in the circle shows the number of tetracoordinate O atoms. For example, three tetracoordinate O atoms existing in each of an upper half and a lower half with respect to a Sn atom are denoted by circled 3. Similarly, in FIG. 24A, one tetracoordinate O atom existing in each of an upper half and a lower half with respect to an In atom is denoted by circled 1. FIG. 24A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 24A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 23E can be given. For example, with one small group including two Zn atoms, electric charge of one small group including a Sn atom can be cancelled, so that the total electric charge of the layered structure can be 0.

When the large group illustrated in FIG. 24B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: an oxide of four metal elements, such as an In—Sn—Ga—Zn-based oxide; an oxide of three metal elements, such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In—Lu—Zn-based oxide; an oxide of two metal elements, such as an In—Zn-based oxide, a Sn—Zn-based oxide, an Al—Zn-based oxide, a Zn—Mg-based oxide, a Sn—Mg-based oxide, an In—Mg-based oxide, and an In—Ga-based oxide.

Figures 25A, 25B, 25C:
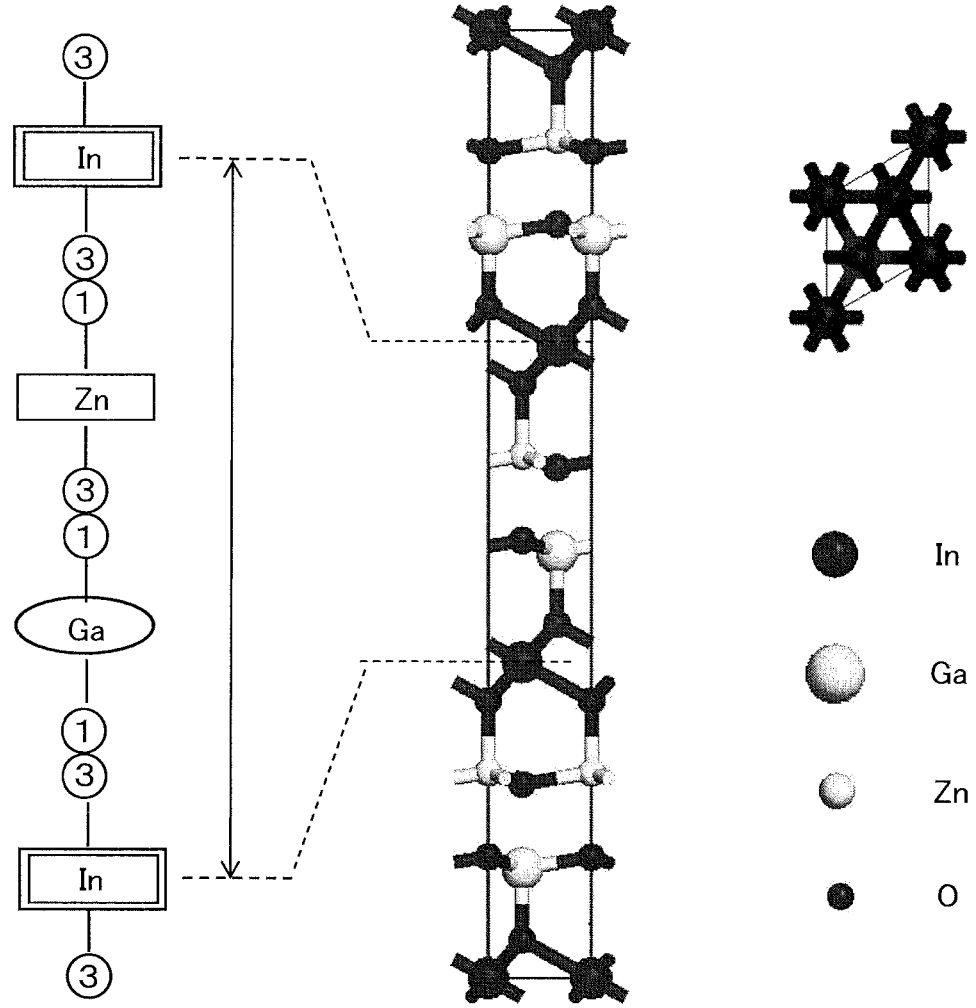
FIGS. 25A to 25C illustrate a crystal structure of an oxide semiconductor material.

As an example, FIG. 25A illustrates a model of a medium group included in a layered structure of an In—Ga—Zn—O-based material.

In the medium group included in the layered structure of the In—Ga—Zn—O-based material in FIG. 25A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 25B illustrates a large group including three medium groups. FIG. 25C illustrates an atomic arrangement in the case where the layered structure in FIG. 25B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 25A but also a medium group in which the arrangement of the In atom, the Ga atom, and the Zn atom is different from that in FIG. 25A.

The first heat treatment for the oxide semiconductor layer 140 can be performed on the oxide semiconductor layer that has not yet been processed into the island-shaped oxide semiconductor layer 140. In that case, after the first heat treatment, the substrate is taken out of the heating apparatus and a photolithography process is performed.

Note that the first heat treatment can be called dehydration treatment or dehydrogenation treatment because it is effective in dehydrating or dehydrogenating the oxide semiconductor layer 140. It is possible to perform such dehydration treatment or dehydrogenation treatment, for example, after the oxide semiconductor layer is formed, after source and drain layers are stacked over the oxide semiconductor layer 140, or after a protective insulating layer is formed over the source and drain layers. Such dehydration treatment or dehydrogenation treatment may be conducted once or plural times.

Figure 13F:
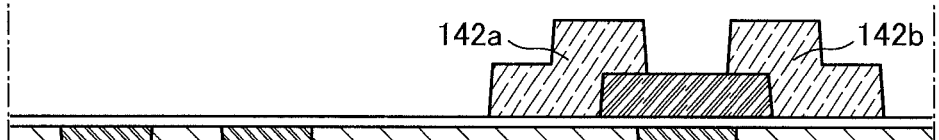

Next, the source layer 142a and the drain layer 142b are formed so as to be in contact with the oxide semiconductor layer 140 (see FIG. 13F). The source layer 142a and the drain layer 142b can be formed in such a manner that a conductive layer is formed so as to cover the oxide semiconductor layer 140 and then is selectively etched.

The conductive layer can be formed by PVD such as sputtering or CVD such as plasma-enhanced CVD. As a material for the conductive layer, an element selected from aluminum, chromium, copper, tantalum, titanium, molybdenum, and tungsten; an alloy containing any of these elements as a component; or the like can be used. Moreover, one or more materials selected from manganese, magnesium, zirconium, beryllium, and thorium may be used. Aluminum combined with one or more of elements selected from titanium, tantalum, tungsten, molybdenum, chromium, neodymium, and scandium may be used. The conductive layer can have a single-layer structure or a stacked structure including two or more layers. For example, the conductive layer can have a single-layer structure of an aluminum film containing silicon, a two-layer structure in which a titanium film is stacked over an aluminum film, or a three-layer structure in which a titanium film, an aluminum film, and a titanium film are stacked in this order.

The materials and etching conditions of the conductive layer and the oxide semiconductor layer 140 are adjusted as appropriate so that the oxide semiconductor layer 140 is not removed in etching of the conductive layer. Note that in some cases, the oxide semiconductor layer 140 is partly etched in the etching step and thus has a groove portion (a recessed portion) depending on the materials and the etching conditions.

An oxide conductive layer may be formed between the oxide semiconductor layer 140 and the source layer 142a or between the oxide semiconductor layer 140 and the drain layer 142b. It is possible to successively form the oxide conductive layer and a metal layer that is to be the source layer 142a and the drain layer 142b (successive deposition). The oxide conductive layer can function as a source region or a drain region. The placement of such an oxide conductive layer can reduce the resistance of the source region or the drain region, so that the transistor can operate at high speed.

In order to reduce the number of masks to be used and reduce the number of steps, an etching step may be performed with the use of a resist mask formed using a multi-tone mask which is a light-exposure mask through which light is transmitted to have a plurality of intensities. A resist mask formed with the use of a multi-tone mask has a plurality of thicknesses (has a stair-like shape) and further can be changed in shape by ashing; therefore, the resist mask can be used in a plurality of etching steps for providing different patterns. That is, a resist mask corresponding to at least two kinds of different patterns can be formed by using a multi-tone mask. Thus, the number of light-exposure masks can be reduced and the number of corresponding photolithography steps can also be reduced, whereby the process can be simplified.

Note that plasma treatment is preferably performed with the use of a gas such as $N_2O$, $N_2$, or Ar after the above step. This plasma treatment removes water or the like attached on an exposed surface of the oxide semiconductor layer. Plasma treatment may be performed using a mixture gas of oxygen and argon.

Figure 13G:
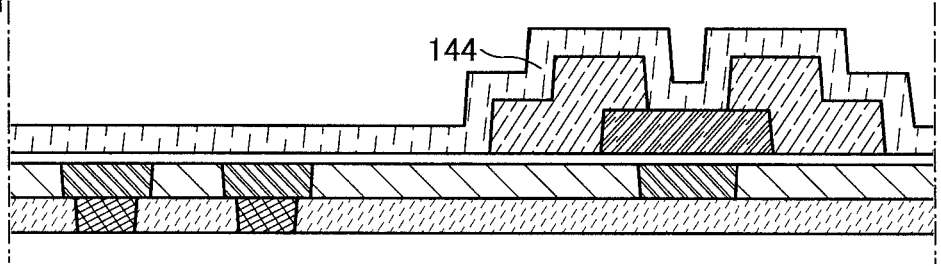

Next, the protective insulating layer 144 that is in contact with part of the oxide semiconductor layer 140 is formed without being exposed to the air (see FIG. 13G).

The protective insulating layer 144 can be formed by employing a method by which impurities such as water or hydrogen are prevented from entering the protective insulating layer 144, such as sputtering, as appropriate. The protective insulating layer 144 has a thickness of at least 1 nm. The protective insulating layer 144 can be formed using silicon oxide, silicon nitride, silicon oxynitride, silicon nitride oxide, or the like. The protective insulating layer 144 can have a single-layer structure or a stacked structure. The substrate temperature at the time of forming the protective insulating layer 144 is preferably room temperature or more and 300° C. or less. The atmosphere for forming the protective insulating layer 144 is preferably a rare gas (typically argon) atmosphere, an oxygen atmosphere, or a mixed atmosphere containing a rare gas (typically argon) and oxygen.

If hydrogen is contained in the protective insulating layer 144, hydrogen may enter the oxide semiconductor layer 140 or extract oxygen in the oxide semiconductor layer 140, whereby the resistance of the oxide semiconductor layer 140 on the backchannel side might be decreased and a parasitic channel might be formed. Therefore, it is important not to use hydrogen at the time of forming the protective insulating layer 144 so that the protective insulating layer 144 contains hydrogen as little as possible.

It is preferable to form the protective insulating layer 144 while removing moisture remaining in the treatment chamber, in order that hydrogen, a hydroxyl group, or moisture is not contained in the oxide semiconductor layer 140 and the protective insulating layer 144.

In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the deposition chamber that is evacuated with a cryopump, a hydrogen atom and a compound containing a hydrogen atom, such as water ($H_2O$), are removed, for example; thus, the concentration of impurities contained in the protective insulating layer 144 formed in the deposition chamber can be reduced.

A sputtering gas used for the deposition of the protective insulating layer 144 is preferably a high-purity gas in which the concentration of impurities such as hydrogen, water, a hydroxyl group, or a hydride is reduced to about several parts per million (ppm) (preferably about several parts per billion (ppb)).

Next, second heat treatment (at 200° C. to 400° C., for example, at 250° C. to 350° C.) is preferably performed in an inert gas atmosphere or an oxygen gas atmosphere. For example, the second heat treatment is performed at 250° C. for one hour in a nitrogen atmosphere. The second heat treatment can reduce variation in electric characteristics of the transistor.

Furthermore, heat treatment may be performed at 100° C. to 200° C. for 1 hour to 30 hours in the air. This heat treatment may be performed at a fixed heating temperature or follow temperature cycles in which the temperature repeatedly rises from room temperature to a heating temperature of 100° C. to 200° C. and drops from the heating temperature to room temperature. This heat treatment may be performed under reduced pressure before the protective insulating layer is formed. The heat treatment time can be shortened under reduced pressure. This heat treatment may be performed instead of the second heat treatment or may be performed before or after the second heat treatment, for example.

Figure 14A:
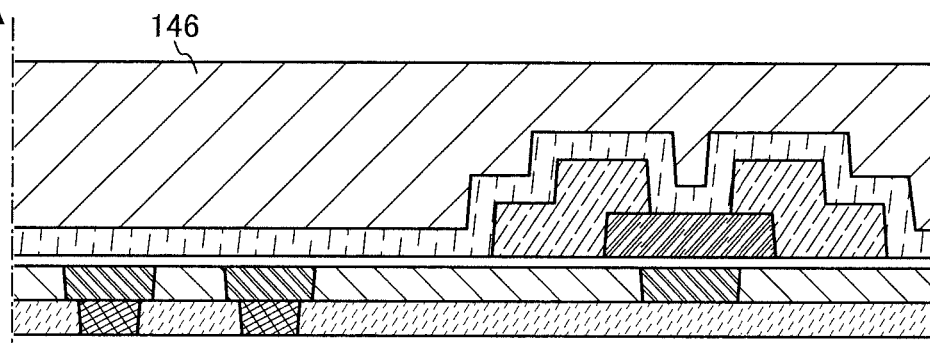
FIGS. 14A to 14D illustrate an example of specific steps for forming a transistor.
Figure 14B:
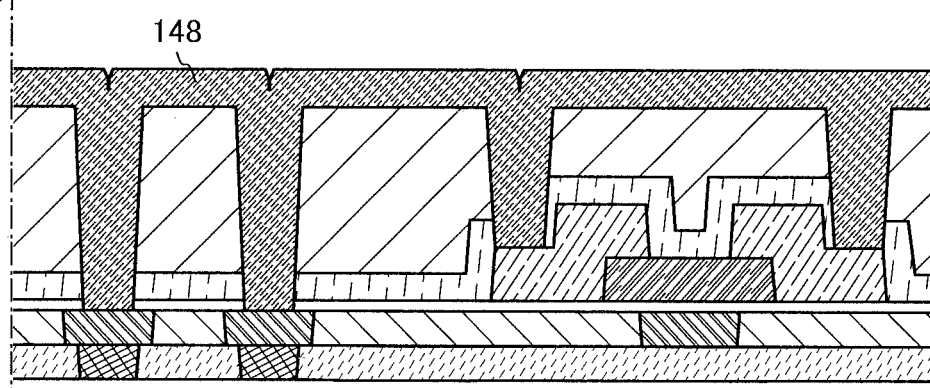

Then, the interlayer insulating layer 146 is formed over the protective insulating layer 144 (see FIG. 14A). The interlayer insulating layer 146 can be formed by PVD, CVD, or the like. The interlayer insulating layer 146 can be formed using an inorganic insulating material such as silicon oxide, silicon nitride oxide, silicon nitride, hafnium oxide, aluminum oxide, or tantalum oxide. After the formation of the interlayer insulating layer 146, a surface of the interlayer insulating layer 146 is preferably planarized with CMP, etching, or the like.

Next, openings that reach the electrode layers 136a and 136b, the source layer 142a, and the drain layer 142b are formed in the interlayer insulating layer 146, the protective insulating layer 144, and the gate insulating layer 138. Then, a conductive layer 148 is formed to be embedded in the openings (see FIG. 14B). The openings can be formed by etching using a mask or the like. The mask can be formed by light exposure using a photomask or the like. Either wet etching or dry etching may be used as the etching; dry etching is preferably used in terms of microfabrication. The conductive layer 148 can be formed by a film formation method such as PVD or CVD. The conductive layer 148 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings by PVD and a thin titanium nitride film is formed by CVD, and then, a tungsten film is formed to be embedded in the openings. Here, the titanium film formed by PVD has a function of deoxidizing an oxide film at an interface so as to reduce contact resistance with the lower electrodes (here, the electrode layers 136a and 136b, the source layer 142a, and the drain layer 142b). The titanium nitride film formed after the formation of the titanium film has a barrier function of preventing diffusion of the conductive material. A copper film may be formed by plating after the formation of the barrier film of titanium, titanium nitride, or the like.

Figure 14C:
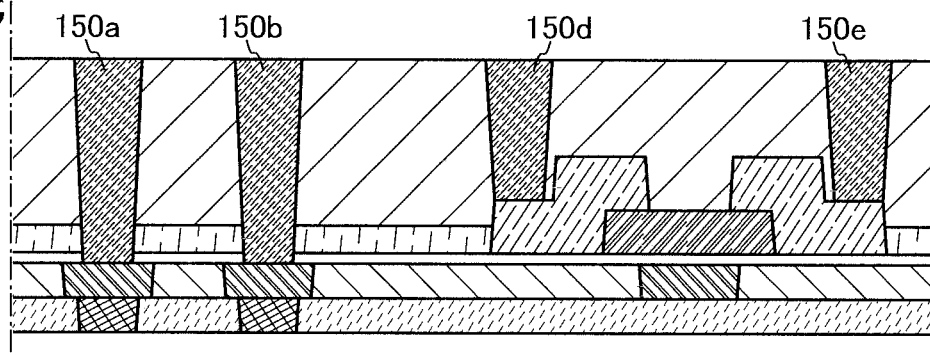
Figure 14D:
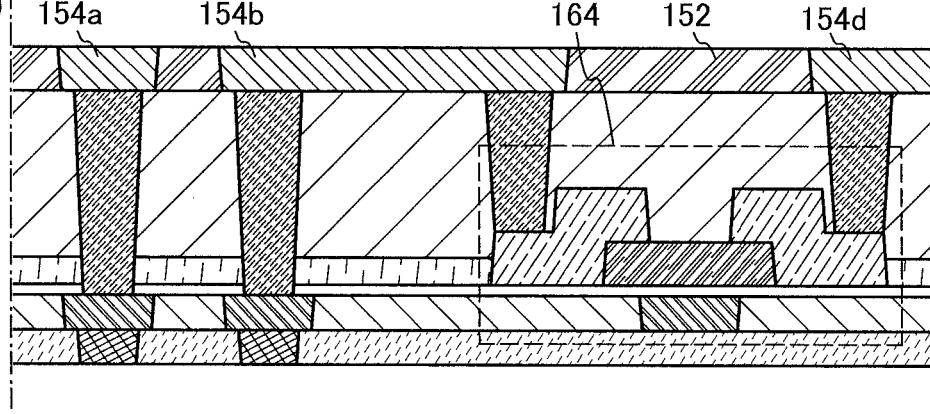

After the conductive layer 148 is formed, part of the conductive layer 148 is removed by etching, CMP, or the like, so that the interlayer insulating layer 146 is exposed and the electrode layers 150a, 150b, 150d, and 150e are formed (see FIG. 14C). Note that when the electrode layers 150a, 150b, 150d, and 150e are formed by removal of part of the conductive layer 148, the process is preferably performed so that the surfaces are planarized. The surfaces of the interlayer insulating layer 146 and the electrode layers 150a, 150b, 150d, and 150e are planarized in such a manner, whereby an electrode, a wiring, an insulating layer, a semiconductor layer, and the like can be favorably formed in later steps.

Then, the insulating layer 152 is formed, and openings reaching the electrode layers 150a, 150b, 150d, and 150e are formed in the insulating layer 152. Then, a conductive layer is formed so as to fill the openings. After that, part of the conductive layer is removed by etching, CMP, or the like, whereby the insulating layer 152 is exposed and the electrode layers 154a, 154b, and 154d are formed (see FIG. 14D). This step is similar to the step for forming the electrode layer 150a and the like; thus, the detailed description is omitted.

<Variations of Transistor>

FIG. 15, FIGS. 16A and 16B, FIGS. 17A and 17B, and FIGS. 18A and 18B each illustrate a variation of the transistor 164.

Figure 15:
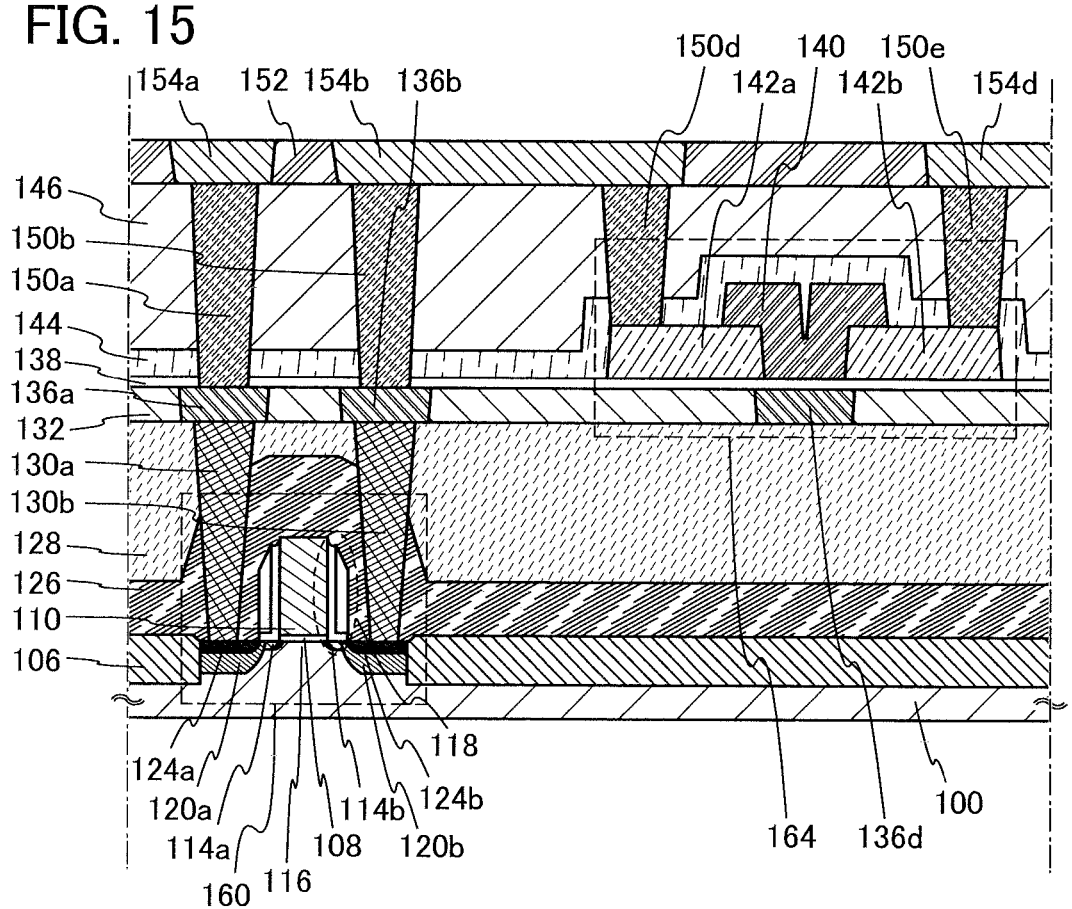
FIG. 15 illustrates a variation of a transistor.

FIG. 15 illustrates the transistor 164 in which the gate layer 136d is placed below the oxide semiconductor layer 140 and the source layer 142a and the drain layer 142b are in contact with a bottom surface of the oxide semiconductor layer 140.

A big difference between the structure in FIG. 15 and the structure in FIG. 11 is the position at which the oxide semiconductor layer 140 is connected to the source layer 142a and the drain layer 142b. That is, an upper surface of the oxide semiconductor layer 140 is in contact with the source layer 142a and the drain layer 142b in the structure in FIG. 11, whereas the bottom surface of the oxide semiconductor layer 140 is in contact with the source layer 142a and the drain layer 142b in the structure in FIG. 15. Further, the difference in the contact position results in a different arrangement of other electrodes, insulating layers, and the like. Note that the details of each component are the same as those of FIG. 11.

Specifically, the transistor 164 illustrated in FIG. 15 includes the gate layer 136d provided over the interlayer insulating layer 128, the gate insulating layer 138 provided over the gate layer 136d, the source layer 142a and the drain layer 142b provided over the gate insulating layer 138, and the oxide semiconductor layer 140 in contact with upper surfaces of the source layer 142a and the drain layer 142b. In addition, over the transistor 164, the protective insulating layer 144 is provided so as to cover the oxide semiconductor layer 140.

Figure 16A:
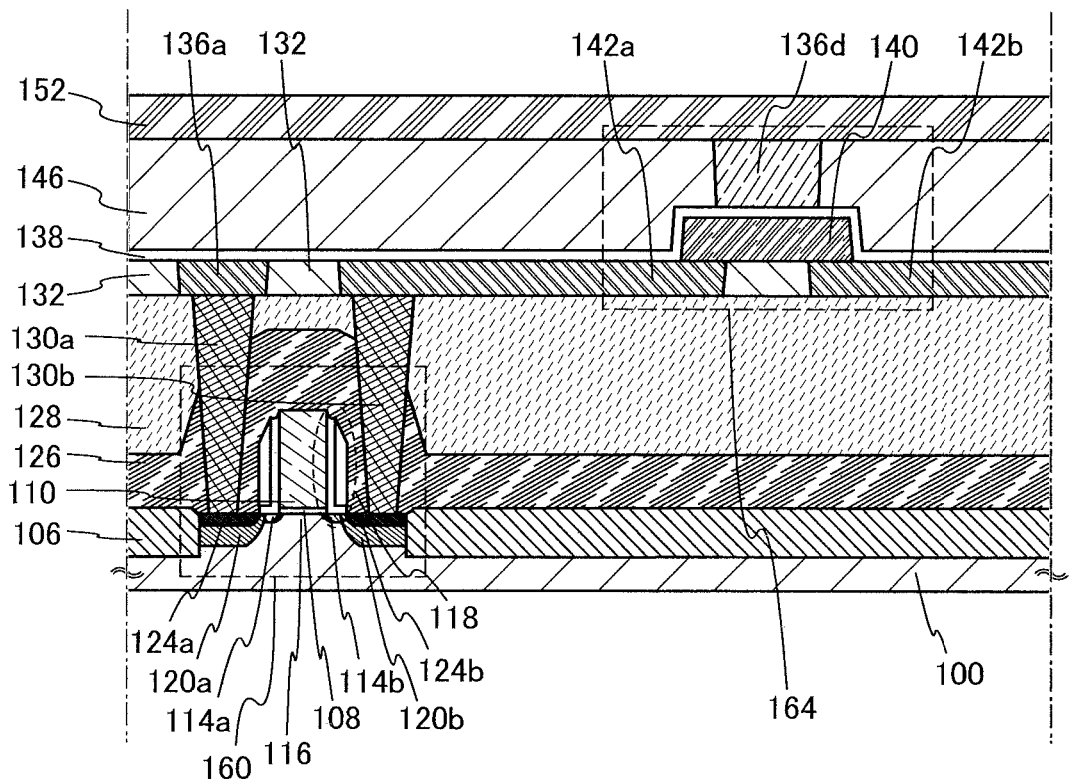
FIGS. 16A and 16B each illustrate a variation of a transistor.
Figure 16B:
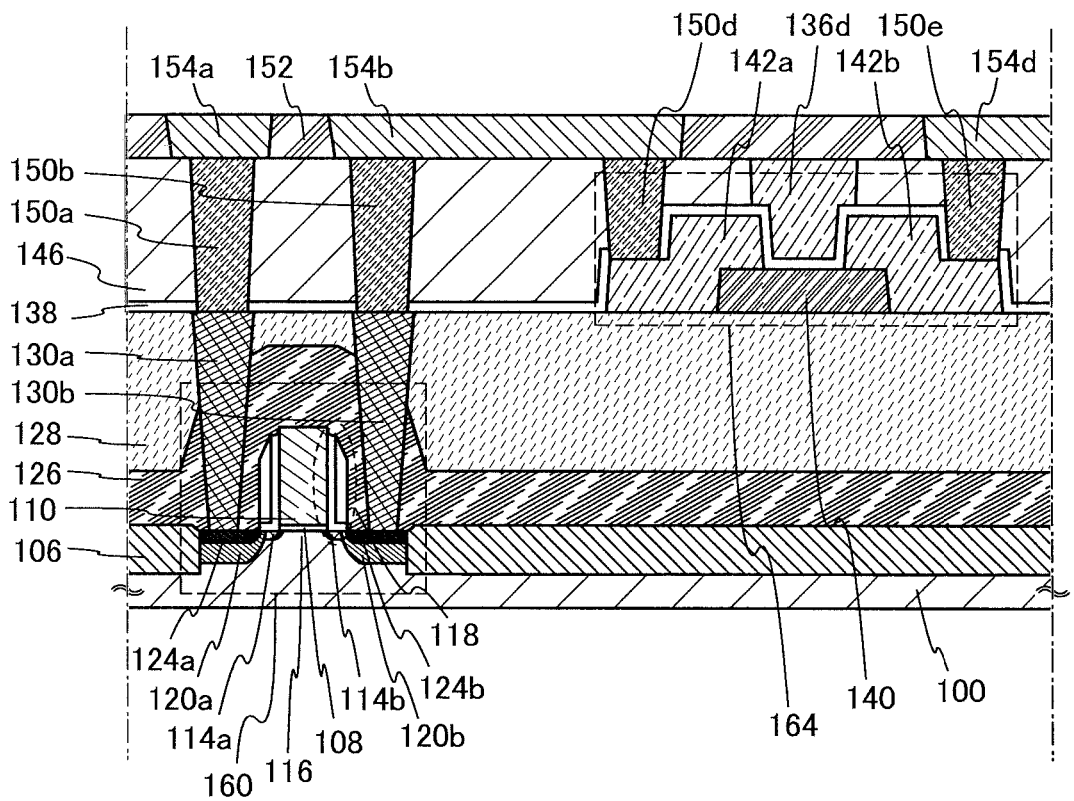

FIGS. 16A and 16B each illustrate the transistor 164 in which the gate layer 136d is provided over the oxide semiconductor layer 140. FIG. 16A illustrates an example of a structure in which the source layer 142a and the drain layer 142b are in contact with a bottom surface of the oxide semiconductor layer 140. FIG. 16B illustrates an example of a structure in which the source layer 142a and the drain layer 142b are in contact with an upper surface of the oxide semiconductor layer 140.

A big difference of the structures in FIGS. 16A and 16B from those in FIG. 11 and FIG. 15 is that the gate electrode layer 136d is placed over the oxide semiconductor layer 140. Furthermore, a big difference between the structure in FIG. 16A and the structure in FIG. 16B is that the source layer 142a and the drain layer 142b are in contact with either the bottom surface or the upper surface of the oxide semiconductor layer 140. These differences result in a different arrangement of other electrodes, insulating layers, and the like. The details of each component are the same as those of FIG. 11 and the like.

Specifically, the transistor 164 illustrated in FIG. 16A includes the source layer 142a and the drain layer 142b provided over the interlayer insulating layer 128, the oxide semiconductor layer 140 in contact with the upper surfaces of the source layer 142a and the drain layer 142b, the gate insulating layer 138 provided over the oxide semiconductor layer 140, and the gate layer 136d provided over the gate insulating layer 138 in a region overlapping with the oxide semiconductor layer 140.

The transistor 164 illustrated in FIG. 16B includes the oxide semiconductor layer 140 provided over the interlayer insulating layer 128; the source layer 142a and the drain layer 142b provided to be in contact with the upper surface of the oxide semiconductor layer 140; the gate insulating layer 138 provided over the oxide semiconductor layer 140, the source layer 142a, and the drain layer 142b; and the gate layer 136d provided over the gate insulating layer 138 in a region overlapping with the oxide semiconductor layer 140.

Note that in the structures in FIGS. 16A and 16B, a component (e.g., the electrode layer 150a or the electrode layer 154a) is sometimes omitted from the structure in FIG. 11 or the like. In that case, a secondary effect such as simplification of the fabrication process can be obtained. It is needless to say that a nonessential component can be omitted in the structure in FIG. 11 and the like.

Figure 17A:
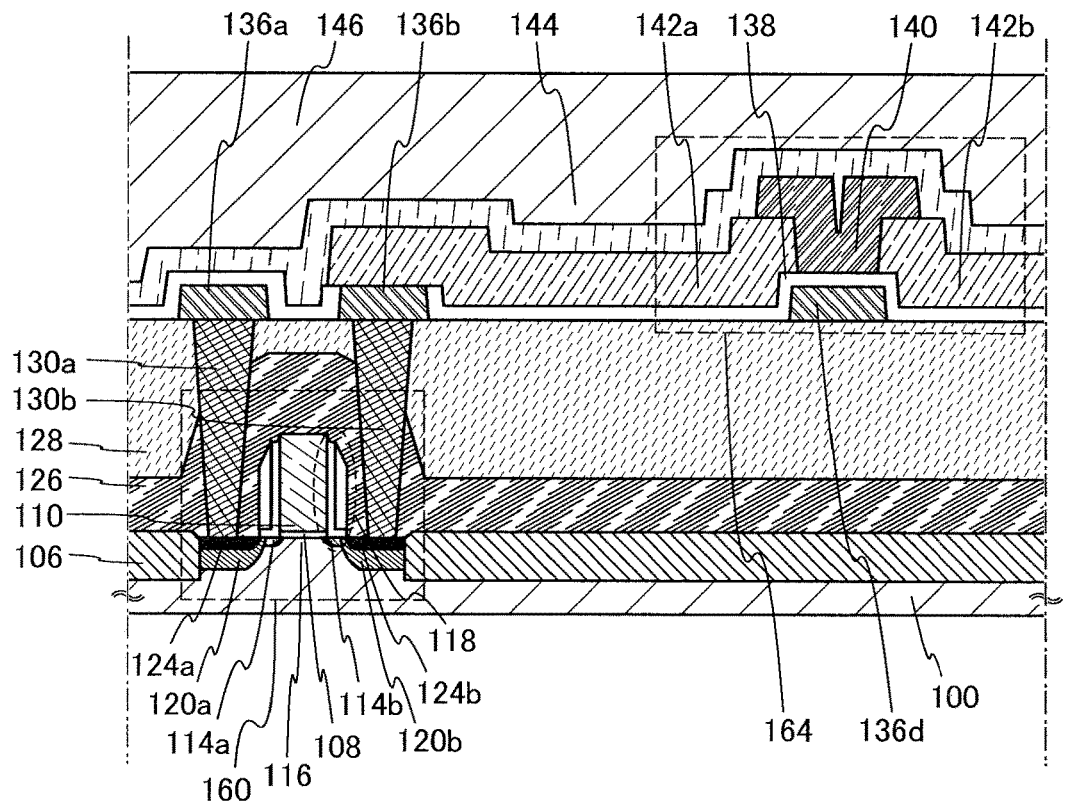
FIGS. 17A and 17B each illustrate a variation of a transistor.
Figure 17B:
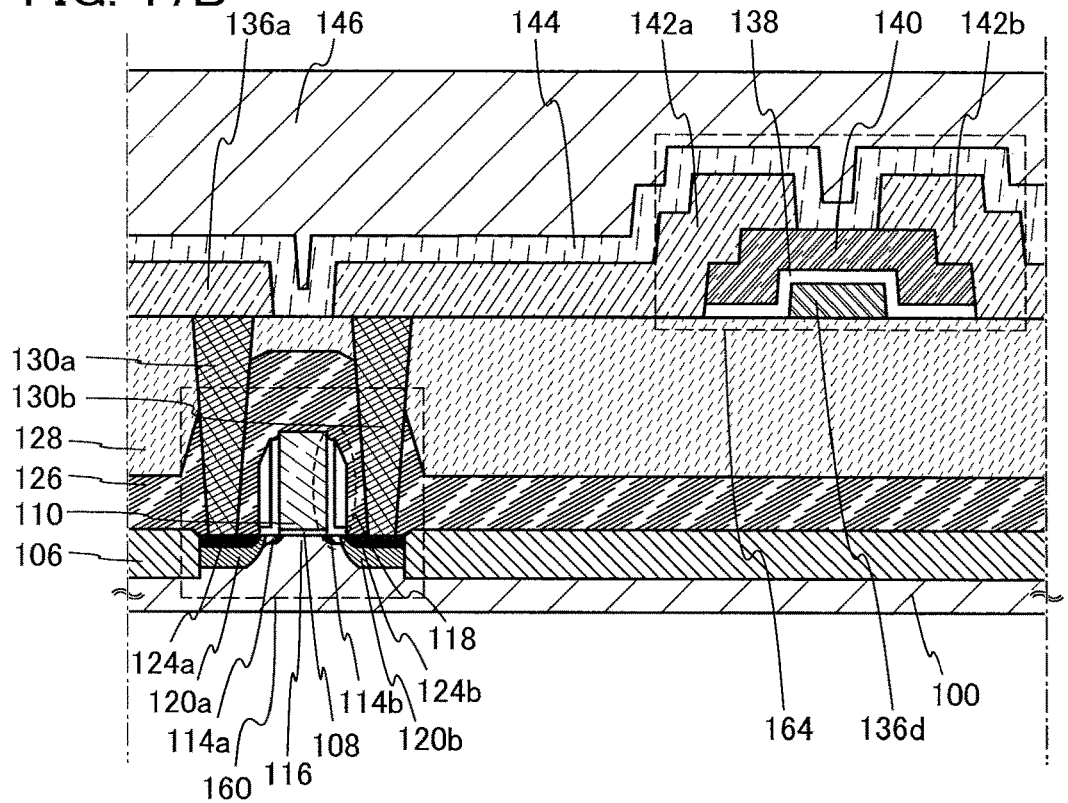

FIGS. 17A and 17B each illustrate the transistor 164 in the case where the size of the element is relatively large and the gate layer 136d is placed below the oxide semiconductor layer 140. In that case, a demand for the planarity of a surface and the coverage is relatively moderate, so that it is not necessary to form a wiring, an electrode, and the like to be embedded in an insulating layer. For example, the gate layer 136d and the like can be formed by patterning after formation of a conductive layer.

A big difference between the structure in FIG. 17A and the structure in FIG. 17B is that the source layer 142a and the drain layer 142b are in contact with either the bottom surface or the upper surface of the oxide semiconductor layer 140. Moreover, the difference results in a different arrangement of other electrodes, insulating layers, and the like. The details of each component are the same as those of FIG. 11 and the like.

Specifically, the transistor 164 illustrated in FIG. 17A includes the gate layer 136d provided over the interlayer insulating layer 128, the gate insulating layer 138 provided over the gate layer 136d, the source layer 142a and the drain layer 142b provided over the gate insulating layer 138, and the oxide semiconductor layer 140 that is in contact with the upper surfaces of the source layer 142a and the drain layer 142b.

The transistor 164 illustrated in FIG. 17B includes the gate layer 136d provided over the interlayer insulating layer 128, the gate insulating layer 138 provided over the gate layer 136d, the oxide semiconductor layer 140 provided over the gate insulating layer 138 in a region overlapping with the gate layer 136d, and the source layer 142a and the drain layer 142b that are in contact with the upper surface of the oxide semiconductor layer 140.

Note that also in the structures in FIGS. 17A and 17B, a component is sometimes omitted from the structure in FIG. 11 or the like. In that case, a secondary effect such as simplification of the fabrication process can be obtained.

Figure 18A:
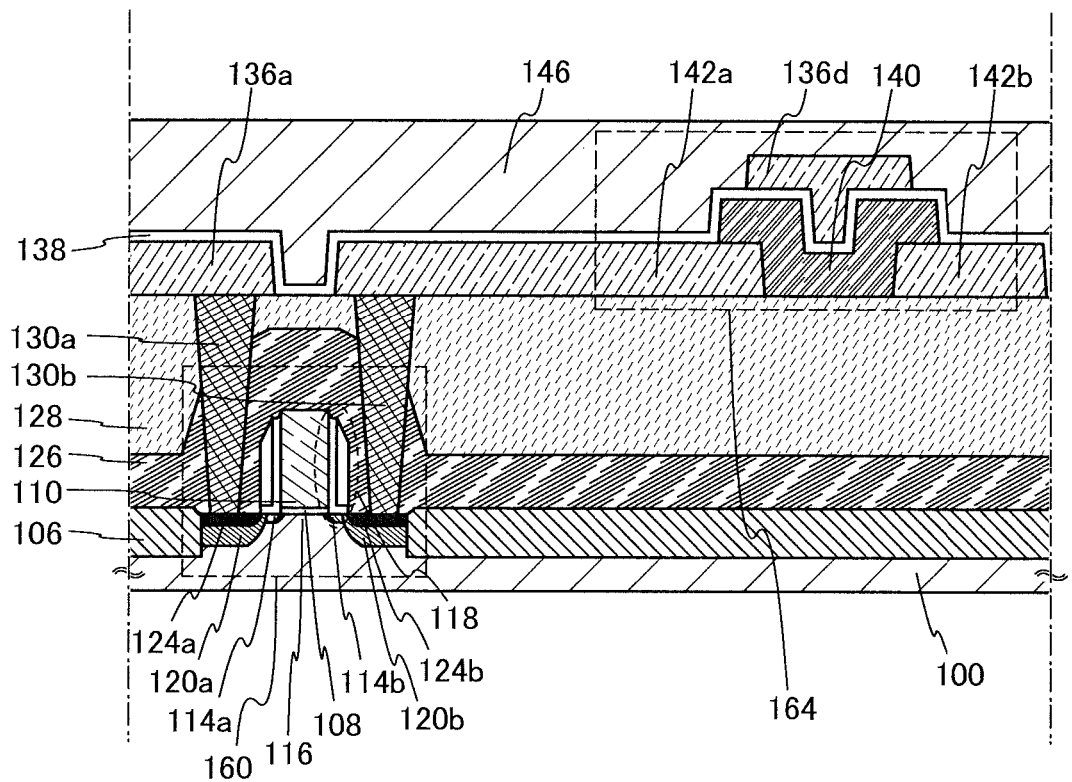
FIGS. 18A and 18B each illustrate a variation of a transistor.
Figure 18B:
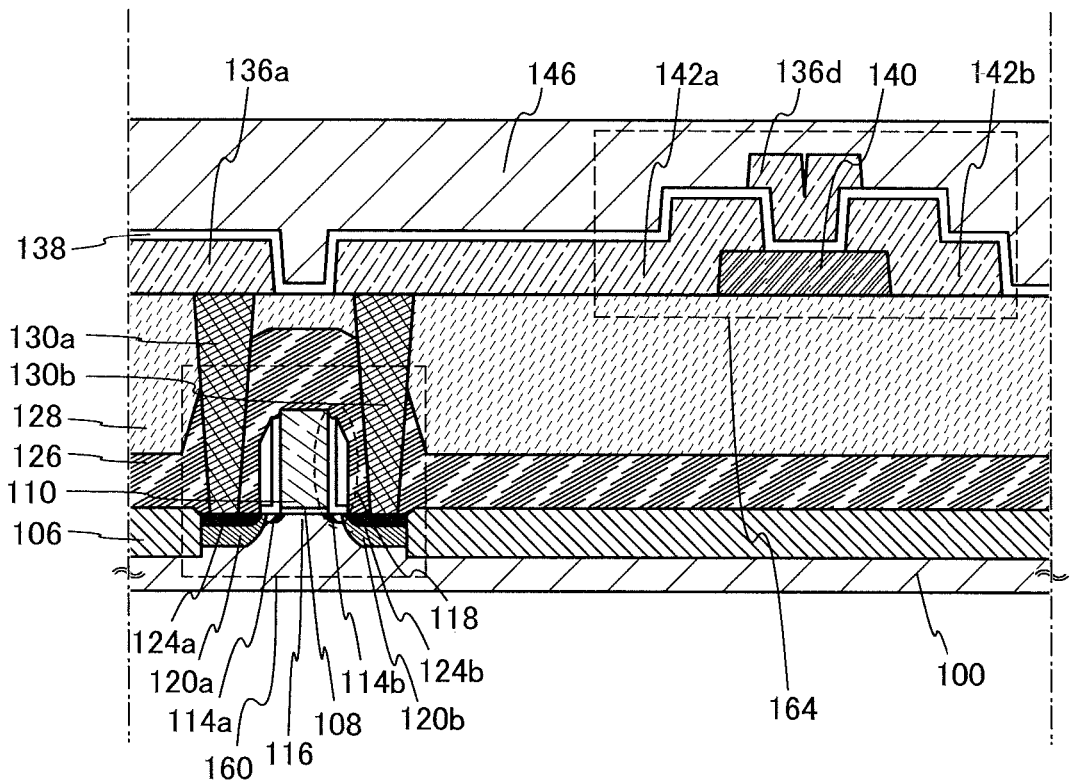

FIGS. 18A and 18B each illustrate the transistor 164 in the case where the size of the element is relatively large and the gate layer 136d is placed over the oxide semiconductor layer 140. Also in that case, a demand for the planarity of a surface and the coverage is relatively moderate, so that it is not necessary to form a wiring, an electrode, and the like to be embedded in an insulating layer. For example, the gate layer 136d and the like can be formed by patterning after formation of a conductive layer.

A big difference between the structure in FIG. 18A and the structure in FIG. 18B is that the source layer 142a and the drain layer 142b are in contact with either the bottom surface or the upper surface of the oxide semiconductor layer 140. The difference results in a different arrangement of other electrodes, insulating layers, and the like. The details of each component are the same as those of FIG. 11 and the like.

Specifically, the transistor 164 illustrated in FIG. 18A includes the source layer 142a and the drain layer 142b provided over the interlayer insulating layer 128; the oxide semiconductor layer 140 in contact with the upper surfaces of the source layer 142a and the drain layer 142b; the gate insulating layer 138 provided over the source layer 142a, the drain layer 142b, and the oxide semiconductor layer 140; and the gate layer 136d provided over the gate insulating layer 138 in a region overlapping with the oxide semiconductor layer 140.

The transistor 164 illustrated in FIG. 18B includes the oxide semiconductor layer 140 provided over the interlayer insulating layer 128; the source layer 142a and the drain layer 142b provided to be in contact with the upper surface of the oxide semiconductor layer 140; the gate insulating layer 138 provided over the source layer 142a, the drain layer 142b, and the oxide semiconductor layer 140; and the gate layer 136d provided over the gate insulating layer 138. Note that the gate layer 136d is provided in a region overlapping with the oxide semiconductor layer 140 with the gate insulating layer 138 placed therebetween.

Note that also in the structures in FIGS. 18A and 18B, a component is sometimes omitted from the structure in FIG. 11 or the like. Also in that case, a secondary effect such as simplification of the fabrication process can be obtained.

Figure 19:
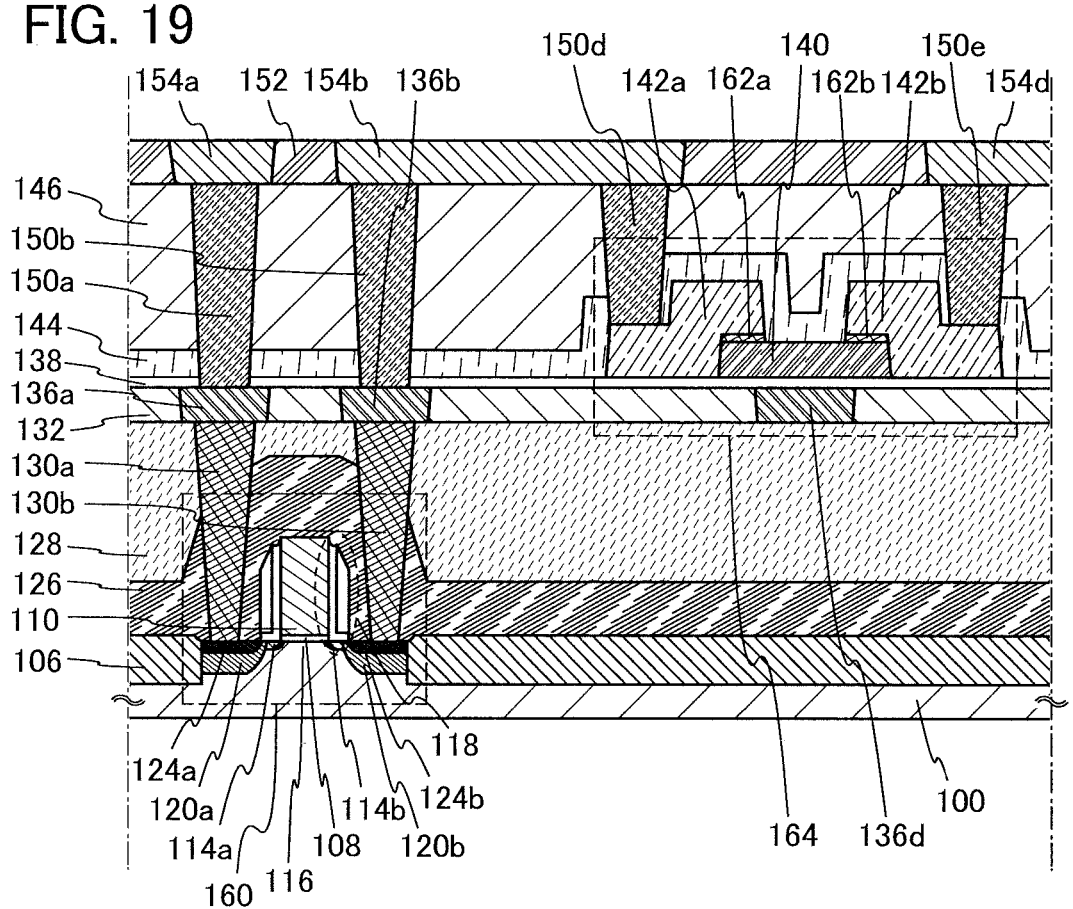
FIG. 19 illustrates a variation of a transistor.
Figure 20:
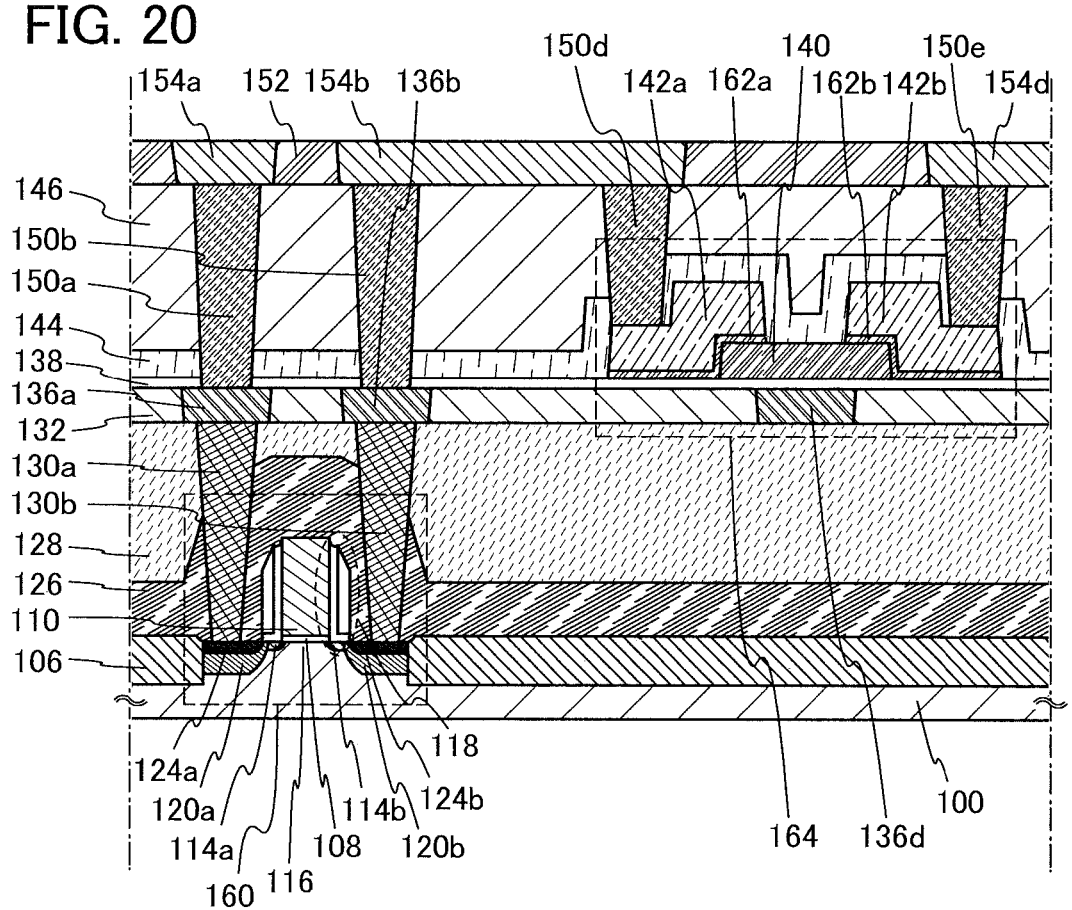
FIG. 20 illustrates a variation of a transistor.

Oxide conductive layers functioning as a source region and a drain region may be provided as buffer layers between the oxide semiconductor layer 140 and the source and drain layers 142a and 142b illustrated in FIG. 11. FIG. 19 and FIG. 20 each illustrate a transistor obtained by providing the oxide conductive layers in the transistor 164 in FIG. 11.

In the transistors 164 illustrated in FIG. 19 and FIG. 20, oxide conductive layers 162a and 162b functioning as a source region and a drain region are formed between the oxide semiconductor layer 140 and the source and drain layers 142a and 142b. A difference between the transistor 164 in FIG. 19 and that in FIG. 20 is that the shape of the oxide conductive layers 162a and 162b is different depending on the formation step.

In the transistor 164 in FIG. 19, a stack of an oxide semiconductor layer and an oxide conductive layer is formed and processed by one photolithography process, so that the island-shaped oxide semiconductor layer 140 and the island-shaped oxide conductive layer are formed. Then, the source layer 142a and the drain layer 142b are formed over the oxide semiconductor layer and the oxide conductive layer. After that, the island-shaped oxide conductive layer is etched using the source layer 142a and the drain layer 142b as masks, so that the oxide conductive layers 162a and 162b serving as a source region and a drain region are formed.

In the transistor 164 in FIG. 20, an oxide conductive layer is formed over the oxide semiconductor layer 140, and a metal conductive layer is formed thereover. Then, the oxide conductive layer and the metal conductive layer are processed by one photolithography process, so that the oxide conductive layers 162a and 162b serving as a source region and a drain region, the source layer 142a, and the drain layer 142b are formed.

For etching treatment for the processing the shape of the oxide conductive layer, the etching conditions (e.g., the kind and concentration of etching gas or etchant, and etching time) are adjusted as appropriate to prevent excessive etching of the oxide semiconductor layer.

As the method for forming the oxide conductive layers 162a and 162b, sputtering, vacuum evaporation (e.g., electron beam evaporation), arc discharge ion plating, or spray coating is used. As a material for the oxide conductive layers, zinc oxide, zinc aluminum oxide, zinc aluminum oxynitride, zinc gallium oxide, indium tin oxide, or the like can be used. In addition, the above materials may contain silicon oxide.

By providing the oxide conductive layers as the source region and the drain region between the oxide semiconductor layer 140 and the source and drain layers 142a and 142b, the resistance of the source region and the drain region can be decreased and the transistor 164 can be operated at high speed.

Further, such a structure can improve the withstand voltage of the transistor 164.

Note that FIG. 19 and FIG. 20 illustrate the structure in which the oxide conductive layers are provided between the oxide semiconductor layer 140 and the source and drain layers 142a and 142b in the transistor 164 illustrated in FIG. 11. Alternatively, the oxide conductive layers can be provided between the oxide semiconductor layer 140 and the source and drain layers 142a and 142b in the transistors 164 illustrated in FIG. 15, FIGS. 16A and 16B, FIGS. 17A and 17B, and FIGS. 18A and 18B.

Note that the example in which the transistor 164 is stacked over the transistor 160 is described here; however, the arrangement of the transistors 160 and 164 is not limited to this example. For example, the transistor 160 and the transistor 164 can be formed over one surface. Further, the transistor 160 and the transistor 164 may be provided to overlap with each other.

<Variation of Step for Forming Oxide Semiconductor Layer>

Figure 21A:
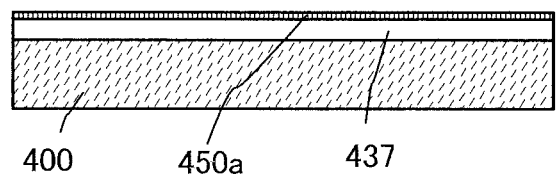
FIGS. 21A to 21C illustrate a variation of steps for forming an oxide semiconductor layer.
Figure 21B:
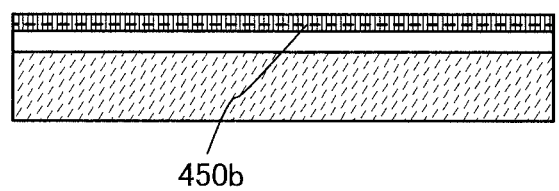

A step for forming an oxide semiconductor layer, which is different from that in the process for forming the above-described transistor, will be described with reference to FIGS. 21A to 21C.

The oxide semiconductor layer includes a first crystalline oxide semiconductor layer and a second crystalline oxide semiconductor layer that is placed over the first crystalline oxide semiconductor layer and is thicker than the first crystalline oxide semiconductor layer.

An insulating layer 437 is formed over an insulating layer 400. Here, as the insulating layer 437, an oxide insulating layer with a thickness of 50 nm to 600 nm is formed by PECVD or sputtering. For example, the oxide insulating layer can be one layer or a stack of layers selected from a silicon oxide layer, a gallium oxide layer, an aluminum oxide layer, a silicon oxynitride layer, an aluminum oxynitride layer, or a silicon nitride oxide layer.

Next, a first oxide semiconductor layer with a thickness of 1 nm to 10 nm is formed over the insulating layer 437. The first oxide semiconductor layer is formed by sputtering. The substrate temperature at the time when the first oxide semiconductor layer is deposited by sputtering is 200° C. to 400° C.

Here, a 5-nm-thick first oxide semiconductor layer is formed using a metal oxide target (an In—Ga—Zn—O-based metal oxide target with a composition ratio of $In_2O_3$: $Ga_2O_3$:ZnO=1:1:2 [molar ratio]) under the following conditions: the distance between the substrate and the target is 170 mm, the substrate temperature is 250° C., the pressure is 0.4 Pa, the direct-current (DC) power is 0.5 kW, and the atmosphere is oxygen (the flow rate ratio of oxygen is 100%), argon (the flow rate ratio of argon is 100%), or an atmosphere containing argon and oxygen.

Next, the atmosphere in the chamber in which the substrate is put is set to a nitrogen atmosphere or dry air, and first heat treatment is performed. The temperature of the first heat treatment ranges from 400° C. to 750° C. With the first heat treatment, a first crystalline oxide semiconductor layer 450a is formed (see FIG. 21A).

Although depending on the substrate temperature at the time of deposition or the temperature of the first heat treatment, the deposition or the first heat treatment causes crystallization from the film surface and crystals grow from the surface toward the inside, so that c-axis-oriented crystals can be obtained. With the first heat treatment, large amounts of zinc and oxygen gather at the film surface, one or a plurality of layers of a graphene-like two-dimensional crystal that is made of zinc and oxygen and has a hexagonal lattice on the top plane is formed on the uppermost surface, and the two-dimensional crystal grows in the thickness direction and overlaps one another to form a stack. When the temperature of the heat treatment is raised, crystal growth progresses from the surface to the inside and from the inside to the bottom.

With the first heat treatment, oxygen in the insulating layer 437, which is an oxide insulating layer, is diffused into the interface between the first crystalline oxide semiconductor layer 450a and the insulating layer 437 or the vicinity of the interface (within the range of ±5 nm from the interface) to reduce oxygen vacancies in the first crystalline oxide semiconductor layer 450a. Therefore, in the insulating layer 437 used as a base insulating layer, oxygen that is larger in proportion than the stoichiometric proportion preferably exists at least one of in the layer (in the bulk) and at the interface between the first crystalline oxide semiconductor layer 450a and the insulating layer 437.

Next, a second oxide semiconductor layer that is thicker than 10 nm is formed over the first crystalline oxide semiconductor layer 450a. The second oxide semiconductor layer is formed by sputtering at the substrate temperature of 200° C. to 400° C., in which case precursors are aligned in the second oxide semiconductor layer deposited to be on and in contact with a surface of the first crystalline oxide semiconductor layer, and the second oxide semiconductor layer can thus have a crystalline order.

Here, a 25-nm-thick second oxide semiconductor layer is formed using a metal oxide target (an In—Ga—Zn—O-based metal oxide target with a composition ratio of $In_2O_3$: $Ga_2O_3$:ZnO=1:1:2 [molar ratio]) under the following conditions: the distance between the substrate and the target is 170 mm, the substrate temperature is 400° C., the pressure is 0.4 Pa, the direct-current (DC) power is 0.5 kW, and the atmosphere is oxygen (the flow rate ratio of oxygen is 100%), argon (the flow rate ratio of argon is 100%), or an atmosphere containing argon and oxygen.

Next, the atmosphere in the chamber in which the substrate is put is set to a nitrogen atmosphere or dry air, and second heat treatment is performed. The temperature of the second heat treatment ranges from 400° C. to 750° C. With the second heat treatment, a second crystalline oxide semiconductor layer 450b is formed (see FIG. 21B). The second heat treatment is performed in a nitrogen atmosphere, an oxygen atmosphere, or a mixed atmosphere of nitrogen and oxygen to increase the density of the second crystalline oxide semiconductor layer and reduce defects. With the second heat treatment, crystal growth progresses in the thickness direction, that is, from the bottom to the inside, with the first crystalline oxide semiconductor layer 450a as a nucleus; thus, the second crystalline oxide semiconductor layer 450b is formed.

It is preferable to perform the steps from the formation of the insulating layer 437 to the second heat treatment successively without exposure to the air. The steps from the formation of the insulating layer 437 to the second heat treatment are preferably performed in an atmosphere that hardly contains hydrogen and moisture (e.g., an inert atmosphere, a reduced pressure atmosphere, or a dry air atmosphere). For example, a dry nitrogen atmosphere with a dew point of −40° C. or lower, preferably −50° C. or lower is used.

Figure 21C:
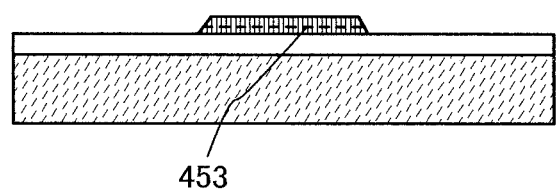

Next, the oxide semiconductor stack including the first crystalline oxide semiconductor layer 450a and the second crystalline oxide semiconductor layer 450b is processed so that an oxide semiconductor layer 453 made of the island-shaped oxide semiconductor stack is formed (see FIG. 21C). In FIGS. 21B and 21C, the interface between the first crystalline oxide semiconductor layer 450a and the second crystalline oxide semiconductor layer 450b is shown by doted lines to indicate the oxide semiconductor stack; a clear interface does not exist and FIGS. 21B and 21C show the interface for easy understanding.

The oxide semiconductor stack can be processed by etching after a mask with a desired shape is formed over the oxide semiconductor stack. The mask may be formed by photolithography, ink-jet printing, or the like.

For the etching of the oxide semiconductor stack, either wet etching or dry etching can be employed. Needless to say, both of them may be employed in combination.

One of features of the first and second crystalline oxide semiconductor layers obtained by the above formation method is that c-axes of crystals therein are oriented. Note that the first crystalline oxide semiconductor layer and the second crystalline oxide semiconductor layer comprise an oxide including a crystal with c-axis alignment (also referred to as C-Axis Aligned Crystal (CAAC)), which has neither a single crystal structure nor an amorphous structure. Parts of the first and second crystalline oxide semiconductor layers include crystal grains.

The first and second crystalline oxide semiconductor layers are formed using an oxide semiconductor material containing at least Zn, for example, an oxide of four metal elements, such as an In—Al—Ga—Zn—O-based material, an In—Al—Ga—Zn—O-based material, or an In—Sn—Ga—Zn—O-based material; an oxide of three metal elements, such as an In—Ga—Zn—O-based material, an In—Al—Zn—O-based material, an In—Sn—Zn—O-based material, a Sn—Ga—Zn—O-based material, an Al—Ga—Zn—O-based material, or a Sn—Al—Zn—O-based material; an oxide of two metal elements, such as an In—Zn—O-based material, a Sn—Zn—O-based material, an Al—Zn—O-based material, or a Zn—Mg—O-based material; or a Zn—O-based material. In addition, the above materials may contain $SiO_2$. For example, an In—Ga—Zn—O-based material means an oxide containing indium (In), gallium (Ga), and zinc (Zn). There is no particular limitation on the composition ratio. The In—Ga—Zn—O-based material may contain an element other than In, Ga, and Zn. An In—Si—Ga—Zn—O-based material, an In—Ga—B—Zn—O-based material, and an In—B—Zn—O-based material may be used.

Without limitation to the two-layer structure in which the second crystalline oxide semiconductor layer is formed over the first crystalline oxide semiconductor layer, it is possible to employ a stacked structure including three or more layers, by conducting or repeating the steps of deposition and heat treatment for forming a third crystalline oxide semiconductor layer after the formation of the second crystalline oxide semiconductor layer.

A highly reliable transistor with stable electrical characteristics can be realized because the transistor includes a stack of a first crystalline oxide semiconductor layer and a second crystalline oxide semiconductor layer like the oxide semiconductor layer 453.

<CPU>

A specific example of a CPU including the semiconductor integrated circuit will be described with reference to FIG. 22.

Figure 22:
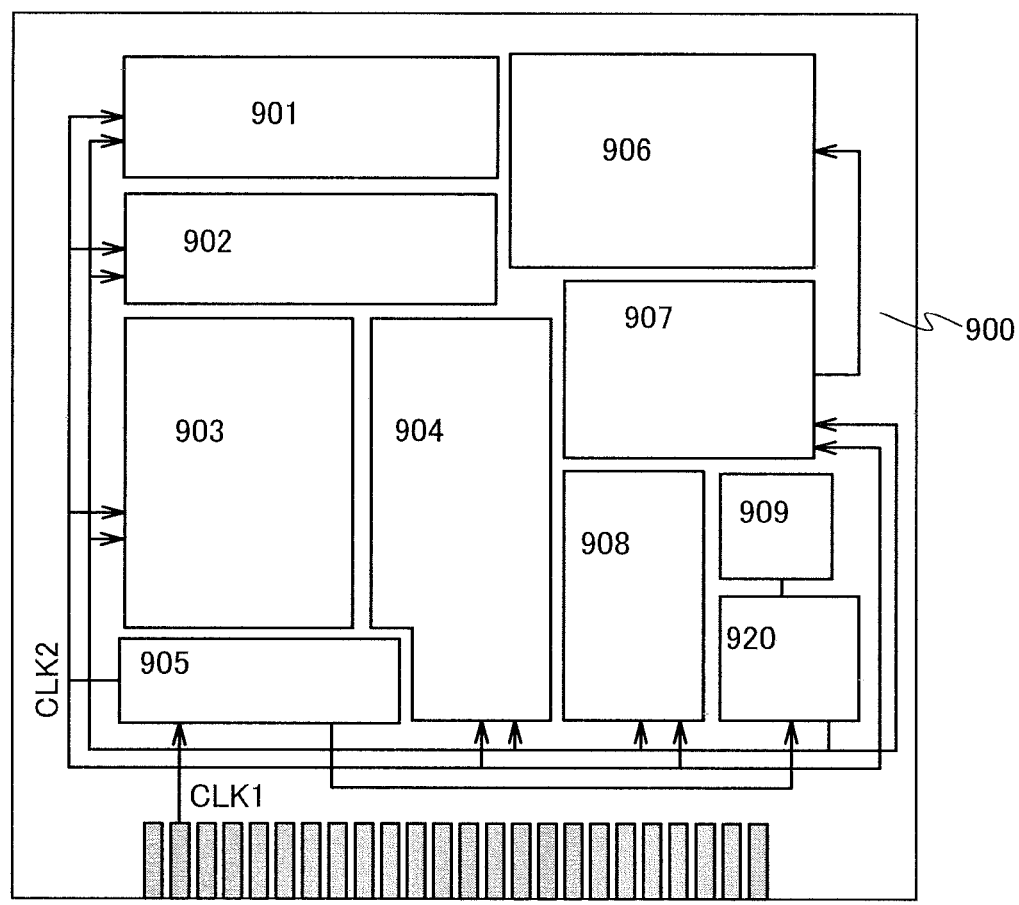
FIG. 22 illustrates a specific example of a CPU.

FIG. 22 is a block diagram illustrating a specific structure of a CPU. The CPU illustrated in FIG. 22 mainly includes, over a substrate 900, an arithmetic logic unit (ALU) 901, an ALU controller 902, an instruction decoder 903, an interrupt controller 904, a timing controller 905, a register 906, a register controller 907, a bus interface (bus I/F) 908, a rewritable ROM 909, and a ROM interface (ROM I/F) 920. The ROM 909 and the ROM I/F 920 may be provided over another chip. It is needless to say that the CPU in FIG. 22 is just an example of the simplified structure, and an actual CPU has various structures depending on applications.

An instruction that is input to the CPU through the bus I/F 908 is input to the instruction decoder 903 and decoded therein, and then, input to the ALU controller 902, the interrupt controller 904, the register controller 907, and the timing controller 905.

The ALU controller 902, the interrupt controller 904, the register controller 907, and the timing controller 905 conduct various controls in accordance with the decoded instruction. Specifically, the ALU controller 902 generates signals for controlling the operation of the ALU 901. While the CPU is executing a program, the interrupt controller 904 judges an interrupt request from an external input/output device or a peripheral circuit on the basis of its priority or a mask state, and processes the request. The register controller 907 generates an address of the register 906, and reads/writes data from/to the register 906 in accordance with the state of the CPU.

The timing controller 905 generates signals for controlling operation timings of the ALU 901, the ALU controller 902, the instruction decoder 903, the interrupt controller 904, and the register controller 907. For example, the timing controller 905 includes an internal clock generator for generating an internal clock signal CLK2 based on a reference clock signal CLK1, and supplies the clock signal CLK2 to the above circuits.

In the CPU illustrated in FIG. 22, the register 906 includes the storage circuit 11 illustrated in FIGS. 1A to 1C. The register controller 907 includes the power-gating control circuit 12 illustrated in FIGS. 1A and 1B. In the CPU in FIG. 22, the register controller 907 selects a retention operation in the register 906 in accordance with an instruction from the ALU 901. That is, the register controller 907 selects whether data is held by the sequential circuits 21_1 to 21_n or held in the node electrically connected to one electrode of the capacitor 32 in the storage circuit 11 included in the register 906. When data retention by the sequential circuits 21_1 to 21_n is selected, power supply voltage is supplied to the storage circuit 11 in the register 906. On the other hand, when data retention in the node electrically connected to one electrode of the capacitor 32 is selected, supply of power supply voltage to the storage circuit 11 in the register 906 can be stopped.

In such a manner, data can be retained even when the operation of the CPU is temporally stopped and the supply of power supply voltage is stopped; therefore, power consumption can be reduced. Specifically, the operation of the CPU can be stopped while a user of a personal computer does not input data to an input device such as a keyboard for a while, for example. Thus, power consumption can be reduced.

Although the CPU is given as an example, the semiconductor integrated circuit of the present invention is not limited to be applied to CPUs and can also be applied to LSIs such as DSPs, custom LSIs, and field programmable gate arrays (FPGAs).

Example 1

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility that is based on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility $\mu$ can be expressed as the following formula.

$$\mu = \mu_0 \exp\left(-\frac{E}{kT}\right) \quad \text{[Formula 5]}$$

Here, E represents the height of the potential barrier, k represents the Boltzmann constant, and T represents the absolute temperature. When the potential barrier is assumed to be attributed to a defect, the height E of the potential barrier is expressed as the following formula according to the Levinson model.

$$E = \frac{e^2 N^2}{8\varepsilon\, n} = \frac{e^3 N^2 t}{8\varepsilon\, C_{ox} V_g} \quad \text{[Formula 6]}$$

Here, e represents the elementary charge, N represents the average defect density per unit area in a channel, s represents the permittivity of the semiconductor, n represents the number of carriers per unit area in the channel, $C_{ox}$ represents the capacitance per unit area, $V_g$ represents the gate voltage, and t represents the thickness of the channel. Note that in the case where the thickness of the semiconductor layer is less than or equal to 30 nm, the thickness of the channel may be regarded as being the same as the thickness of the semiconductor layer. The drain current $I_d$ in a linear region is expressed as the following formula.

$$I_d = \frac{W \mu V_g V_d C_{ox}}{L} \exp\left(-\frac{E}{kT}\right) \quad \text{[Formula 7]}$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon\, C_{ox} V_g} \quad \text{[Formula 8]}$$

The right side of Formula 8 is a function of $V_g$. From the formula, it is found that the defect density N can be obtained from the slope of a line in a graph that is obtained by plotting actual measured values with $\ln(I_d/V_g)$ as the ordinate and $1/V_g$ as the abscissa. That is, the defect density can be evaluated from the $I_d$–$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, to can be calculated to be 120 cm²/Vs from Formula 5 and Formula 6. The measured mobility of an In—Sn—Zn oxide including a defect is approximately 40 cm²/Vs. However, assuming that no defect exists inside an oxide semiconductor and at the interface between the oxide semiconductor and an insulating film, the mobility to of the oxide semiconductor is expected to be 120 cm²/Vs.

Note that even when no defect exists inside a semiconductor, scattering at an interface between a channel and a gate insulating layer adversely affects the transport properties of the transistor. In other words, the mobility $\mu_1$ at a position that is distance x away from the interface between the channel and the gate insulating layer can be expressed as the following formula.

$$\frac{1}{\mu_1} = \frac{1}{\mu_0} + \frac{D}{B}\exp\left(-\frac{x}{l}\right) \quad \text{[Formula 9]}$$

Here, D represents the electric field in the gate direction, and B and l are constants. B and l can be obtained from actual measurement results; according to the above measurement results, B is $4.75 \times 10^7$ cm/s and l is 10 nm (the depth to which the influence of interface scattering reaches). When D is increased (i.e., when the gate voltage is increased), the second term of Formula 9 is increased and accordingly the mobility $\mu_1$ is decreased.

Figure 26:
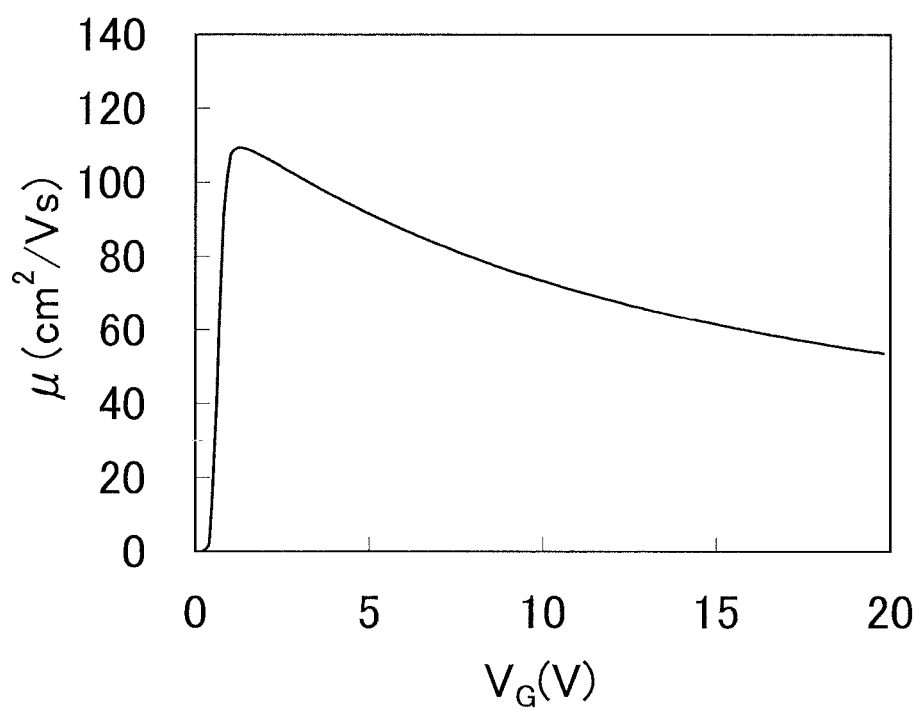
FIG. 26 shows gate voltage dependence of mobility obtained by calculation.

FIG. 26 shows calculation results of the mobility $\mu_2$ of a transistor whose channel is formed using an ideal oxide semiconductor without a defect inside the semiconductor. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by sputtering.

Further, the work functions of a gate layer, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 26, the mobility has a peak of more than 100 cm$^2$/Vs at a gate voltage $V_G$ that is a little over 1 V, and is decreased as the gate voltage becomes higher because the influence of interface scattering is increased. Note that in order to reduce interface scattering, it is preferable that a surface of the semiconductor layer be flat at the atomic level (atomic layer flatness).

Calculation results of characteristics of minute transistors formed using an oxide semiconductor having such a mobility are shown in FIGS. 27A to 27C, FIGS. 28A to 28C, and FIGS. 29A to 29C. FIGS. 30A and 30B illustrate cross-sectional structures of the transistors used for the calculation. The transistors illustrated in FIGS. 30A and 30B each include a semiconductor region 503a and a semiconductor region 503c that have n$^+$-type conductivity in an oxide semiconductor layer. The resistivity of the semiconductor regions 503a and 503c is 2×10$^{-3}$ Ωcm.

The transistor in FIG. 30A is formed over a base insulating layer 501 and an embedded insulator 502 that is embedded in the base insulating layer 501 and formed of aluminum oxide. The transistor includes the semiconductor region 503a, the semiconductor region 503c, an intrinsic semiconductor region 503b that is placed between the semiconductor regions 503a and 503c and serves as a channel formation region, and a gate layer 505. The width of the gate layer 505 is 33 nm.

A gate insulating layer 504 is formed between the gate layer 505 and the semiconductor region 503b. A sidewall insulator 506a and a sidewall insulator 506b are formed on both side surfaces of the gate layer 505, and an insulator 507 is formed over the gate layer 505 so as to prevent a short circuit between the gate layer 505 and another wiring. The sidewall insulator has a width of 5 nm. A source layer 508a and a drain layer 508b are provided in contact with the semiconductor region 503a and the semiconductor region 503c, respectively. Note that the channel width of this transistor is 40 nm.

The transistor in FIG. 30B is the same as the transistor in FIG. 30A in that it is formed over the base insulating layer 501 and the embedded insulator 502 formed of aluminum oxide and that it includes the semiconductor region 503a, the semiconductor region 503c, the intrinsic semiconductor region 503b provided therebetween, the gate layer 505 having a width of 33 nm, the gate insulating layer 504, the sidewall insulator 506a, the sidewall insulator 506b, the insulator 507, the source layer 508a, and the drain layer 508b.

The difference between the transistor in FIG. 30A and the transistor in FIG. 30B is the conductivity type of semiconductor regions under the sidewall insulators 506a and 506b. In the transistor in FIG. 30A, the semiconductor regions under the sidewall insulator 506a and the sidewall insulator 506b are part of the semiconductor region 503a having n$^+$-type conductivity and part of the semiconductor region 503c having n$^+$-type conductivity, whereas in the transistor in FIG. 30B, the semiconductor regions under the sidewall insulator 506a and the sidewall insulator 506b are part of the intrinsic semiconductor region 503b. In other words, in the semiconductor layer of FIG. 30B, a region having a width of $L_{off}$ which overlaps with neither the semiconductor region 503a (the semiconductor region 503c) nor the gate layer 505 is provided. This region is called an offset region, and the width $L_{off}$ is called an offset length. As is seen from the drawing, the offset length is equal to the width of the sidewall insulator 506a (the sidewall insulator 506b).

Figure 27A:
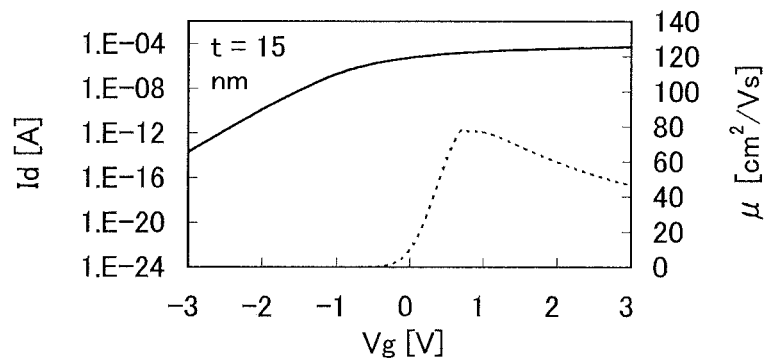
FIGS. 27A to 27C each show gate voltage dependence of drain current and mobility, obtained by calculation.
Figure 27B:
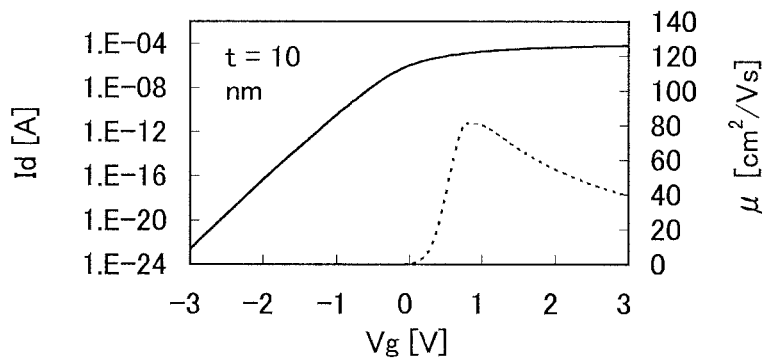
Figure 27C:
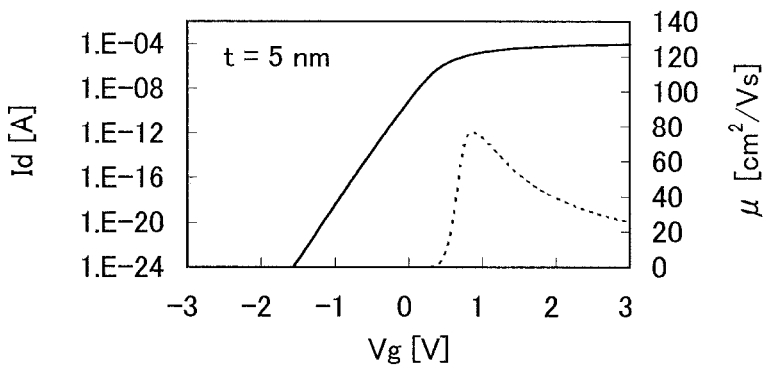

The other parameters used in calculation are as described above. For the calculation, device simulation software Sentaurus Device manufactured by Synopsys, Inc. was used. FIGS. 27A to 27C show the gate voltage ($V_g$: a potential difference between the gate and the source) dependence of the drain current ($I_d$, a solid line) and the mobility (μ, a dotted line) of the transistor having the structure illustrated in FIG. 30A. The drain current $I_d$ is obtained by calculation under the assumption that the drain voltage (a potential difference between the drain and the source) is +1 V, and the mobility μ is obtained by calculation under the assumption that the drain voltage is +0.1 V.

FIG. 27A shows the gate voltage dependence of the transistor in the case where the thickness of the gate insulating layer is 15 nm, FIG. 27B shows that of the transistor in the case where the thickness of the gate insulating layer is 10 nm, and FIG. 27C shows that of the transistor in the case where the thickness of the gate insulating layer is 5 nm. As the gate insulating layer is thinner, the drain current $I_d$ in an off state (the off-state current) in particular is significantly decreased. In contrast, there is no noticeable change in the peak value of the mobility μ and the drain current $I_d$ in an on state (the on-state current). The graphs show that the drain current exceeds 10 μA at a gate voltage of around 1 V.

Figure 28A:
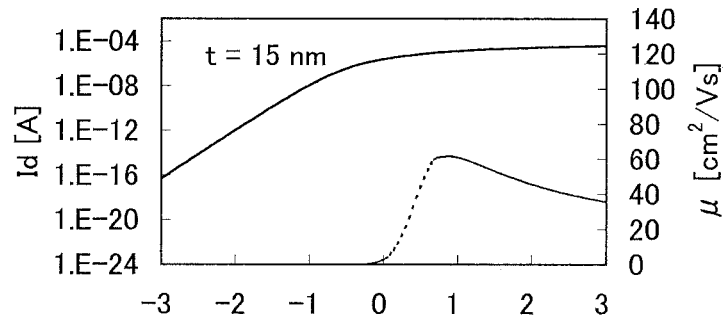
FIGS. 28A to 28C each show gate voltage dependence of drain current and mobility, obtained by calculation.
Figure 28B:
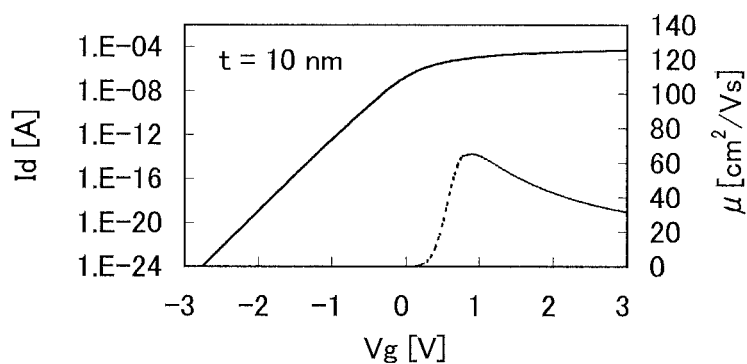
Figure 28C:
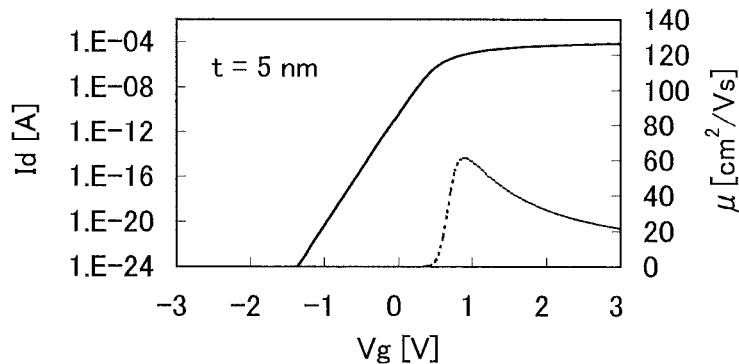

FIGS. 28A to 28C show the gate voltage $V_g$ dependence of the drain current $I_d$ (a solid line) and the mobility μ (a dotted line) of the transistor having the structure in FIG. 30B and an offset length $L_{off}$ of 5 nm. The drain current $I_d$ is obtained by calculation under the assumption that the drain voltage is +1 V and the mobility μ is obtained by calculation under the assumption that the drain voltage is +0.1 V. FIG. 28A shows the gate voltage dependence of the transistor in the case where the thickness of the gate insulating layer is 15 nm, FIG. 28B shows that of the transistor in the case where the thickness of the gate insulating layer is 10 nm, and FIG. 28C shows that of the transistor in the case where the thickness of the gate insulating layer is 5 nm.

Figure 29A:
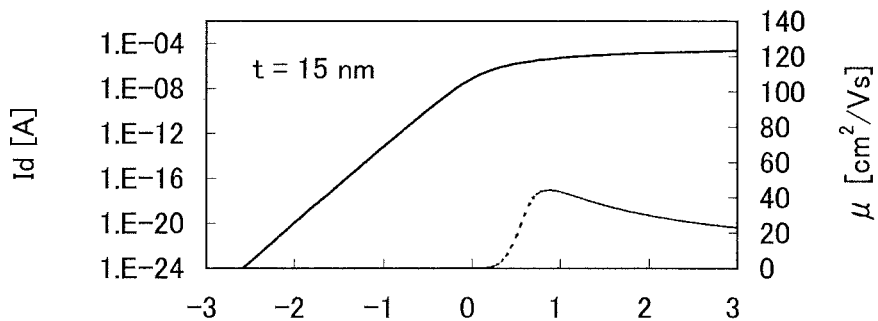
FIGS. 29A to 29C each show gate voltage dependence of drain current and mobility, obtained by calculation.
Figure 29B:
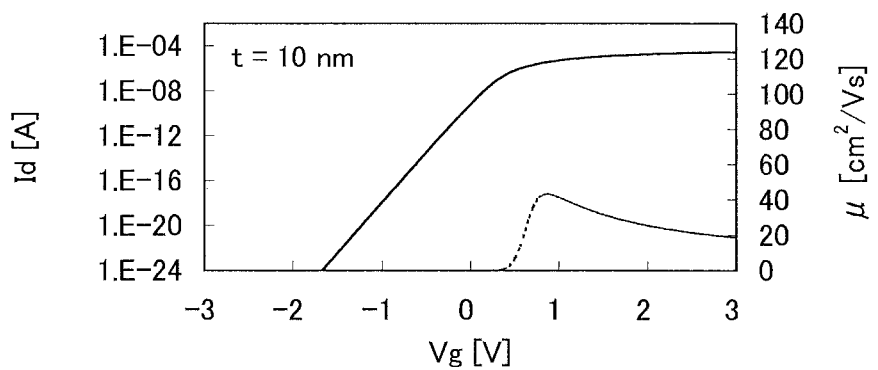
Figure 29C:
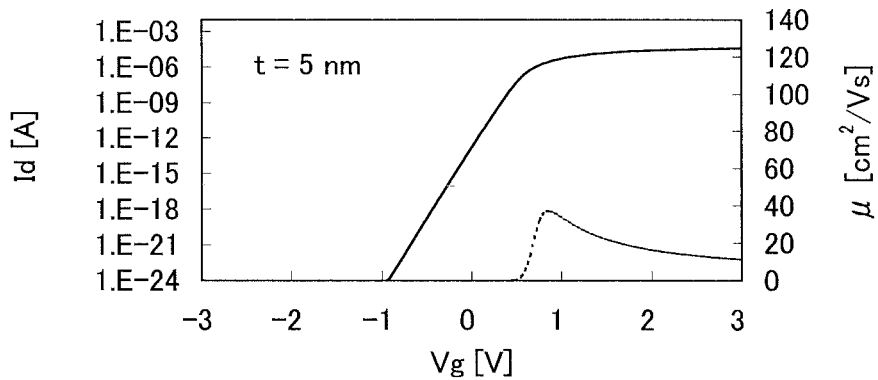
Figure 30A:
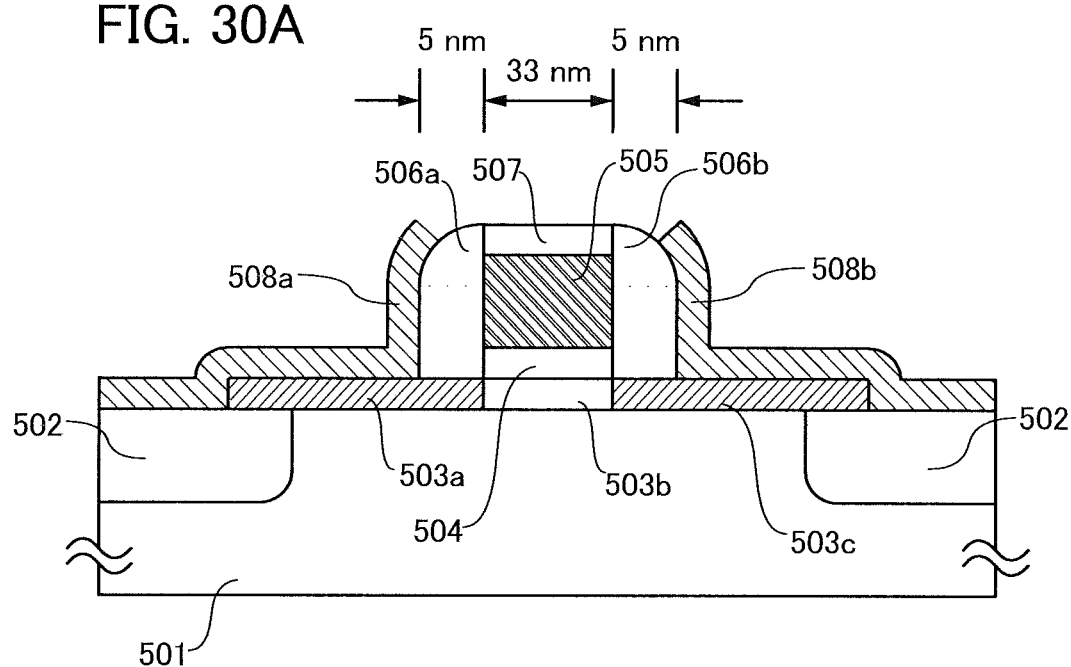
FIGS. 30A and 30B each illustrate a cross-sectional structure of a transistor used in calculation.
Figure 30B:
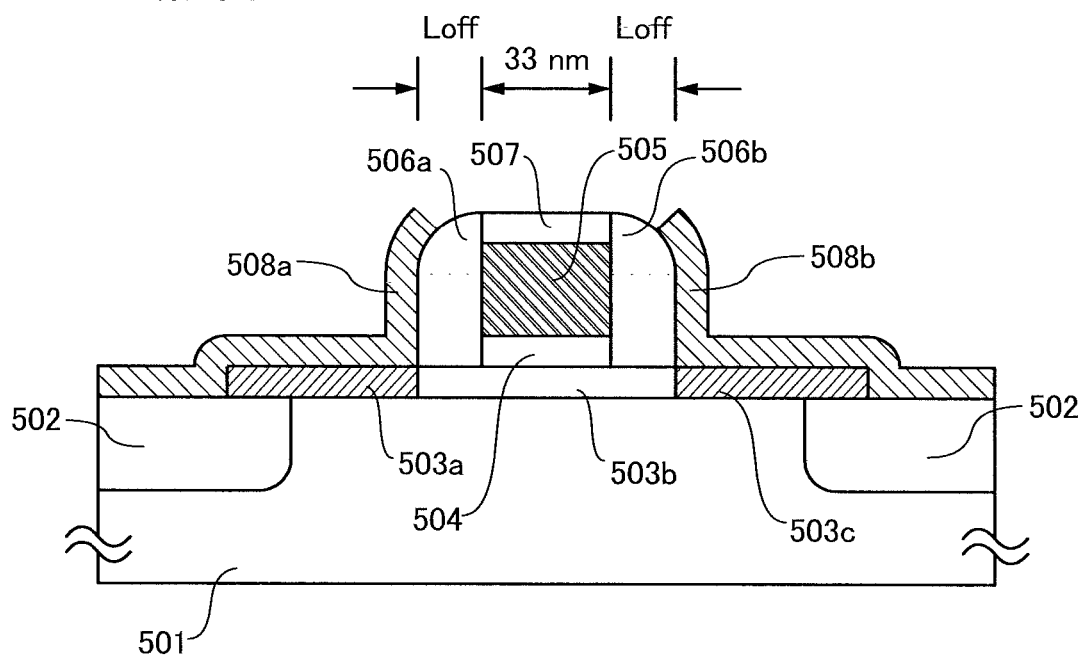

FIGS. 29A to 29C show the gate voltage $V_g$ dependence of the drain current $I_d$ (a solid line) and the mobility μ (a dotted line) of the transistor having the structure in FIG. 30B and an offset length $L_{off}$ of 15 nm. The drain current $I_d$ is obtained by calculation under the assumption that the drain voltage is +1 V and the mobility μ is obtained by calculation under the assumption that the drain voltage is +0.1 V. FIG. 29A shows the gate voltage dependence of the transistor in the case where the thickness of the gate insulating layer is 15 nm, FIG. 29B shows that of the transistor in the case where the thickness of the gate insulating layer is 10 nm, and FIG. 29C shows that of the transistor in the case where the thickness of the gate insulating layer is 5 nm.

In either of the structures, as the gate insulating layer is thinner, the off-state current is significantly decreased, whereas no noticeable change arises in the peak value of the mobility μ and the on-state current.

Note that the peak of the mobility μ is approximately 80 cm$^2$/Vs in FIGS. 27A to 27C, approximately 60 cm$^2$/Vs in FIGS. 28A to 28C, and approximately 40 cm$^2$/Vs in FIGS. 29A to 29C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 µA at a gate voltage of around 1 V.

A transistor in which an oxide semiconductor including In, Sn, and Zn as main components is used as a channel formation region can have favorable characteristics by depositing the oxide semiconductor while heating a substrate or by performing heat treatment after an oxide semiconductor film is formed. Note that a main component refers to an element included in a composition at 5 atomic % or more.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 31A:
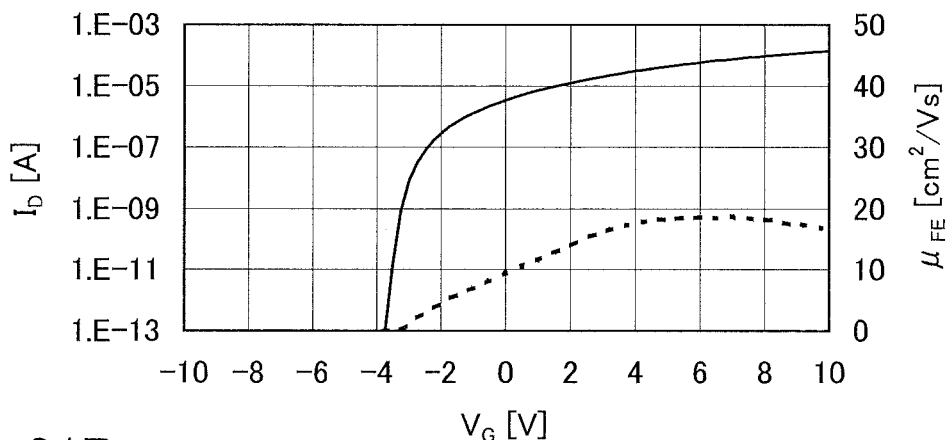
FIGS. 31A to 31C each show characteristics of a transistor including an oxide semiconductor.
Figure 31B:
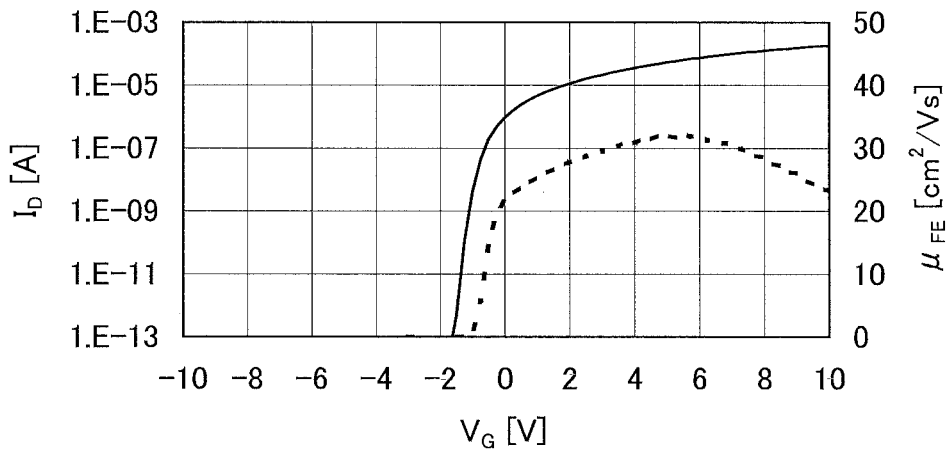
Figure 31C:
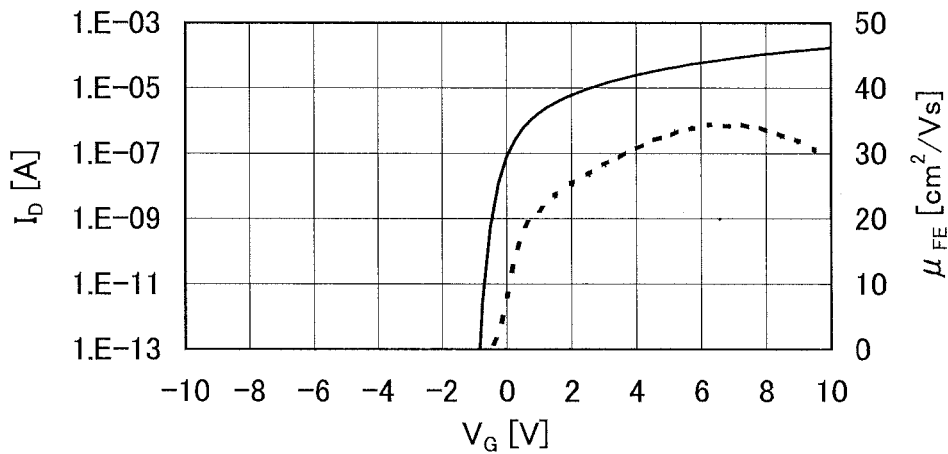

As an example, FIGS. 31A to 31C each show characteristics of a transistor that includes an oxide semiconductor film including In, Sn, and Zn as main components and having a channel length L of 3 µm and a channel width W of 10 nm, and a gate insulating layer with a thickness of 100 nm. Note that $V_d$ was set to 10 V.

FIG. 31A shows characteristics of a transistor whose oxide semiconductor film including In, Sn, and Zn as main components was formed by sputtering without heating a substrate intentionally. The field-effect mobility $\mu_{FE}$ of the transistor is 18.8 cm$^2$/Vsec. On the other hand, when the oxide semiconductor film including In, Sn, and Zn as main components is formed while heating the substrate intentionally, the field-effect mobility can be improved. FIG. 31B shows characteristics of a transistor whose oxide semiconductor film including In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor film including In, Sn, and Zn as main components. FIG. 31C shows characteristics of a transistor whose oxide semiconductor film including In, Sn, and Zn as main components was formed by sputtering at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. In addition, the oxide semiconductor can be crystallized by being highly purified by removal of impurities from the oxide semiconductor. In the case of using such a highly purified non-single-crystal oxide semiconductor, ideally, a field-effect mobility exceeding 100 m$^2$/Vsec is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. In contrast, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 31A and 31B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_{gs}$-$I_{ds}$ characteristics of the transistors were measured at a substrate temperature of 25° C. and Vas of 10 V. Note that Vds refers to a drain voltage (a potential difference between a drain and source). Then, the substrate temperature was set to 150° C. and $V_{ds}$ was set to 0.1 V. After that, $V_{gs}$ of 20 V was applied so that the intensity of an electric field applied to gate insulating layers was 2 MV/cm, and the condition was kept for one hour. Next, $V_{gs}$ was set to 0 V. Then, $V_{gs}$-$I_{ds}$ characteristics of the transistors were measured at a substrate temperature of 25° C. and Vas of 10 V. This process is called a positive BT test.

In a similar manner, first, $V_{gs}$-$I_{ds}$ characteristics of the transistors were measured at a substrate temperature of 25° C. and Vas of 10 V. Then, the substrate temperature was set at 150° C. and Vas was set to 0.1 V. After that, $V_{gs}$ of −20 V was applied so that the intensity of an electric field applied to the gate insulating layers was −2 MV/cm, and the condition was kept for one hour. Next, $V_{gs}$ was set to 0 V. Then, $V_{gs}$-$I_{ds}$ characteristics of the transistors were measured at a substrate temperature of 25° C. and Vas of 10 V. This process is called a negative BT test.

Figure 32A:
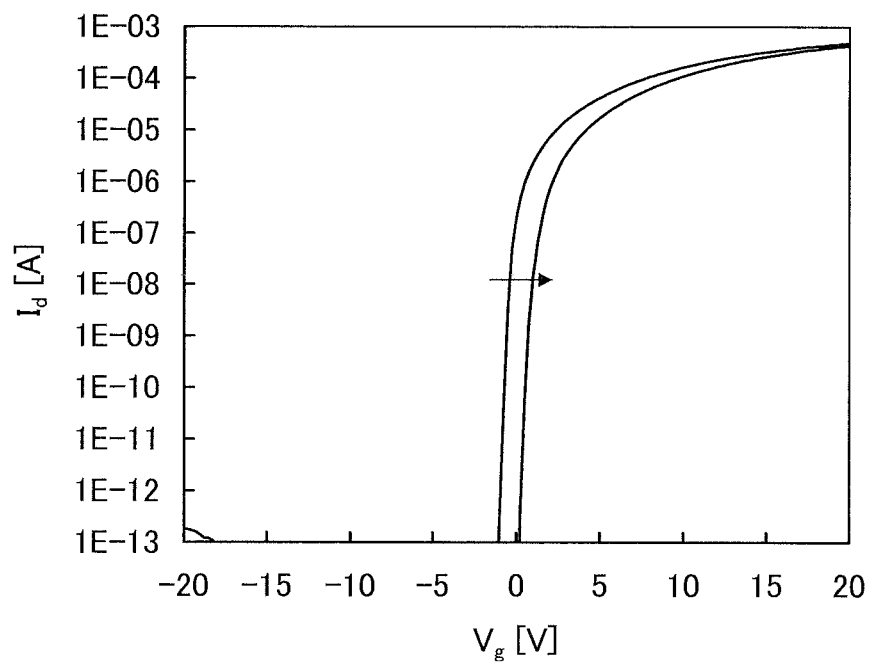
FIGS. 32A and 32B each show characteristics of a transistor including an oxide semiconductor.
Figure 32B:
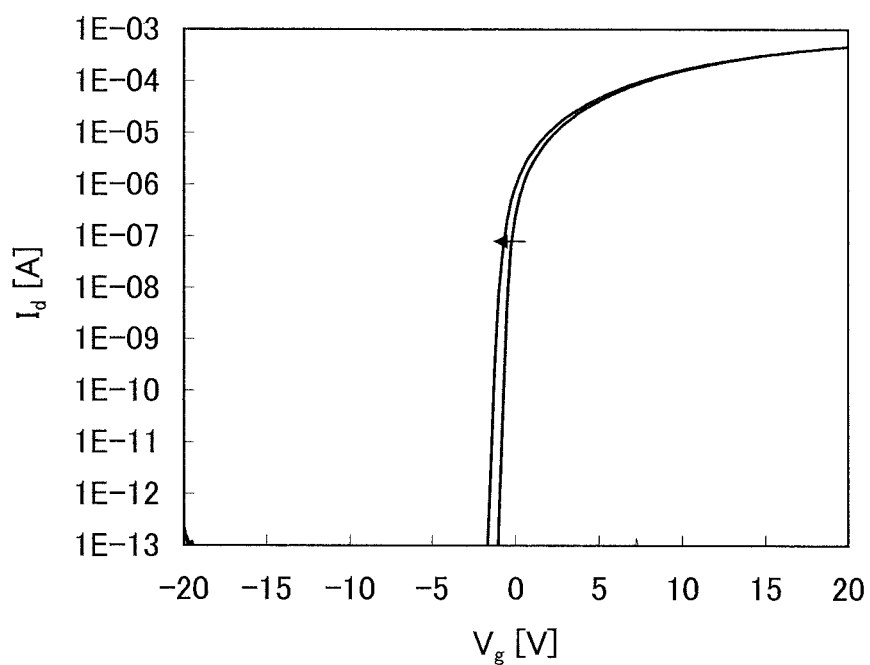
Figure 33A:
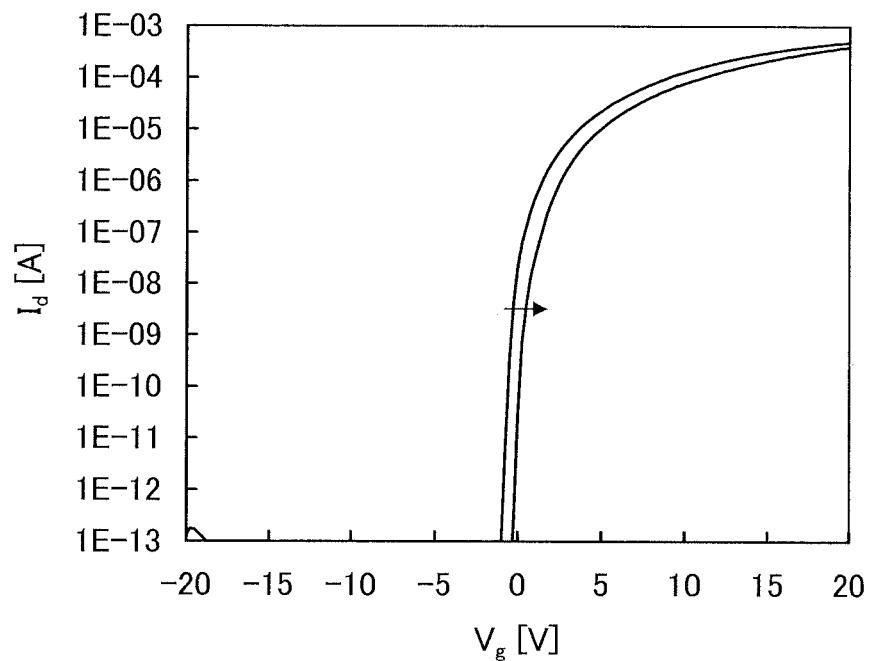
FIGS. 33A and 33B each show characteristics of a transistor including an oxide semiconductor.
Figure 33B:
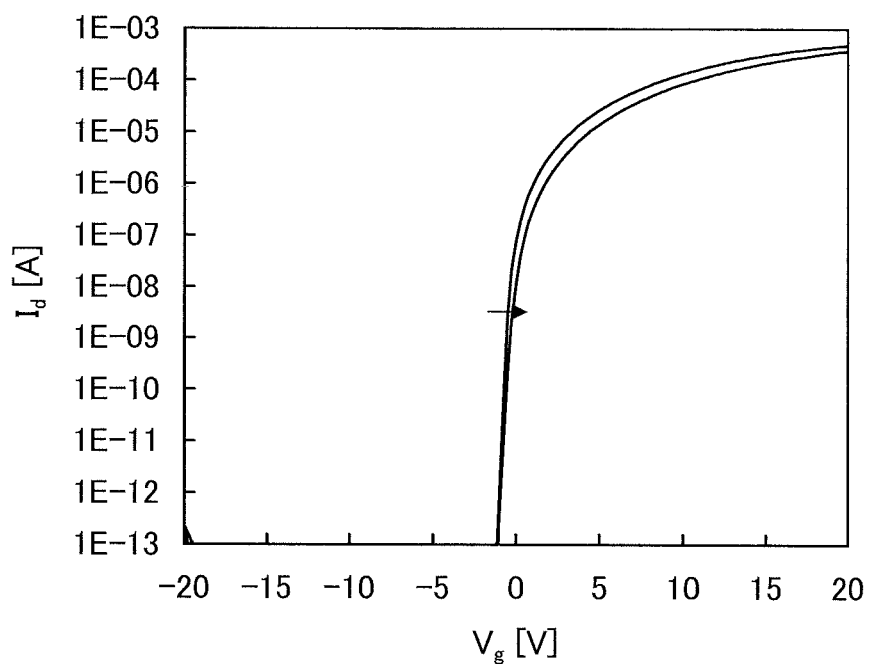

FIGS. 32A and 32B show results of the positive BT test and the negative BT test, respectively, of Sample 1. FIGS. 33A and 33B show results of the positive BT test and the negative BT test, respectively, of Sample 2.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen vacancy is easily caused in the oxide semiconductor or at an interface between the oxide semiconductor and a film in contact with the oxide semiconductor; when excess oxygen is included in the oxide semiconductor by the heat treatment, oxygen vacancy caused constantly can be compensated for with excess oxygen. The excess oxygen is mainly oxygen existing between lattices. When the concentration of oxygen is set in the range of $1\times10^{16}/cm^3$ to $2\times10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film that is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for forming Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample formed in this manner was used as Sample A.

Next, a sample formed by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample formed in this manner was used as Sample B.

Figure 34:
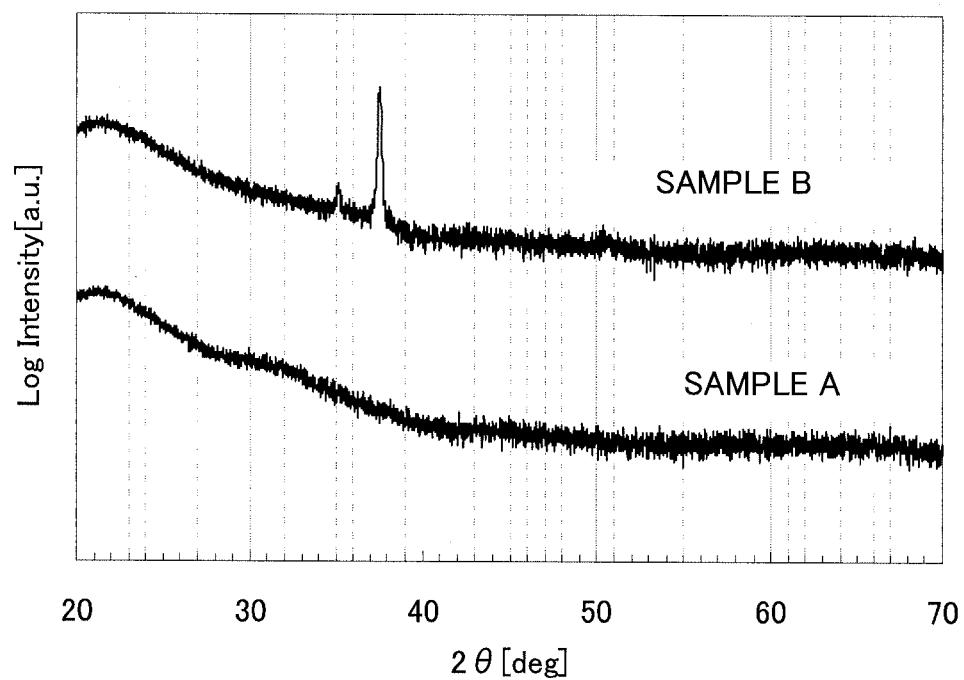
FIG. 34 shows XRD spectra of oxide semiconductors.

FIG. 34 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 35:
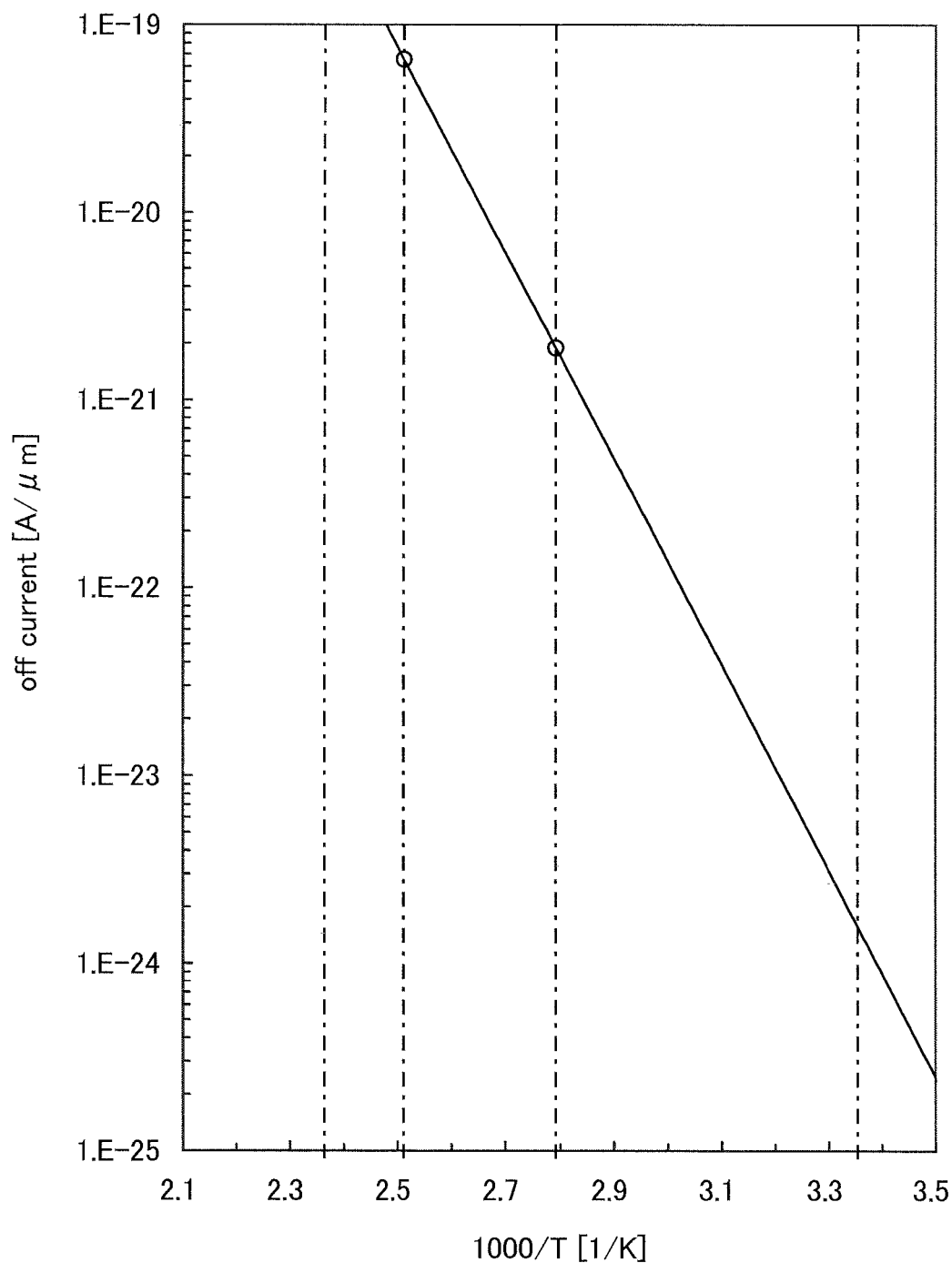
FIG. 35 shows characteristics of a transistor including an oxide semiconductor.

FIG. 35 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000. Specifically, as shown in FIG. 35, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/μm) or lower when the substrate temperature is 125° C., 85° C., and room temperature (27° C.), respectively. Preferably, the off-state current can be 0.1 aA/μm ($1\times10^{-19}$ A/μm) or lower, 10 zA/μm ($1\times10^{-20}$ A/μm) or lower, and 0.1 zA/μm ($1\times10^{-22}$ A/μm) or lower at 125° C., 85° C., and room temperature, respectively.

Note that in order to prevent hydrogen and moisture from being included in the oxide semiconductor film during formation of the film, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target that is highly purified so as not to include impurities such as hydrogen and moisture. Although it is possible to remove moisture from a film of an oxide semiconductor including In, Sn, and Zn as main components by heat treatment, a film that does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of the transistor using Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that Vas was set to 10 V. Note that the substrate temperature was −40° C., −25° C., 25° C., 75° C., 125° C., and 150° C. Here, in the transistor, the width of a portion where a gate layer overlaps with one of a pair of electrodes is referred to as Lov, and the width of a portion of the pair of electrodes, which does not overlap with an oxide semiconductor film, is referred to as dW.

Figure 36:
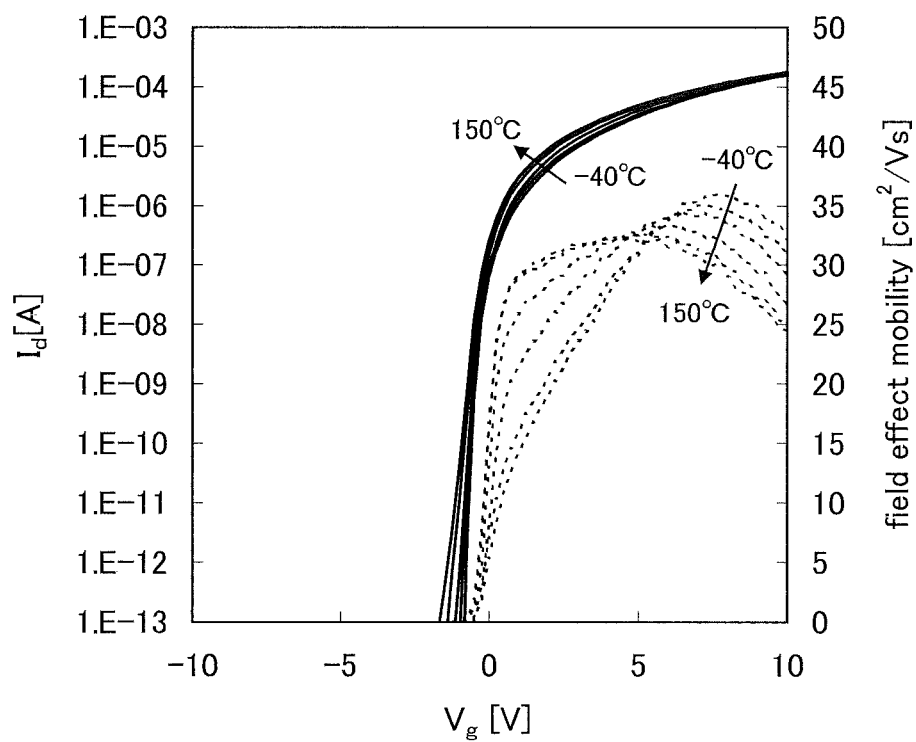
FIG. 36 shows characteristics of a transistor including an oxide semiconductor.
Figure 37A:
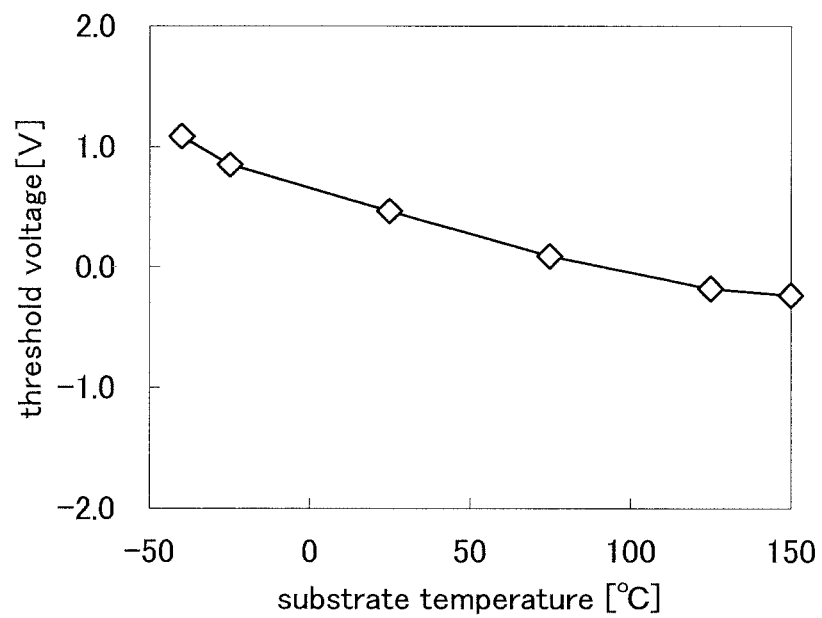
FIGS. 37A and 37B each show characteristics of a transistor including an oxide semiconductor.

FIG. 36 shows the $V_{gs}$ dependence of $I_{ds}$ (a solid line) and field-effect mobility (a dotted line). FIG. 37A shows a relation between the substrate temperature and the threshold voltage, and FIG. 37B shows a relation between the substrate temperature and the field-effect mobility.

From FIG. 37A, it is found that the threshold voltage gets lower as the substrate temperature increases. Note that the threshold voltage is decreased from 1.09 V to −0.23 V in the range from −40° C. to 150° C.

Figure 37B:
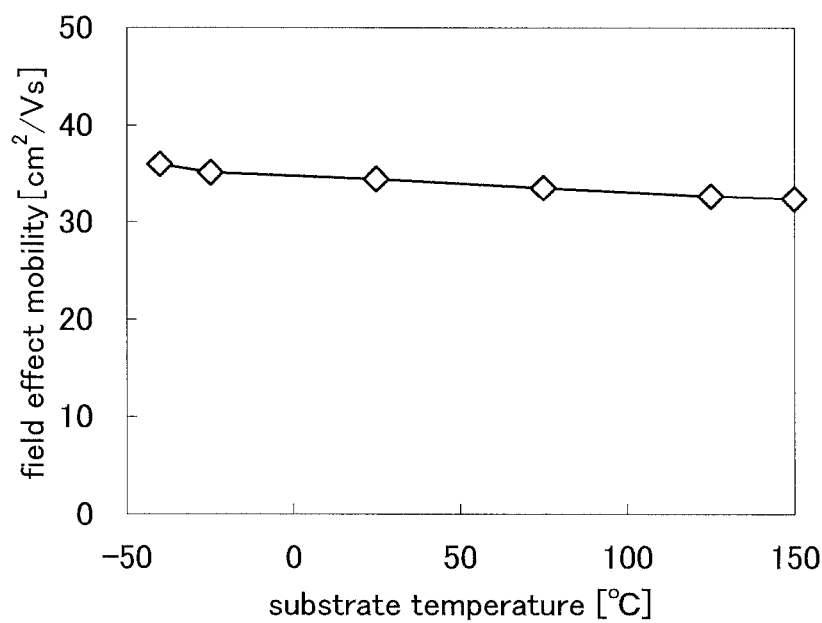

From FIG. 37B, it is found that the field-effect mobility gets lower as the substrate temperature increases. Note that the field-effect mobility is decreased from 36 cm²/Vs to 32 cm²/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm²/Vsec or higher, preferably 40 cm²/Vsec or higher, further preferably 60 cm²/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is provided in an integrated circuit formed using a Si semiconductor.

Example 2

In this example, an example of a transistor in which an In—Sn—Zn—O film is used as an oxide semiconductor film will be described with reference to FIGS. 38A and 38B.

Figure 38A:
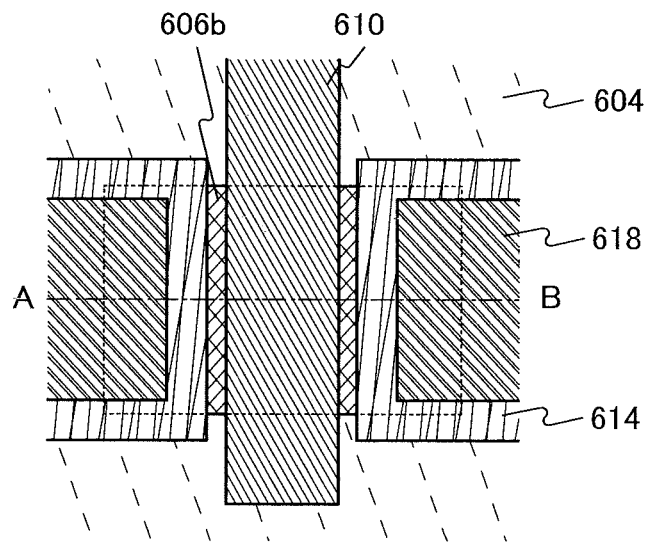
FIGS. 38A and 38B are a plan view and a cross-sectional view of a transistor including an oxide semiconductor.
Figure 38B:
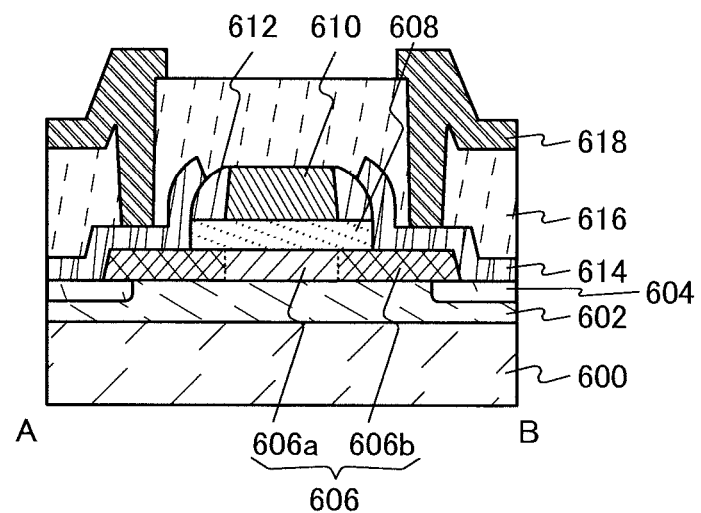

FIGS. 38A and 38B are a top view and a cross-sectional view of a coplanar transistor having a top-gate top-contact structure. FIG. 38A is the top view of the transistor. FIG. 38B illustrates cross section A-B along dashed-dotted line A-B in FIG. 38A.

The transistor illustrated in FIG. 38B includes a substrate 600; a base insulating film 602 provided over the substrate 600; a protective insulating film 604 provided in the periphery of the base insulating film 602; an oxide semiconductor film 606 that is provided over the base insulating film 602 and the protective insulating film 604 and includes a high-resistance region 606a and low-resistance regions 606b; a gate insulating layer 608 provided over the oxide semiconductor film 606; a gate layer 610 provided to overlap with the oxide semiconductor film 606 with the gate insulating layer 608 positioned therebetween; a sidewall insulating film 612 provided in contact with a side surface of the gate layer 610; a pair of electrodes 614 provided in contact with at least the low-resistance regions 606b; an interlayer insulating film 616 provided to cover at least the oxide semiconductor film 606, the gate layer 610, and the pair of electrodes 614; and a wiring 618 provided to be connected to at least one of the pair of electrodes 614 through an opening formed in the interlayer insulating film 616.

Although not illustrated, a protective film may be provided to cover the interlayer insulating film 616 and the wiring 618. With the protective film, a minute amount of leakage current generated by surface conduction of the interlayer insulating film 616 can be reduced, so that the off-state current of the transistor can be reduced.

Example 3

In this example, another example of a transistor in which an In—Sn—Zn—O film is used as an oxide semiconductor film will be described.

Figure 39A:
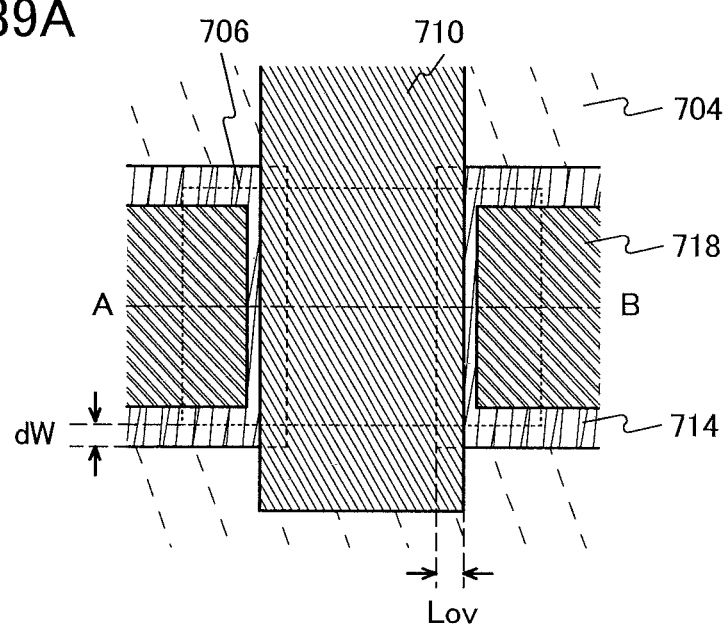
FIGS. 39A and 39B are a plan view and a cross-sectional view of a transistor including an oxide semiconductor.
Figure 39B:
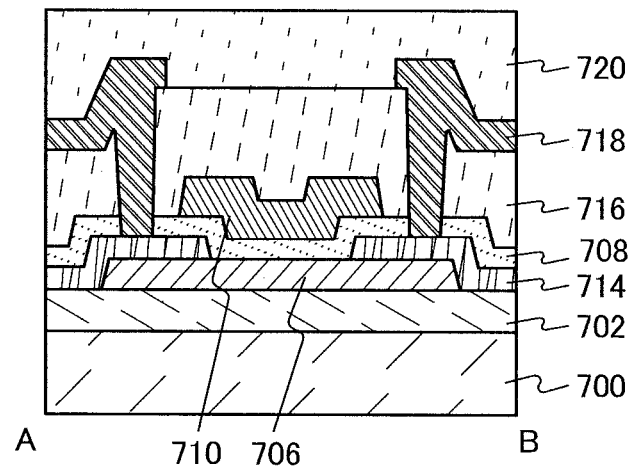

FIGS. 39A and 39B are a top view and a cross-sectional view illustrating a structure of a transistor. FIG. 39A is the top view of the transistor. FIG. 39B is a cross-sectional view along dashed-dotted line A-B in FIG. 39A.

The transistor illustrated in FIG. 39B includes a substrate 700; a base insulating film 702 provided over the substrate 700; an oxide semiconductor film 706 provided over the base insulating film 702; a pair of electrodes 714 in contact with the oxide semiconductor film 706; a gate insulating layer 708 provided over the oxide semiconductor film 706 and the pair of electrodes 714; a gate layer 710 provided to overlap with the oxide semiconductor film 706 with the gate insulating layer 708 positioned therebetween; an interlayer insulating film 716 provided to cover the gate insulating layer 708 and the gate layer 710; wirings 718 connected to the pair of electrodes 714 through openings formed in the interlayer insulating film 716; and a protective film 720 provided to cover the interlayer insulating film 716 and the wirings 718.

As the substrate 700, a glass substrate was used. As the base insulating film 702, a silicon oxide film was used. As the oxide semiconductor film 706, an In—Sn—Zn—O film was used. As the pair of electrodes 714, a tungsten film was used. As the gate insulating layer 708, a silicon oxide film was used. The gate layer 710 had a stacked structure of a tantalum nitride film and a tungsten film. The interlayer insulating film 716 had a stacked structure of a silicon oxynitride film and a polyimide film. The wirings 718 had a stacked structure in which a titanium film, an aluminum film, and a titanium film were formed in this order. As the protective film 720, a polyimide film was used.

Note that in the transistor having the structure illustrated in FIG. 39A, the width of a portion where the gate layer 710 overlaps with one of the pair of electrodes 714 is referred to as Lov. Similarly, the width of a portion of the pair of electrodes 714, which does not overlap with the oxide semiconductor film 706, is referred to as dW.

EXPLANATION OF REFERENCE

10: arithmetic circuit, 11: storage circuit, 12: power-gating control circuit, 20: power-gating transistor, 21_1 to 21_n: sequential circuit, 21_x: sequential circuit, 22_1 to 22_n: combinational circuit, 30: flip-flop, 31: transistor, 32: capacitor, 50: substrate, 51: base layer, 52: gate layer, 53: gate insulating layer, 54: oxide semiconductor layer, 55a: source layer, 55b: drain layer, 56: protective insulating layer, 57: planarization insulating layer, 58a: conductive layer, 58b: conductive layer, 100: substrate, 102: protective layer, 104: semiconductor region, 106: element isolation insulating layer, 108: gate insulating layer, 110: gate layer, 112: insulating layer, 114a: impurity region, 114b: impurity region, 116: channel formation region, 118: sidewall insulating layer, 120a: high concentration impurity region, 120b: high concentration impurity region, 122: metal layer, 124a: metal compound region, 124b: metal compound region, 126: interlayer insulating layer, 128: interlayer insulating layer, 130a: source layer, 130b: drain layer, 132: insulating layer, 134: conductive layer, 136a: electrode layer, 136b: electrode layer, 136*d*: gate layer, 138: gate insulating layer, 140: oxide semiconductor layer, 142*a*: source layer, 142*b*: drain layer, 144: protective insulating layer, 146: interlayer insulating layer, 148: conductive layer, 150*a*: electrode layer, 150*b*: electrode layer, 150*d*: electrode layer, 150*e*: electrode layer, 152: insulating layer, 154*a*: electrode layer, 154*b*: electrode layer, 154*d*: electrode layer, 160: transistor, 162*a*: oxide conductive layer, 162*b*: oxide conductive layer, 164: transistor, 210*a*: NAND gate, 210*b*: NAND gate, 210*c*: NAND gate, 210*d*: NAND gate, 210*e*: NAND gate, 210*f*: NAND gate, 211*a*: AND gate, 211*b*: AND gate, 212*a*: switch, 212*b*: switch, 212*c*: switch, 212*d*: switch, 400: insulating layer, 437: insulating layer, 450*a*: crystalline oxide semiconductor layer, 450*b*: crystalline oxide semiconductor layer, 453: oxide semiconductor layer, 501: base insulating layer, 502: embedded insulator, 503*a*: semiconductor region, 503*b*: semiconductor region, 503*c*: semiconductor region, 504: gate insulating layer, 505: gate layer, 506*a*: sidewall insulator, 506*b*: sidewall insulator, 507: insulator, 508*a*: source layer, 508*b*: drain layer, 600: substrate, 602: base insulating film, 604: protective insulating film, 606: oxide semiconductor film, 606*a*: high-resistance region, 606*b*: low-resistance region, 608: gate insulating layer, 610: gate layer, 612: sidewall insulating film, 614: electrode, 616: interlayer insulating film, 618: interlayer insulating film, 700: substrate, 702: base insulating film, 706: oxide semiconductor film, 708: gate insulating layer, 710: gate layer, 714: electrode, 716: interlayer insulating film, 718: wiring, 720: protective film, 801: measurement system, 811: transistor, 812: transistor, 813: capacitor, 814: transistor, 815: transistor, 900: substrate, 901: ALU, 902: ALU controller, 903: instruction decoder, 904: interrupt controller, 905: timing controller, 906: register, 907: register controller, 908: bus I/F, 909: ROM, 920: ROM I/F This application is based on Japanese Patent Application serial No. 2010-178167 and No. 2011-108342 filed with Japan Patent Office on Aug. 6, 2010 and May 13, 2011, respectively, the entire contents of which are hereby incorporated by reference.

The invention claimed is:

1. A semiconductor device comprising:
 a register comprising:
  a sequential circuit comprising:
   a first transistor comprising a first terminal, a second terminal, and a gate, wherein the first transistor comprises a first semiconductor layer comprising indium, zinc, and oxygen;
   a capacitor; and
   a logic gate comprising an input terminal electrically connected to the first terminal of the first transistor and the capacitor, wherein the input terminal is configured to be in a floating state when the first transistor in an off state;
  a power-gating control circuit; and
  a second transistor electrically connected to the sequential circuit and the power-gating control circuit so as to control a supply of a power supply potential to the sequential circuit in accordance with a signal output from the power-gating control circuit,
 wherein the second transistor comprises a second semiconductor layer comprising a channel formation region, and
 wherein the second semiconductor layer comprises indium, zinc, and oxygen.

2. The semiconductor device according to claim 1, wherein the first semiconductor layer comprises gallium.

3. The semiconductor device according to claim 2,
 wherein the first semiconductor layer comprises a crystal comprising indium, gallium, zinc, and oxygen, and
 wherein a c-axis of the crystal is aligned in a direction perpendicular to a top surface of the first semiconductor layer.

4. The semiconductor device according to claim 1, wherein a hydrogen concentration in the first semiconductor layer is lower than or equal to $5 \times 10^{19}$ atoms/cm$^3$.

5. The semiconductor device according to claim 1, wherein an off-state current of the first transistor per micrometer of a channel width is lower than or equal to 1 aA/μm.

6. The semiconductor device according to claim 1, wherein the second semiconductor layer comprises gallium.

7. The semiconductor device according to claim 6,
 wherein the second semiconductor layer comprises a crystal comprising indium, gallium, zinc, and oxygen, and
 wherein a c-axis of the crystal is aligned in a direction perpendicular to a top surface of the second semiconductor layer.

* * * * *